US006384445B1

(12) United States Patent
Hidaka et al.

(10) Patent No.: US 6,384,445 B1
(45) Date of Patent: May 7, 2002

(54) SEMICONDUCTOR MEMORY DEVICE INCLUDING MEMORY CELL TRANSISTORS FORMED ON SOI SUBSTRATE AND HAVING FIXED BODY REGIONS

(75) Inventors: Hideto Hidaka; Takahiro Tsuruda; Katsuhiro Suma, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/306,807

(22) Filed: May 7, 1999

Related U.S. Application Data

(63) Continuation of application No. 08/501,525, filed on Jul. 12, 1995, now Pat. No. 6,018,172.

(30) Foreign Application Priority Data

Sep. 26, 1994 (JP) ............................................. 6-230044

(51) Int. Cl.[7] .......................... H01L 29/76; H01L 33/00
(52) U.S. Cl. ......................... 257/306; 257/307; 257/402
(58) Field of Search ................................ 257/306, 307, 257/347, 296, 365, 366, 402

(56) References Cited

U.S. PATENT DOCUMENTS

| | | | |
|---|---|---|---|
| 3,851,317 A | 11/1974 | Kenyon | |
| 4,946,799 A | 8/1990 | Blake et al. | |
| 4,965,213 A | 10/1990 | Blake | |
| 5,079,605 A | 1/1992 | Blake | |
| 5,125,007 A | 6/1992 | Yamaguchi et al. | |
| 5,196,910 A | 3/1993 | Moriuchi et al. | |
| 5,243,209 A | 9/1993 | Ishii | |
| 5,245,205 A * | 9/1993 | Higasitani et al. ........ | 257/296 |
| 5,250,831 A | 10/1993 | Ishii | |
| 5,274,598 A | 12/1993 | Fujii et al. | |
| 5,332,923 A | 7/1994 | Takeuchi | |
| 5,355,012 A * | 10/1994 | Yamaguchi et al. ........ | 257/409 |
| 5,406,102 A | 4/1995 | Oashi | |
| 5,442,212 A | 8/1995 | Eimori | |
| 5,500,815 A * | 3/1996 | Takase et al. ............. | 257/298 |
| 5,528,062 A | 6/1996 | Hsieh et al. | |
| 5,535,153 A | 7/1996 | Saeki | |
| 5,548,153 A * | 8/1996 | Muragishi ................. | 257/365 |
| 5,555,519 A | 9/1996 | Takashima et al. | |
| 5,592,009 A | 1/1997 | Hidaka | |
| 5,604,707 A | 2/1997 | Kuge et al. | |
| 5,635,744 A | 6/1997 | Hidaka et al. | |

FOREIGN PATENT DOCUMENTS

| | | |
|---|---|---|
| JP | 2-271555 | 11/1990 |
| JP | 3-77368 | 4/1991 |

* cited by examiner

Primary Examiner—Stephen D. Meier
(74) Attorney, Agent, or Firm—McDermott, Will & Emery

(57) ABSTRACT

A semiconductor memory device includes an SOI substrate, a plurality of word lines, a plurality of bit line pairs, a plurality of memory cells and a plurality of body fixing lines. The plurality of word lines are disposed in the row direction on the SOI substrate. The plurality of bit line pairs are disposed in the column direction on the SOI substrate. The plurality of memory cells are located on the SOI substrate and each are disposed correspondingly to one of crossings between the plurality of word lines and the plurality of bit line pairs. Each of the plurality of memory cells includes a capacitor and a transistor. The transistor is connected between the capacitor and one bit line in the corresponding bit line pair. The transistor is turned on in response to the potential of the corresponding word line. The plurality of body fixing lines are disposed on the SOI substrate. The plurality of body fixing lines are supplied with a predetermined potential. The transistors in the plurality of memory cells have source regions, drain regions and body regions located between the source and drain regions. The body regions of the transistors in the plurality of memory cells are connected to the plurality of body fixing lines.

22 Claims, 59 Drawing Sheets

FIG.67 PRIOR ART
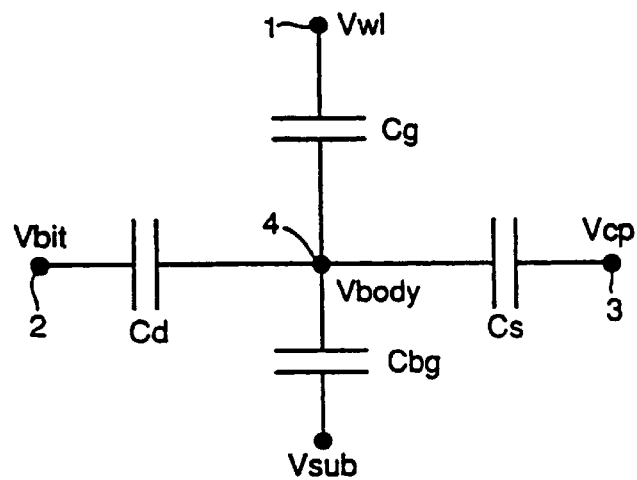
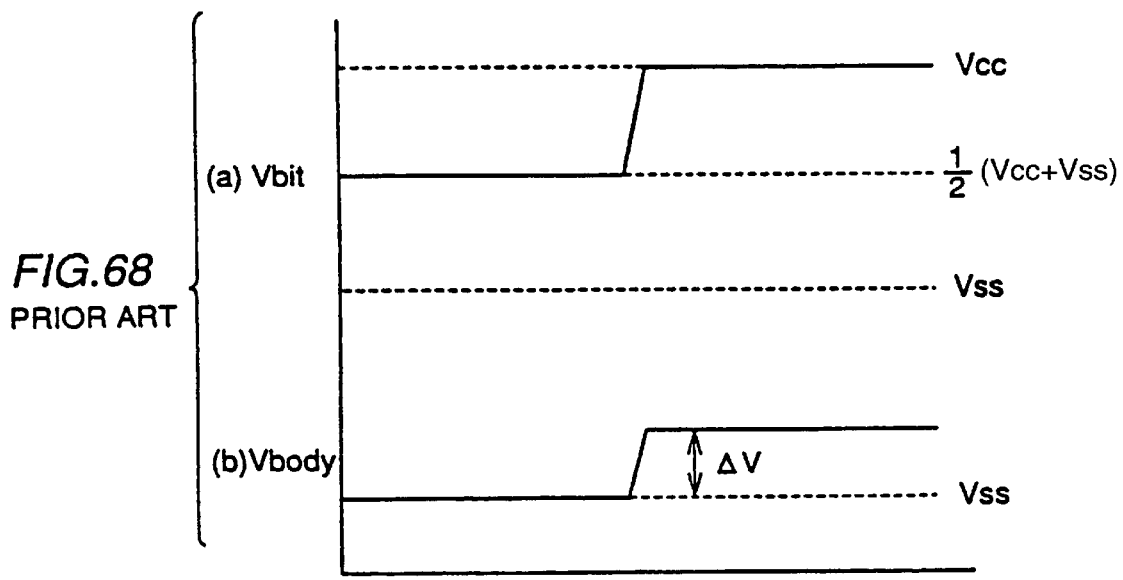
FIG.68 PRIOR ART

SEMICONDUCTOR MEMORY DEVICE INCLUDING MEMORY CELL TRANSISTORS FORMED ON SOI SUBSTRATE AND HAVING FIXED BODY REGIONS

CROSS-REFERENCE TO RELATED APPLICATIONS

This application is related to application Ser. No. 08/342,024, filed Nov. 16, 1994 now U.S. Pat. No. 5,512,501 and Ser. No. 08/353,276, filed Dec. 5, 1994, now abandoned commonly assigned with the present invention. This application is a continuance of Ser. No. 08/501,525 now U.S. Pat. No. 6,018,172 filed Jul. 12, 1995.

BACKGROUND OF THE INVENTION

1. Field of the Invention

The present invention relates to a semiconductor memory device, and in particular to a dynamic random access memory (DRAM) formed on an SOI (Silicon On Insulator) substrate.

2. Description of the Background Art

In general, semiconductor memory devices are broadly a classified into volatile memories such as an RAM and non-volatile memories such as an ROM. The non-volatile memories are broadly classified into DRAMS and static random access memories (SRAMs). Non-volatile memories are broadly classified into a mask ROM, an EPROM, a flash memory, an EEPROM and a fuse ROM. Since the DRAM stores data by accumulating electric charges in a cell capacitor, it requires a refresh operation. However, memory cells have a simple structure. Therefore, DRAMs having a large-scale memory capacity can be formed with a low cost.

The memory cell of DRAM is generally formed of a transfer gate formed of an N-channel MOS transistor and a cell capacitor. The transfer gate is connected between a bit line and a cell capacitor, and has a gate electrode connected to a word line. When the potential of word line rises, the transfer gate is turned on. Thereby, electric charges accumulated in the cell capacitor flow onto the bit line via the transfer gate in the read operation, and the electric charges on the bit line flow into cell capacitor via the transfer gate in the write operation. Therefore, the memory cell holds binary data of "0" (logical low) or "1", (logical high) in accordance with the state of potential in cell capacitor.

Since the DRAM is generally formed on a silicon substrate, α-particles emitted from a material of interconnection or the like are injected into the silicon substrate, so that data stored in the cell capacitor may be inverted. Thus, a so-called soft error may occur. Meanwhile, further increase of the degree of integration of DRAMs has been desired, and it is now expected that DRAMs having a large-scale storage capacity such as 256 Mbits or 1 Gbit will be mass-produced in a near future. In order to improve the degree of integration of DRAM, it is generally necessary to reduce the gate length. However, reduction of the gate length remarkably causes a short channel effect, so that the gate length can be reduced only to a limited extent.

In view of the foregoing, a DRAM may be formed on an SOI substrate including an insulating layer buried in a semiconductor substrate.

In the DRAM formed on the SOI substrate, a body region of a transfer gate forming a memory cell is electrically floated. Here, the body region is a region located between a source region and a drain region of the transfer gate. The body region corresponds to a bulk silicon substrate itself in a conventional DRAM formed on the bulk silicon substrate.

FIG. 67 shows capacity coupling with respect to the body register in a memory cell and its peripheral portion. Referring to FIG. 67, a node 1 of a word line is coupled to a node 4 of a body region via a gate capacity Cg. A node 2 of a bit line is coupled to node 4 of the body region via a parasitic capacity Cd which is necessarily formed at a PN junction region. A node 3 of a cell plate is coupled to body region 4 via a cell capacity Cs. Cell capacity Cs also includes parasitic capacities between the body region and source/drain regions of the transfer gate. The semiconductor substrate is connected to the body region via an insulating layer buried in the semiconductor substrate, so that a capacity Cbg is formed between the semiconductor substrate and the body region in accordance with a potential Vsub of the semiconductor substrate. Therefore, the semiconductor substrate is coupled to body region 4 via capacity Cbg. In FIG. 67, Vwl indicates the potential of word line. Vbit indicates the potential of bit line. Vcp indicates the potential of cell plate.

As described above, the body region is electrically floated and is coupled to the bit line via parasitic capacity Cd. In the unselected memory cells, therefore, such a problem may arise that electric charges of cell capacitors leak through the transfer gates. More specifically, in the read or write operation, potential Vbit of bit line rises from an intermediate potential of (Vccs+Vss)/2, which will be expressed as "Vcc/2" hereafter, to a power supply potential Vcc. Such variation of the potential of bit line is transmitted to the body region via parasitic capacity Cd, so that a potential Vbody of the body region rises only $\Delta V$ as shown at (b) in FIG. 68. The SOI device is generally designed and manufactured such that capacity Cbg may be small in order to suppress the influence by the substrate potential. If the capacity Cbg is significantly smaller than any one of capacities Cg, Cd and Cs, $\Delta V$ can be expressed by the following formula.

$$\Delta V = (\tfrac{1}{2}) Vcc \cdot Cd / (Cd + Cg + Cs)$$

If potential Vbody of the body region of transfer gate rises as described above, the substrate effect reduces its threshold voltage, which promotes flow of the subthreshold current. Therefore, leak through the transfer gate tends to change the potential state of cell capacitor. This results in a high possibility of breakage of data.

SUMMARY OF THE INVENTION

An object of the invention is to provide a semiconductor memory device formed on an SOI substrate, in which a leak current in an unselected memory cell is reduced.

Another object of the invention is to provide a semiconductor memory device formed on an SOI substrate, in which noise interference between bit lines is suppressed.

Still another object of the invention is to achieve the foregoing objects with a minimum layout area.

According to an aspect of the invention, a semiconductor memory device includes an SOI substrate, a plurality of word lines, a plurality of bit line pairs, a plurality of memory cells and a plurality of body fixing lines. The plurality of word lines are disposed in a row direction on the SOI substrate. The plurality of bit line pairs are disposed in a column direction on the SOI substrate. The plurality of memory cells are disposed on the SOI substrate and each are provided correspondingly to any one of crossings between the plurality of word lines and the plurality of bit line pairs. Each of the plurality of memory cells includes a capacitor and a first transistor. The first transistor is connected between the capacitor and one bit line in the corresponding bit line pair. The first transistor is turned on in response to the potential of the corresponding word line. The plurality of body fixing lines are disposed on the SOI substrate. The plurality of body fixing lines are supplied with a predetermined potential. The first transistors in the plurality of memory cells each include a source region, a drain region and a body region located between the source and drain regions. The body regions of the first transistors in the plurality of memory cells are connected to the plurality of body fixing lines.

Preferably, the plurality of body fixing lines are disposed along the plurality of bit line pairs. More preferably, the plurality of body fixing lines are formed at the same layer as the plurality of bit line pairs. Further preferably, the plurality of memory cells are arranged such that the body regions of the first transistors of two of the memory cells are connected to one position of one of the plurality of body fixing lines.

According to the semiconductor memory device, since the body region of the transistor in the memory cell is connected to the body fixing line, the body region is supplied with a predetermined potential. Thereby, the body region is electrically fixed, so that it is possible to prevent change of the potential state of the cell capacitor in the unselected memory cell which may be caused by the leak through the transistor. In the preferred aspect, since the body fixing line is disposed along the bit line pair, the bit line is shielded by the body fixing line. This suppresses noise interference between the bit lines. In the more preferable aspect, since the body fixing line is formed at the same interconnection layer as the bit line pair, noise interference between the bit lines is further suppressed. In the further preferred aspect, since the body regions of the transistors in the two memory cells are connected to one position of the one body fixing line, increase of a layout area is suppressed.

The foregoing and other objects, features, aspects and advantages of the present invention will become more apparent from the following detailed description of the present invention when taken in conjunction with the accompanying drawings.

DESCRIPTION OF THE DRAWINGS

FIG. 67 is a diagram for showing a disadvantage to be overcome by the invention; and FIG. 68 shows at a timing chart (a) a waveform of a potential Vbit of a bit line in FIG. 67, and shows at a timing chart (b) a waveform of a potential Vbody of a body region in FIG. 67.

DESCRIPTION OF THE PREFERRED EMBODIMENTS

Figure 1:
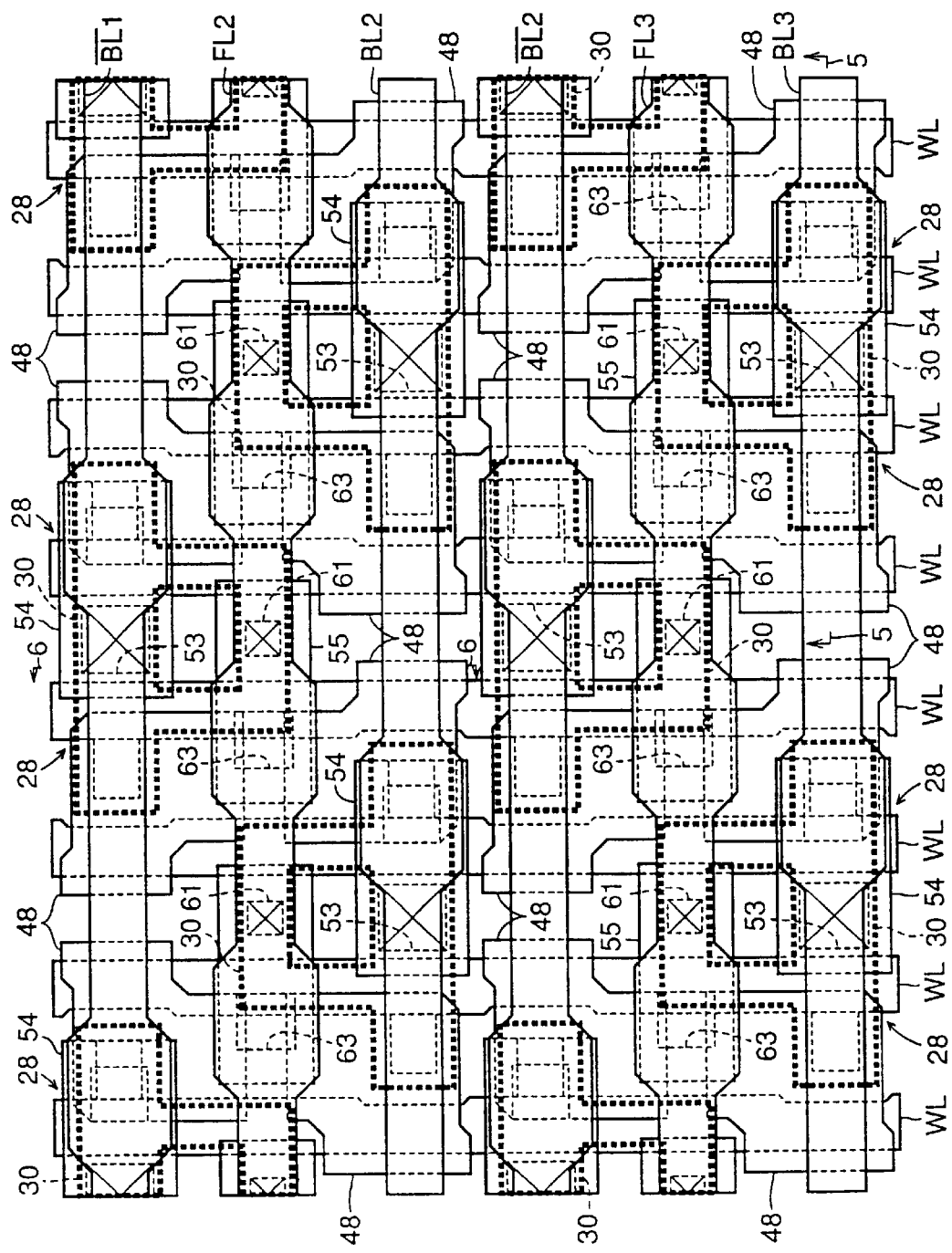
FIG. 1 is a plan showing a DRAM of an embodiment 1 of the invention, and in particular showing a specific structure of a portion surrounded by alternate long and short dash line in FIG. 3.

Embodiments of the invention will be described below with reference to the drawings. In the drawings, the same reference numbers indicate the same or corresponding portions.

[Embodiment 1]

Figure 2:
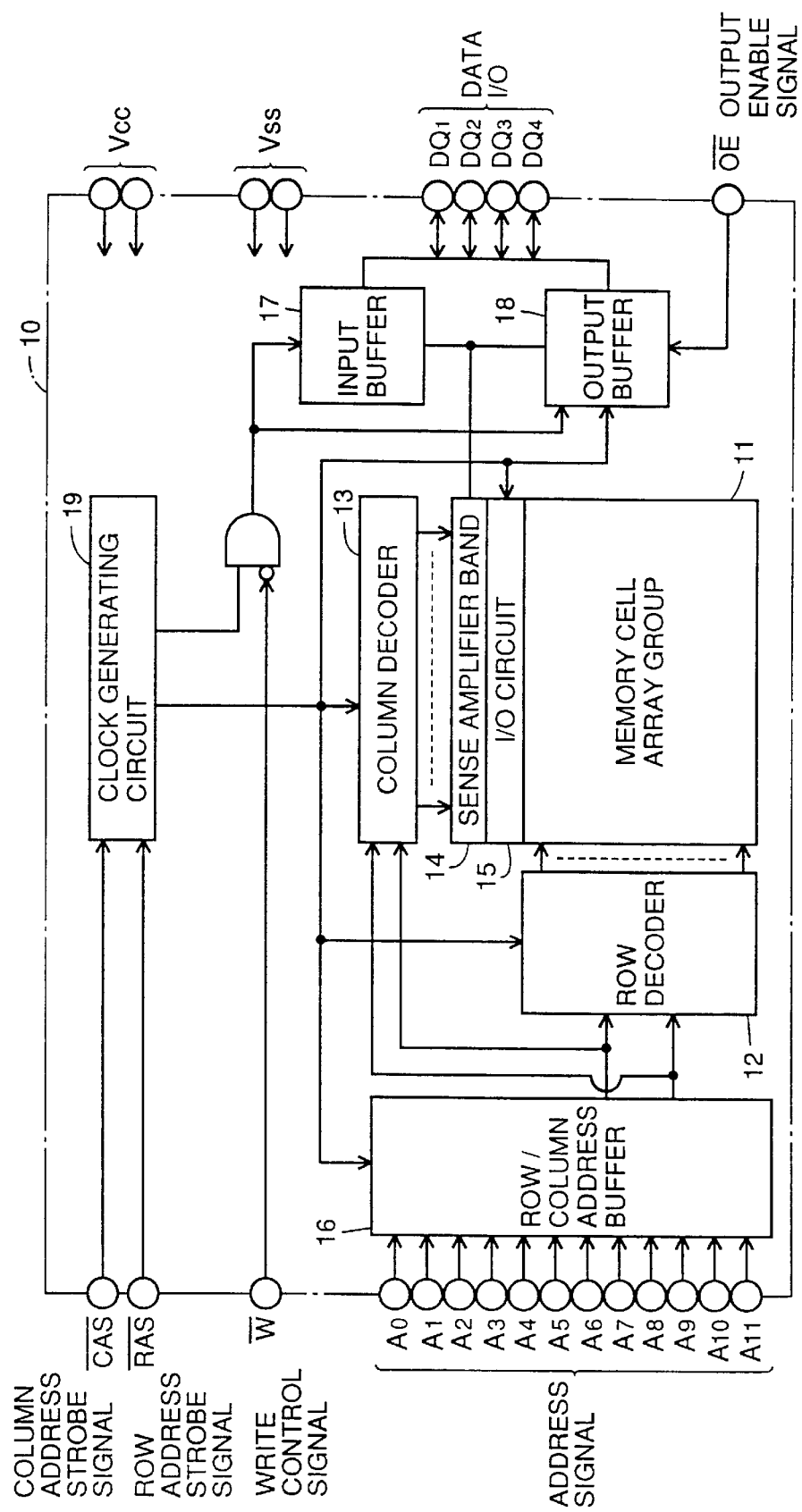
FIG. 2 is a block diagram showing a whole structure of the DRAM of the invention.

FIG. 2 is a block diagram showing a whole structure of a DRAM according to the invention. An example shown in FIG. 2 is 16 Mbit DRAM having a structure of 4 Mbits×4. Referring to FIG. 2, a DRAM 10 includes a memory cell array group 11, a row decoder 12, a column decoder 13, a sense amplifier band 14, an I/O circuit 15, a row/column address buffer 16, an input buffer 17, an output buffer 18 and a clock generating circuit 19.

Figure 3:
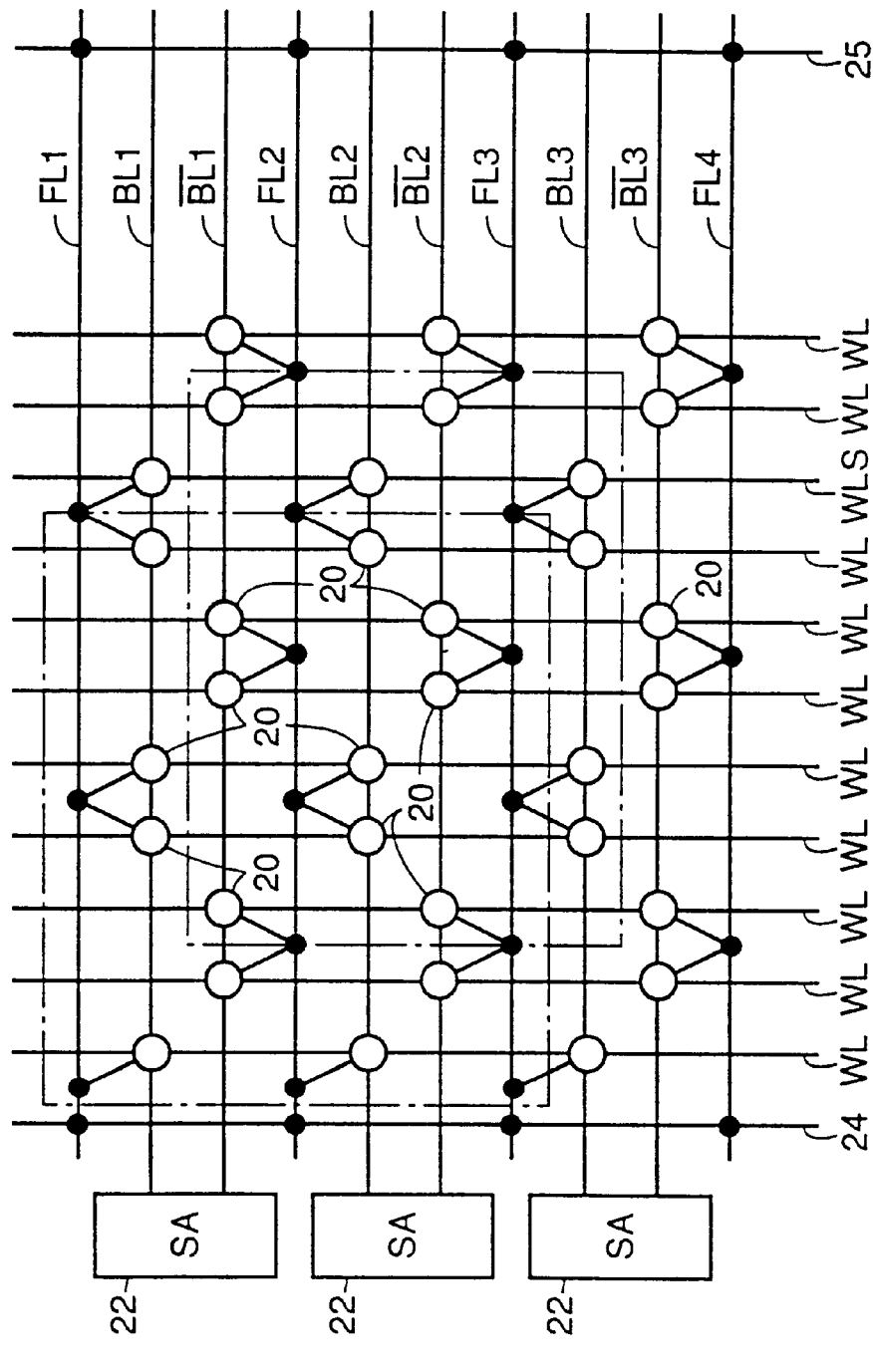
FIG. 3 is a block diagram showing structures of a memory cell array and sense amplifiers in the DRAM shown in FIG. 2.

Memory cell array group 11 is formed of a plurality of memory cell arrays. FIG. 3 is a block diagram fragmentarily and specifically showing one of memory cell arrays in memory cell array group 11 and a portion of sense amplifier band 14. Referring to FIG. 3, a memory cell array, as depicted, includes a plurality of word lines WL and bit line pairs BL1, /BL1–BL3, /BL3 crossing therewith. A plurality of memory cells 20 are disposed at positions corresponding to crossings, each of which is formed between one of word lines WL and one of bit lines BL1, /BL1–BL3, /BL3. In each bit line pair, one of the bit lines (i.e., BL1, BL2 or BL3) is opposed to the other (i.e., /BL1, /BL3 or /BL3). Thus, a so-called folded bit line structure is employed. In the memory cell array, bit line pairs BL1, /BL1–BL3, /BL3 thus arranged are repetitively disposed.

In FIG. 2, address buffer 16 selectively supplies externally supplied address signals A0–A11 to row decoder 12 and column decoder 13. Row decoder 12 is responsive to a row address signal supplied from address buffer 16 to drive selectively one of the plurality of word lines WL. Column decoder 13 is responsive to a column address signal supplied from address buffer 16 to select one of the plurality of bit line pairs.

Sense amplifier band 14 includes a plurality of sense amplifiers (SA) 22 as shown in FIG. 3. The plurality of sense amplifiers 22 are provided correspondingly to the plurality of bit line pairs BL1, /BL1–BL3, /BL3, respectively. Each sense amplifier 22 amplifies a potential difference between bit lines BL1 and /BL1, BL2 and /BL2, or BL3 and /BL3 in the corresponding pair. In FIG. 2, I/O circuit 15 supplies a potential of the bit line pair selected by column decoder 13 to output buffer 18. Output buffer 18 amplifies the supplied potential and externally outputs the same as output data DQ1–DQ4. Input buffer 17 takes in externally supplied input data DQ1–DQ4. I/O circuit 15 supplies the input data taken into input buffer 17 to the bit line pair selected by column decoder 13.

Referring again to FIG. 3, the memory cell array is provided with a body fixing line FL1 disposed along bit line BL1. A body fixing line FL2 is disposed between bit lines /BL1 and BL2. A body fixing line FL3 is disposed between bit lines /BL2 and BL3. A body fixing line FL4 is disposed along bit line /BL3. A common line 24 is disposed between the plurality of sense amplifiers 22 and word line WL. The common line 24 is connected to body fixing lines FL1–FL4. A common line 25 is disposed at a side remote from common line 24. Common line 25 is also connected to body fixing lines FL1–FL4. Thus, body fixing lines FL1–FL4 are commonly connected together via common lines 24 and 25.

Figure 4:
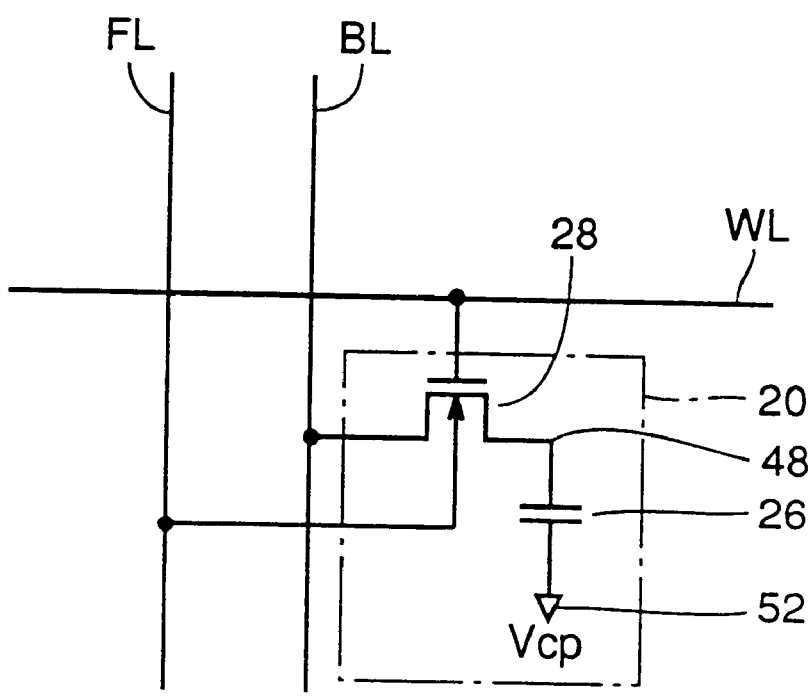
FIG. 4 is a circuit diagram showing one memory cell and its peripheral portion in the DRAM.

Each memory cell 20 is connected to the corresponding body fixing line. FIG. 4 is a circuit diagram showing one of memory cells 20 and its peripheral portion. Referring to FIG. 4, memory cell 20 includes a transfer gate 28 and a cell capacitor 26. Transfer gate 28 is formed of an N-channel MOS transistor, and is connected between bit line BL and a storage node 48 of cell capacitor 26. A gate electrode of transfer gate 28 is connected to word line WL. A body region of transfer gate 28 is connected to body fixing line FL.

Figure 5:
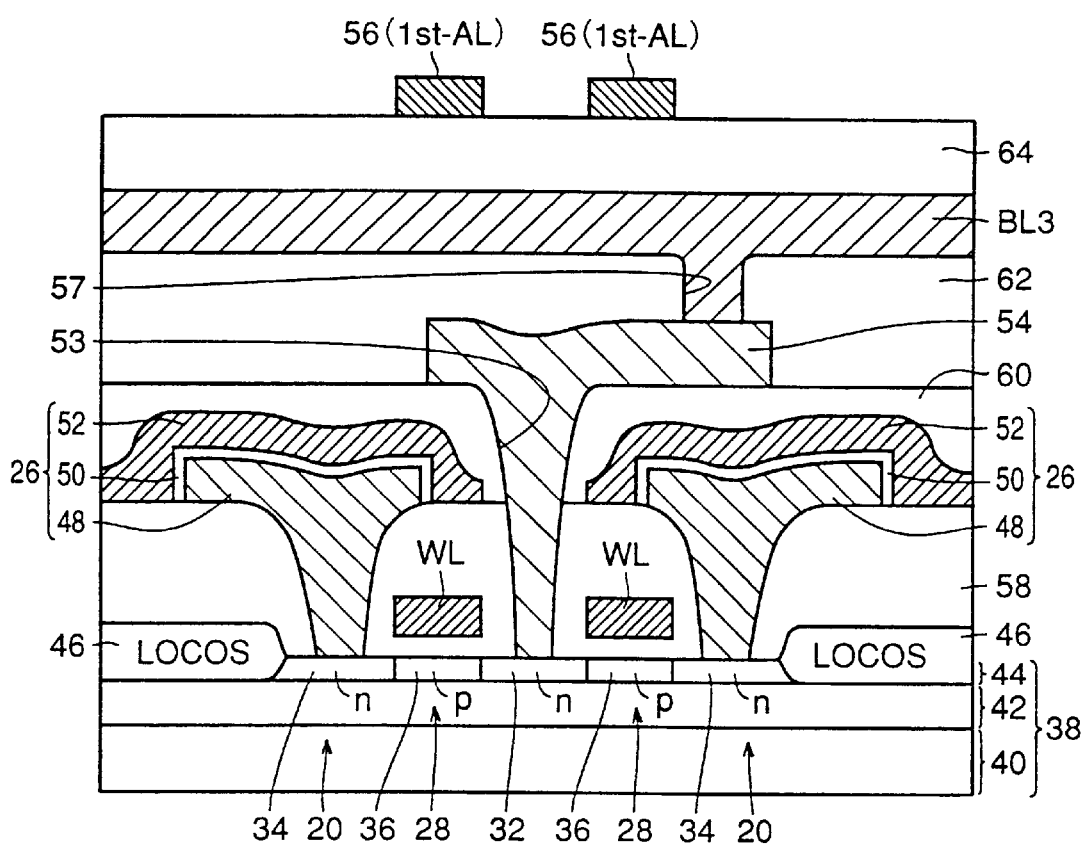
FIG. 5 is a cross section taken along line 5—5 in FIG. 1.
Figure 6:
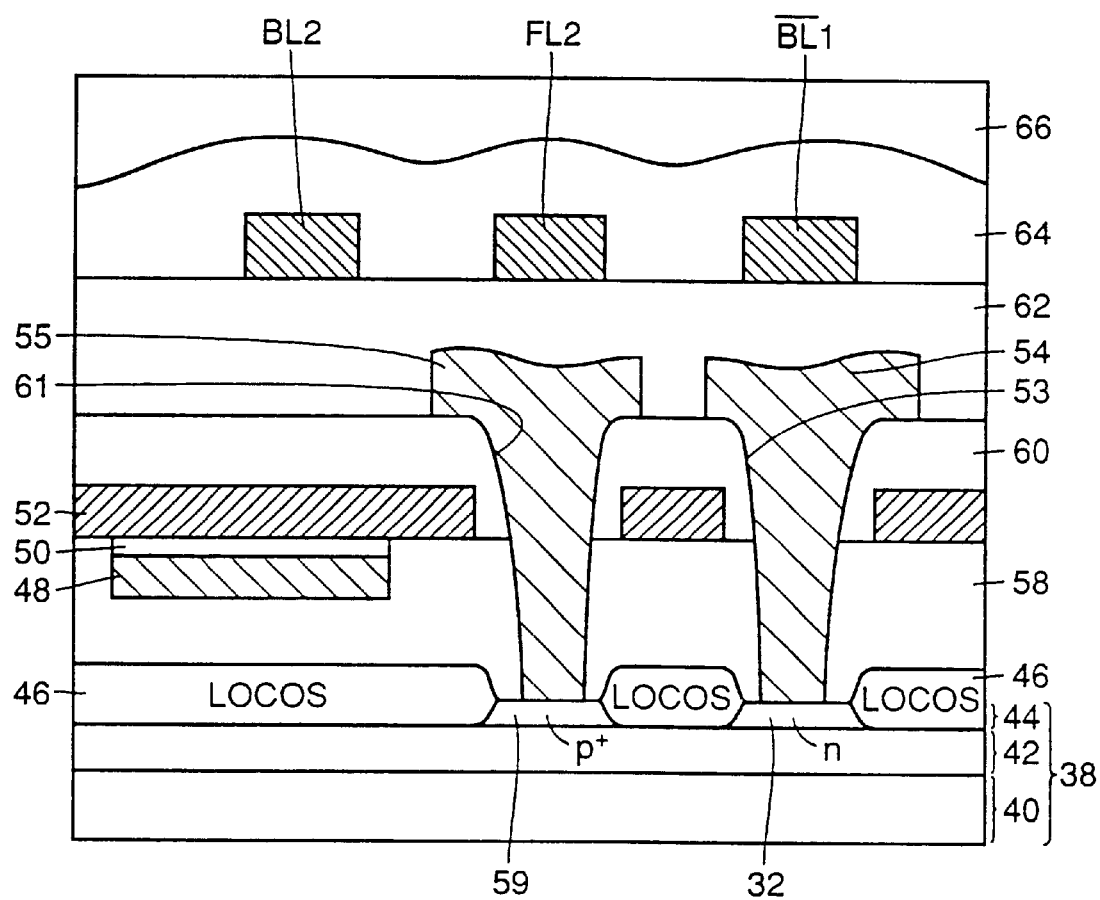
FIG. 6 is a cross section taken along line 6—6 in FIG. 1.

FIG. 1 is a plan specifically showing a portion surrounded by alternate long and short dash line in FIG. 3. FIG. 5 is a cross section taken along line 5—5 in FIG. 1. FIG. 6 is a cross section taken along line 6—6 in FIG. 1.

Referring to FIGS. 1, 5 and 6, these memory cells 20 are formed on an SOI substrate 38. SOI substrate 38 is formed of a p-type silicon substrate 40, a buried oxide film 42 made of $SiO_2$ and an SOI active layer 44. SOI substrate 38 is manufactured, for example, by an SIMOX method in which oxygen is implanted into a bulk of a silicon substrate to form buried oxide layer 42 in the silicon substrate.

At SOI active layer 44, there are formed n-type source/drain regions 32 and 34. A p-type body region 36 is formed between source/drain regions 32 and 34.

LOCOS films 46 are formed at SOI active layer 44. Word lines WL forming gate electrodes are formed on body regions 36. Word lines WL are formed in an interlayer insulating film 58. Thus, the gate electrode forming word line WL, body region 36, and source/drain regions 32 and 34 form the N-channel MOS transistor, i.e., transfer gate 28. Transfer gate 28 is isolated from other elements by LOCOS film 46 formed around the same. LOCOS film 46 has a bottom surface in contact with buried oxide film 42.

Storage node 48 is formed on each source/drain region 34. A cell plate 52 is formed on storage node 48, and an insulating film 50 made of, e.g., $SiO_2$ or $Si_3N_4$ is interposed therebetween. Storage node 48, insulating film 50 and cell plate 52 form cell capacitor 26. Therefore, memory cell 20 is of a stack type. On cell plate 52, there is formed an intermediate layer 54 made of, e.g., polycrystalline silicon with an interlayer insulating film 60 therebetween. Intermediate layer 54 is in contact with source/drain region 32 through a contact hole 53 formed at interlayer insulating films 58 and 60. Bit line BL3 is formed on intermediate layer 54 with an interlayer insulating film 62 therebetween. Bit line BL3 is in contact with intermediate layer 54 through a contact hole 57 formed at interlayer insulating film 62. Thus, source/drain region 32 of transfer gate 28 is connected to bit line BL3, and source/drain region 34 is connected to cell capacitor 26.

On bit line BL3, there are formed piling word lines 56, e.g., made of aluminum with an interlayer insulating film 64 therebetween. These piling word lines 56 are substantially disposed immediately above and along word lines WL. Each piling word line 56 is connected to word line WL through contact holes which are not shown and are spaced from each other by a predetermined distance. Piling word line 56 is provided for preventing reduction of the potential of word line WL and transmission delay, which may become remarkable as a distance from row decoder 12 increases. These interlayer insulating films 58, 60, 62, 64 and 66 are made of, e.g., $SiO_2$.

Body region 36 has a portion protruded along word line WL and connected to body region 36 of transfer gate 28 in adjacent memory cell 20. In FIG. 1, each active region 30 is formed of body regions 36 and source/drain regions 32 and 34 in adjacent two memory cells 20. A $P^+$-type contact region 59 is formed at the protruded portion of body region. A contact hole 61 is formed on contact region 59, and an intermediate layer 55 is formed thereon. Intermediate layer 55 extends along body fixing line FL2, and a contact hole 63 is formed on intermediate layer 55. Therefore, contact region 59 of body region 36 is connected to body fixing line FL2 via intermediate layer 55 and contact hole 63. Thus, body regions 36 of transfer gates 28 in two memory cells 20 are connected to one position of one body fixing line. The body fixing line is formed at the same interconnection layer as the bit line. Thus, the body fixing line and the bit line are formed on interlayer insulating film 62.

A ground potential Vss is supplied to common lines 24 and 25 in FIG. 3, so that ground potential Vss is supplied to all body fixing lines FL1–FL4. As described above, body regions 36 of transfer gates 28 in memory cells 20 are connected to body fixing lines FL1–FL4, so that ground potential Vss is supplied body regions 36. Thereby, each body region 36 is electrically fixed. Therefore, the body region 36 is not electrically floated in spite of the fact that body region 36 is surrounded by LOCOS film 46 and buried oxide layer 42.

When row decoder 12 raises the potential of one of word lines WL, the plurality of corresponding memory cells 20 are selected. Thereby, data of these memory cells 20 are read onto bit line pairs BL1, /BL1–BL3, /BL3. The potential of bit line BL connected to memory cell 20 which stored the data at H (logical high) level is raised, e.g., from intermediate potential (Vccs+Vss)/2 to an internal sense power supply potential vccs by sense amplifier 22. Here, internal sense power supply potential Vccs is lower than power supply potential Vcc, e.g., by a threshold voltage of the transistor. In unselected memory cell 20 neighboring to selected memory cell 20, body region 36 of transfer gate 28 is subjected to potential variation of the corresponding bit line BL via capacity coupling. However, the body region 36 is electrically fixed, so that the potential of body region 36 does not rise in response to the potential variation of bit line BL as shown at (b) in FIG. 68. Therefore, reduction of the threshold voltage of transfer gate 28, which increases a tendency of flow of the subthreshold current, does not occur. Accordingly, in unselected memory cell 20, potential change of cell capacitor 26 which may be caused by leak via transfer gate 28 does not occur.

Figure 7:
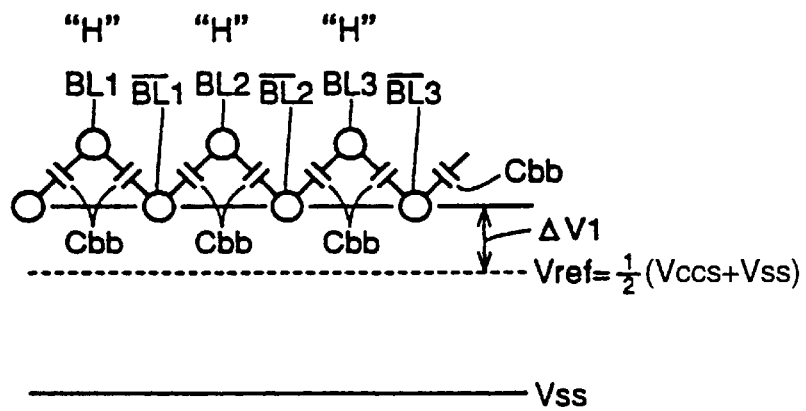
FIG. 7 shows capacity coupling between bit lines in the case where a shield line is not disposed between bit lines in a DRAM having a folded bit line structure of a half pitch.

FIG. 7 is a diagram for showing capacity coupling between the bit lines in the DRAM which has a folded bit line structure of a half pitch and is not provided with a shield line between the bit lines. Referring to FIG. 7, it is assumed that all memory cells 20 connected to the selected word line store data at H-level. In this case, the potentials of bit lines BL1, BL2 and BL3 attain H-level. The potentials of bit lines /BL1, /BL2 and /BL3 at the reference side of sense amplifiers 22 rise ΔV1 in accordance with potential rise of adjacent bit lines BL1, BL2 and BL3, respectively, because bit lines /BL1–/BL3 are coupled to bit lines BL1–BL3 via inter-bit-line capacities Cbb, respectively. Thereby, read potential difference occurring at the bit line pair decreases ΔV1, and an operation margin lowers correspondingly.

Figure 8:
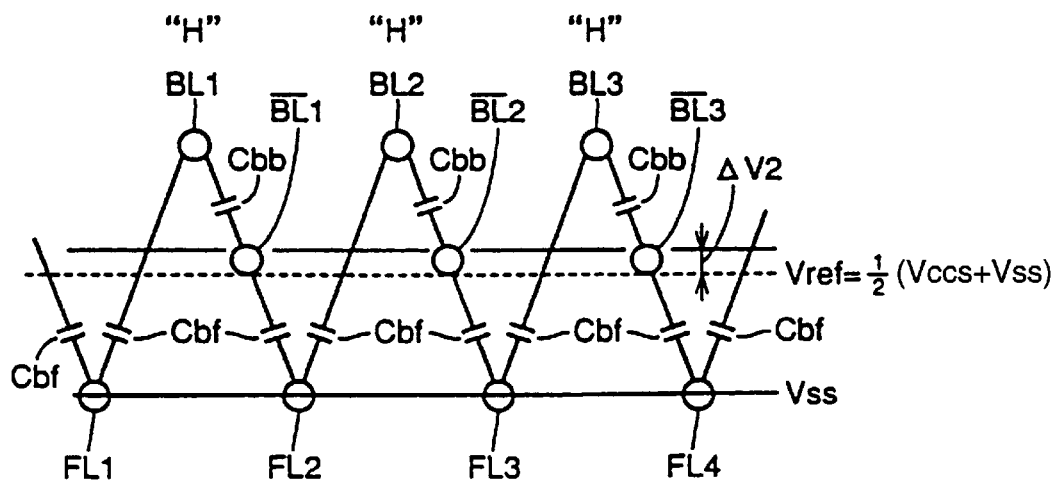
FIG. 8 shows capacity coupling between bit lines in the DRAM shown in FIG. 3.

FIG. 8 is a diagram for showing the DRAM which has the folded bit line structure of the half pitch shown in FIG. 3 and is provided with the body fixing line functioning as the shield line between the bit lines. Referring to FIGS. 3 and 8, when data of all memory cells 20 connected to selected word line WLS are at H-level, all bit lines BL1–BL3 attain H-level, and the potentials of bit lines /BL1–/BL3 at the reference side of sense amplifiers 22 rise in accordance with the potential rise of bit lines BL1–BL3. However, bit lines BL1–BL3 are connected to body fixing lines FL1–FL3 via capacitors Cbf, respectively, so that the potentials of bit lines /BL1–/BL3 rise only ΔV2, which is smaller than ΔV1, because of capacity division. Therefore, noise interference between the bit lines in the read operation is suppressed.

Since body fixing lines FL1–FL4 are respectively disposed between bit line pairs BL1 and /BL1–BL3 and /BL3, bit line pairs BL1 and /BL1–BL3 and /BL3 are shielded by body fixing lines FL1–FL4, respectively. This reduces noises which may be applied from each bit line pair to the other bit line pairs. Further, bit line pairs BL1 and /BL1–BL3 and /BL3 are formed at the same interconnection layer as body fixing lines FL1–FL4, which also reduces such noises. Since both body regions 36 of transfer gates 28 in two memory cells 20 are connected to one position of one body fixing line via contact hole 61, intermediate layer 55 and contact hole 53, increase of the layout area can be suppressed. Since body regions 36 of transfer gates 28 in two memory cells 20 are commonly connected to one body fixing line, the capacity of the body fixing line can be increased. The increased capacity of the body fixing line can further suppress the potential variation of the bit line which may be caused by noises.

Since one body fixing line is provided for two bit lines, the body fixing line increases the layout area by only about 1.5 times. Common lines 24 and 25 are formed of first aluminum lines and cross with the bit line pairs. Therefore, common lines 24 and 25 do not cross with piling word line 56 made of the first aluminum line. Also, these common lines 24 and 25 do not cross with a column select line 91 made of, e.g., a second aluminum line. Common lines 24 and 25 may be common with a ground line provided for supplying ground potential Vss to the peripheral circuitry.

When common lines 24 and 25 are supplied with ground potential Vss, ground potential Vss is supplied to all body fixing lines FL1–FL4. Therefore, it is not necessary to dispose the ground line between the piling word lines or between the column select lines in contrast to the case where ground potential Vss is supplied independently to each body fixing line, so that it is not necessary to provide additional connections between the ground line and the body fixing lines. Accordingly, the layout area can be reduced.

Figure 9:
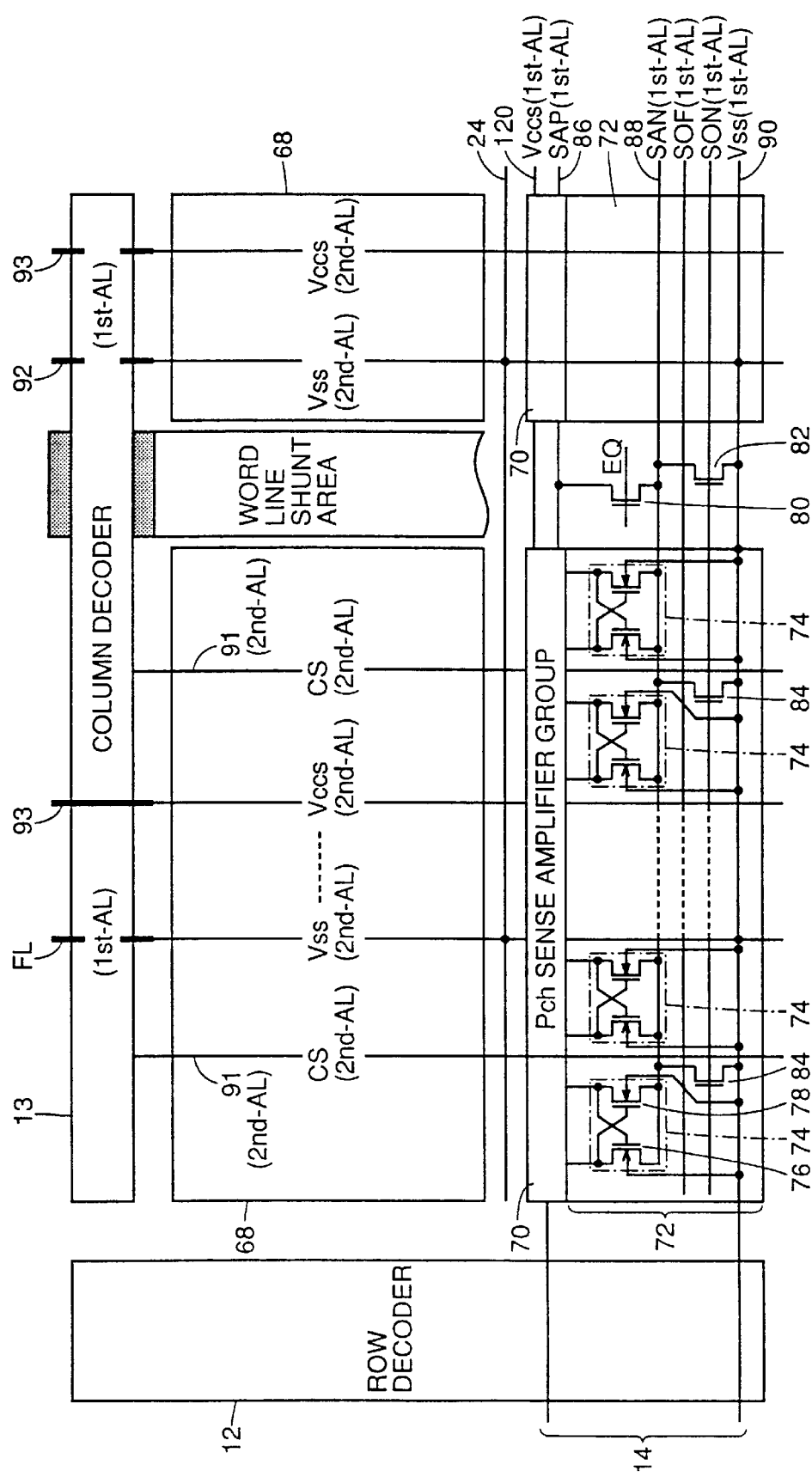
FIG. 9 is a block diagram fragmentarily showing a structure of the DRAM according to an embodiment 1 of the invention.

FIG. 9 is a block diagram fragmentarily and specifically showing memory cell array group 11, sense amplifier band 14, row decoder 12 and column decoder 13 shown in FIG. 2. Referring to FIG. 9, memory cell array group 11 is formed of a plurality of memory cell arrays 68. Sense amplifier band 14 is provided with a plurality of P-channel sense amplifier groups 70 and a plurality of N-channel sense amplifier groups 72. Sense amplifier band 14 is also provided with a plurality of equalizer transistors 80 and a plurality of drive transistors 82 corresponding to P- and N-channel sense amplifier groups 70 and 72. Each N-channel sense amplifier group 72 is provided with a plurality of N-channel sense amplifiers 74. Each sense amplifier 74 includes cross-coupled N-channel MOS transistors 76 and 78. Source electrodes of both transistors 76 and 78 are connected to one sense amplifier drive line 88.

N-channel sense amplifier group 72 is further provided with drive transistors 84 corresponding to some of N-channel sense amplifiers 74. Each transistor 84 is connected between sense amplifier drive line 88 and ground line 90 supplied with ground potential Vss, and is turned on in response to a drive signal SON. Drive transistor 82 is connected between sense amplifier drive line 88 and ground line 90, and is turned on in response to drive signal S0F.

Equalize transistor 80 is connected between sense amplifier drive line 86 in P-channel sense amplifier group 70 and sense amplifier drive line 88 in N-channel sense amplifier group 72, and is turned on in response to equalize signal EQ. Sense amplifier drive lines 86 and 88 are initially precharged to intermediate potential (Vccs+Vss)/2, and then are equalized by equalize transistor 80 to have equal potentials SAP and SAN. Subsequently, drive transistor 82 is turned on in response to drive signal S0F, so that potential SAN of sense amplifier drive line 88 starts to lower toward ground potential Vss. Then, drive transistor 84 is turned on in response to drive signal SON, so that potential SAN of sense amplifier drive line 88 rapidly lowers toward ground potential Vss.

P-channel sense amplifier group 70 has a structure similar to N-channel sense amplifier group 72, and operates in the substantially same manner. In P-channel sense amplifier group 70, however, potential SAP of sense amplifier drive line 86 rises toward internal sense power supply potential Vccs.

In the conventional so-called common sense method, since one sense amplifier band 14 is provided with one equalize transistor and two drive transistors, the resistance of sense amplifier drive line substantially increases, and hence a low operation speed of each sense amplifier decreases. Meanwhile, in the foregoing buried sense drive method, equalize transistors 82 and drive transistors 80 and 84 are dispersed in sense amplifier band 14, so that resistances of sense amplifier drive lines 86 and 88 substantially decrease, and hence the operation speed of sense amplifier 74 increases.

Ground line 92 for supplying ground potential Vss to N-channel sense amplifier group 72 is disposed along the bit line. Body fixing lines FL are disposed parallel to ground line 92. A power supply line 93 for supplying internal sense power supply potential Vccs to P-channel sense amplifier group 70 and column select line 91 for supplying column select signal CS to the same are disposed parallel to ground line 92.

One common line 24 is disposed along sense amplifier band 14. Ground line 92 is connected to common line 24 and ground line 90. Likewise, body fixing lines FL are connected to common line 24 and ground line 90. Therefore, ground potential Vss supplied to ground line 92 is supplied to ground line 90 as well as common line 24. Ground potential Vss supplied to common line 24 is supplied to body fixing lines FL. Power supply line 93 may be supplied with external power supply potential Vcc instead of internal sense power supply potential Vccs.

As described above, since common line 24 is disposed along sense amplifier band 14, ground potential Vss can be easily supplied to body fixing lines FL by supplying ground potential Vss, which is supplied to sense amplifiers 74, to common line 24. Therefore, increase of the layout area which is caused by body fixing lines FL and common line 24 can be minimized.

The body regions of transistors 76 and 78 are not connected to ground line 90. Therefore, sense amplifiers 74 can operate stably. Although not shown, the body regions of equalize transistor 80 and drive transistors 82 and 84 are also supplied with ground potential Vss, whereby these body regions are electrically fixed. The body regions of P-channel transistors in the P-channel sense amplifiers are supplied with internal sense power supply potential Vccs or external power supply potential Vcc, whereby these body regions are electrically fixed.

Figure 10:
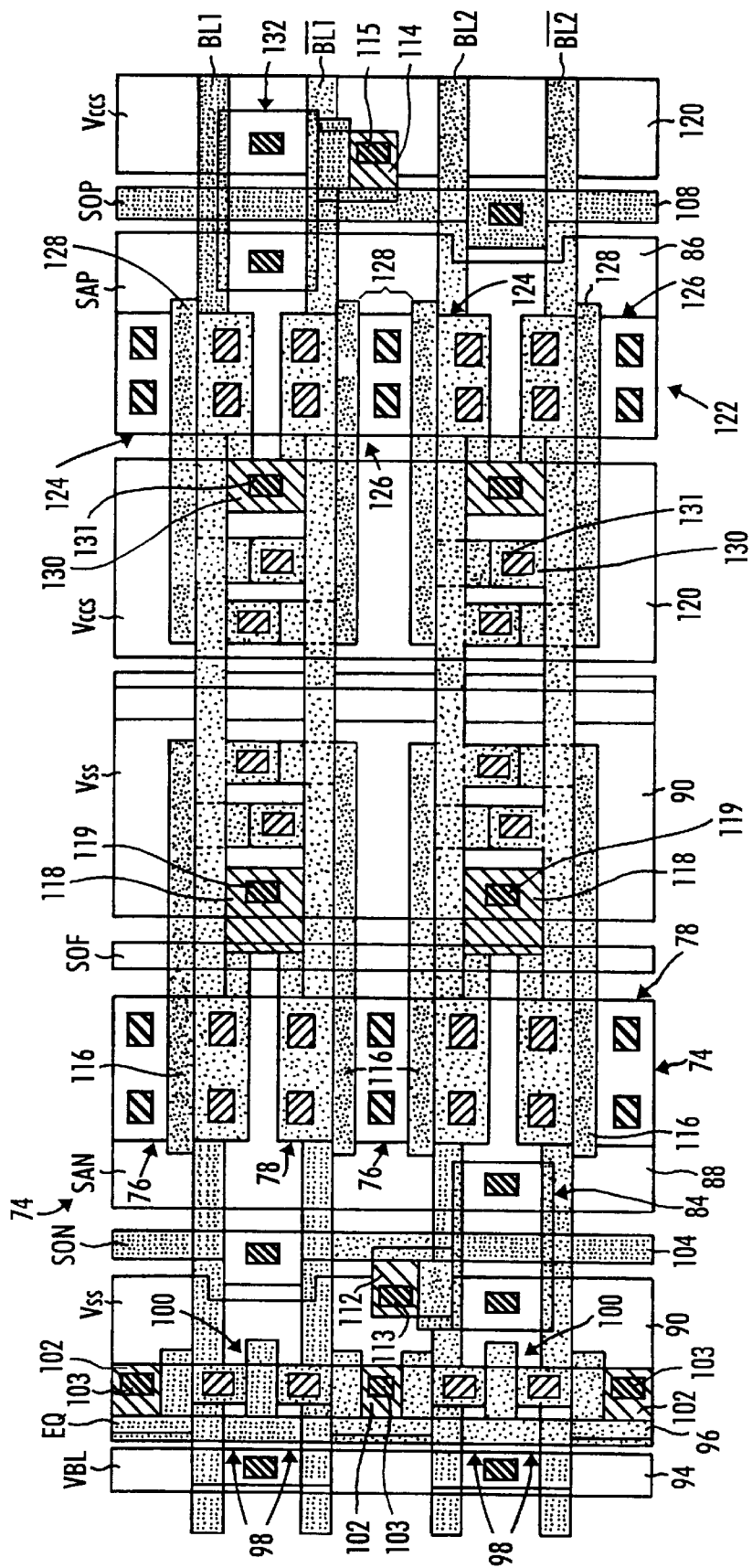
FIG. 10 is a plan showing a specific structure of a sense amplifier shown in FIG. 9 and its peripheral portion.

FIG. 10 is a plan showing specific structures of the P- and N-channel sense amplifiers in FIG. 9 as well as the drive transistors for driving these sense amplifiers, equalize transistors for equalizing the potentials of bit line pairs and others. Referring to FIG. 10, a gate electrode line 116 of N-channel MOS transistor 76 in N-channel sense amplifier 74 is connected to bit line /BL1 or /BL2. Gate electrode line 116 of N-channel MOS transistor 78 is connected to bit line BL1 or BL2. Both body regions under gate electrodes 116 of transistors 76 and 78 protrude in the bit line direction. These protruded portions of body regions are common to each other and are provided with $p^+$-type contact region 118. The body regions of transistors 76 and 78 are connected to ground line 90 via contact holes 119 formed on contact regions 118.

A gate electrode 128 of a P-channel MOS transistor 124 forming a P-channel sense amplifier 122 is connected to bit line /BL1 or /BL2. Gate electrode 128 of a P-channel MOS transistor 126 forming a P-channel sense amplifier 122 is connected to bit line BL1 or BL2. Both the body regions of transistors 124 and 126 protrude in the bit line direction. These protruded portions are common to each other, and each common portion is provided with $n^+$-type contact region 130. The body regions of transistors 124 and 126 are connected through contact holes 131 formed on contact regions 130 to a power supply line 120 supplied with internal sense power supply voltage Vccs.

A drive line 104 supplied with drive signal SON forms a gate electrode of drive transistor 84. The body region of drive transistor 84 protrudes along the drive line 104, and a $p^+$-type contact region 112 is formed at the protruded portion. The body region of drive transistor 84 is connected to ground line 90 through contact hole 113 formed at contact region 112.

A drive transistor 132 driving P-channel sense amplifier 122 is connected between a power supply line 120 supplied with an internal power supply potential Vccs and sense amplifier drive line 86 supplied with drive signal SAP. Drive line 108 supplied with drive signal SOP forms a gate electrode of drive transistor 132. A body region of drive transistor 132 protrudes along drive line 108, and $n^+$-type contact region 114 is formed at the protruded portion. The body region of drive transistor 132 is connected to power supply line 120 through a contact hole 115 formed on contact region 114.

An equalize transistor 100 formed of an N-channel MOS transistor is connected between bit lines BL1 and /BL1 (and BL2 and /BL2) in each pair. A precharge transistor 98 formed of an N-channel MOS transistor is connected between a precharge line 94 supplied with a precharge potential VBL and each of bit lines BL1, /BL1, BL2 and /BL2. An equalize line 96 supplied with an equalize signal EQ extends straight along precharge line 94. Equalize line 96 forms gate electrodes of precharge transistors 98 and equalize transistors 100. The body regions of precharge transistors 98 and equalize transistors 100 are provided with $p^+$-type contact regions 102. The body regions of precharge transistors 98 and equalize transistors 100 are connected to ground line 90 through contact holes 103 formed on contact regions 102.

[Embodiment 2]

Figure 11:
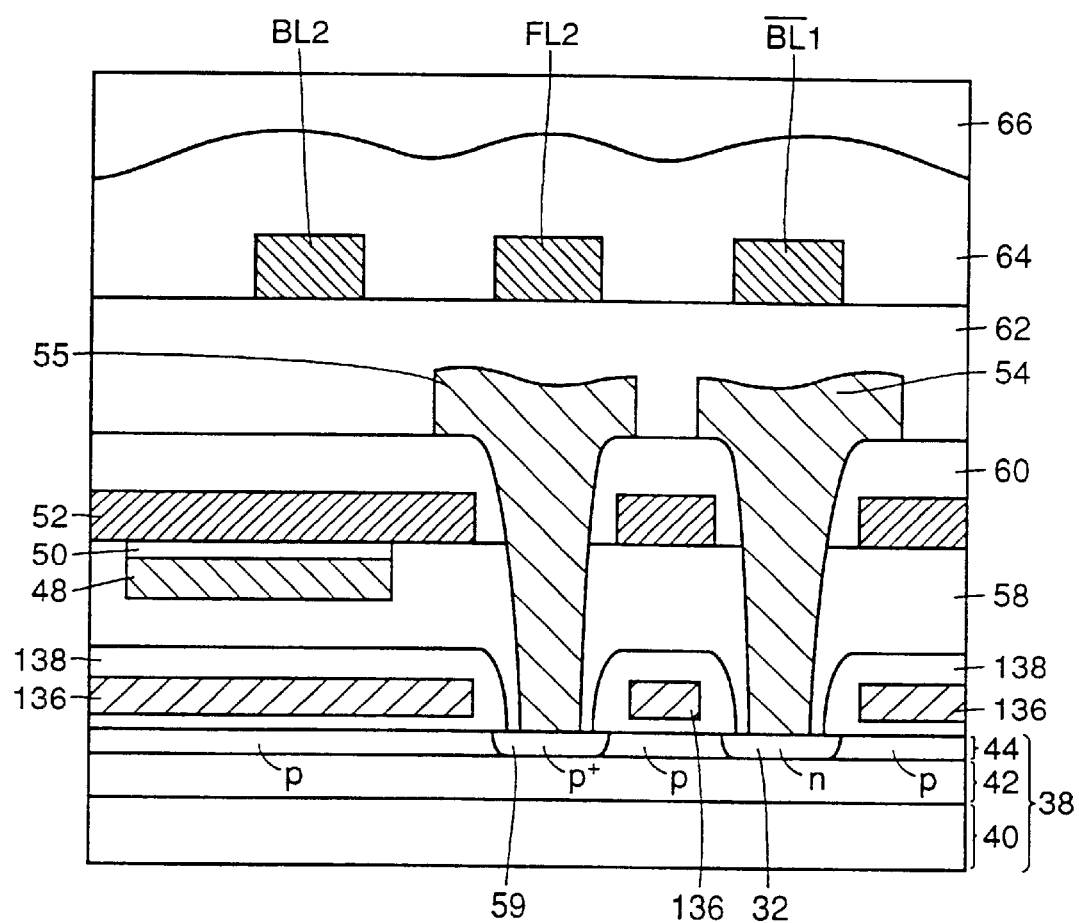
FIG. 11 is a cross section showing a DRAM according to an embodiment 2 of the invention, and particularly showing a structure employing field shield isolation instead of LOCOS isolation in FIG. 6.

FIG. 11 is a cross section showing a structure employing field shield isolation instead of LOCOS isolation in FIG. 6. In the embodiment 2 shown in FIG. 11, a field shield electrode 136 is formed on SOI substrate 38. Field shield electrode 136 is formed in an interlayer insulating film 138. As described above, the element isolation may be achieved by the field shield isolation instead of LOCOS isolation.

[Embodiment 3]

Figure 12:
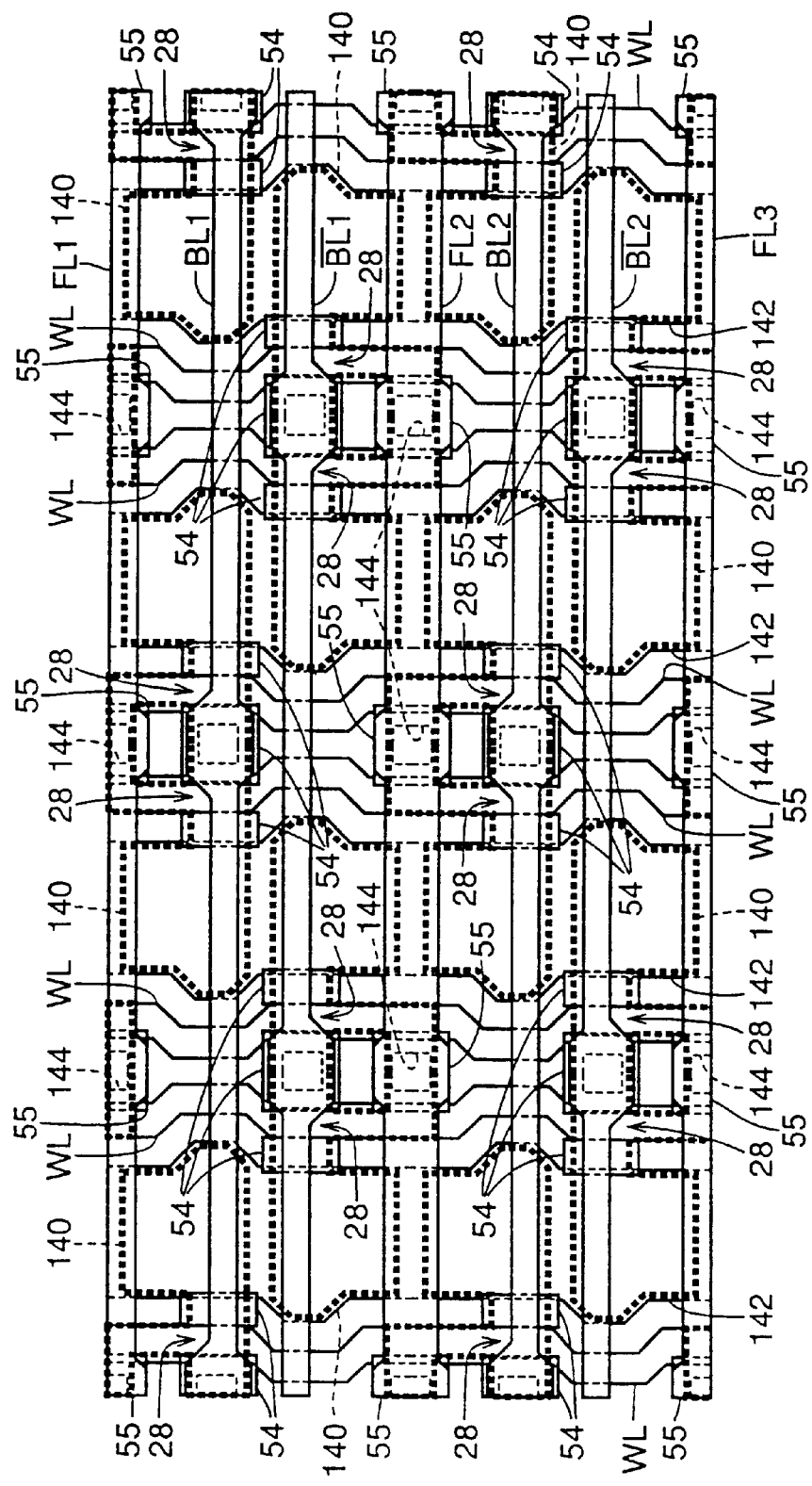
FIG. 12 is a plan fragmentarily showing a structure of a DRAM according to an embodiment 3 of the invention.

FIG. 12 is a plan showing planar memory cells, and in particular showing a specific structure of a portion surrounded by alternate long and two short dashes line in FIG. 3. Referring to FIG. 12, transfer gates 28 of adjacent two memory cells are formed on one active region 140. A cell plate 142 is disposed between word lines WL. In one active region 140, the body regions of two transfer gates 28 are common to each other. A $p^+$-type contact region of the body region is connected to intermediate layer 55 through a contact hole. Therefore, the body regions of two transfer gates are connected to corresponding one of body fixing lines FL1, FL2 and FL3 through contact hole 144. Accordingly, the layout area can be smaller than that in the case where the body region of transfer gate in one memory cell is independently connected to one body fixing line through one contact hole.

[Embodiment 4]

Figure 13:
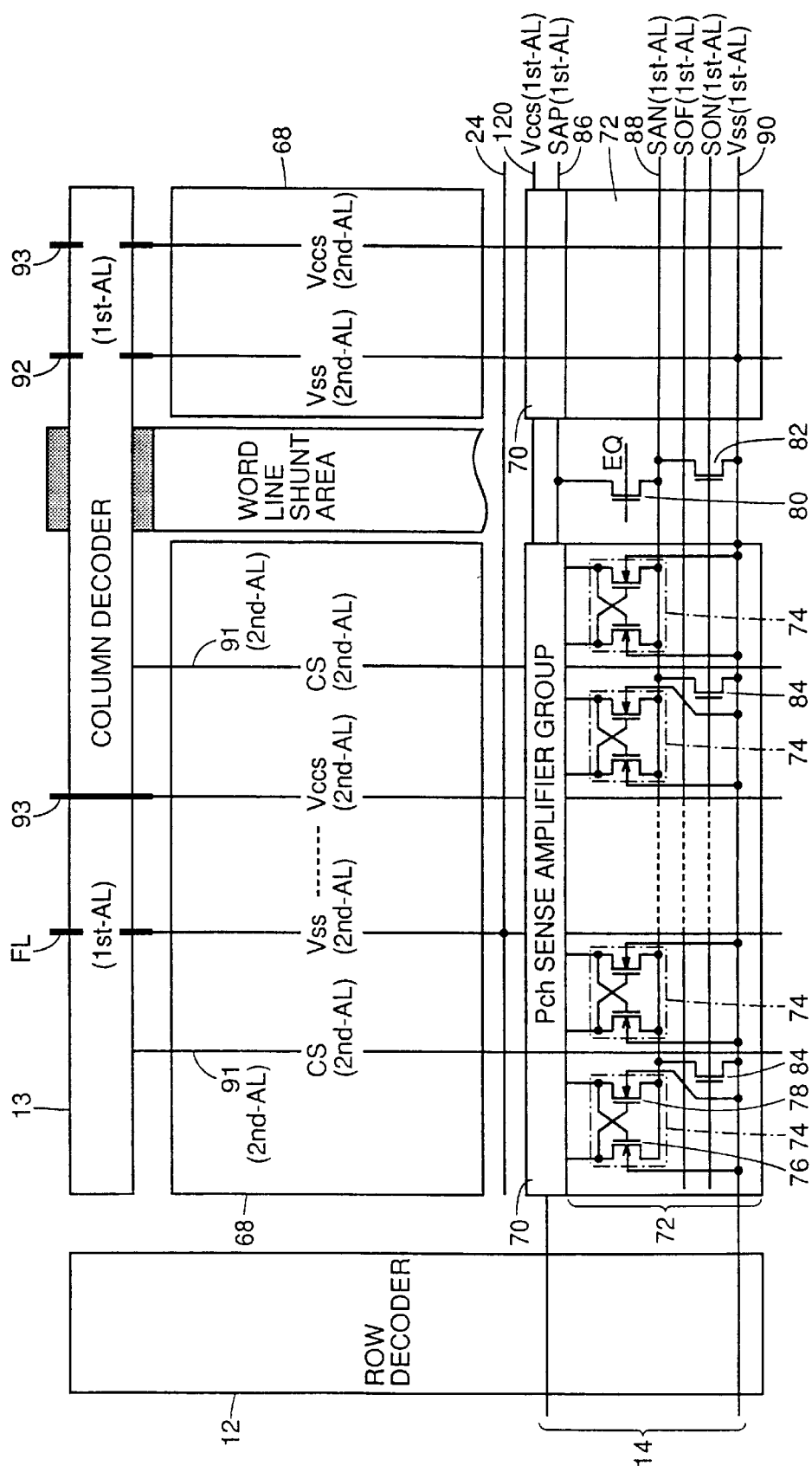
FIG. 13 is a block diagram fragmentarily showing a structure of a DRAM according to an embodiment 4 of the invention.

FIG. 13 is a block diagram fragmentarily showing a structure of a DRAM according to the embodiment 4 of the invention. Referring to FIG. 13, the embodiment 4 differs from the structure in FIG. 9 in that body fixing line FL is not connected to ground line 90. Further, ground line 92 is not connected to common line 24. Therefore, ground potential Vss supplied to body fixing line FL and common line 24 is independent from ground potential Vss supplied to ground lines 90 and 92. Accordingly, even if ground potential Vss of ground lines 90 and 92 changes in accordance with operation of N-channel sense amplifier 74, ground potential Vss of body fixing line FL and common line 24 does not change. Thereby, stable ground potential Vss is supplied to the body region of transfer gate in the memory cell.

[Embodiment 5]

Figure 14:
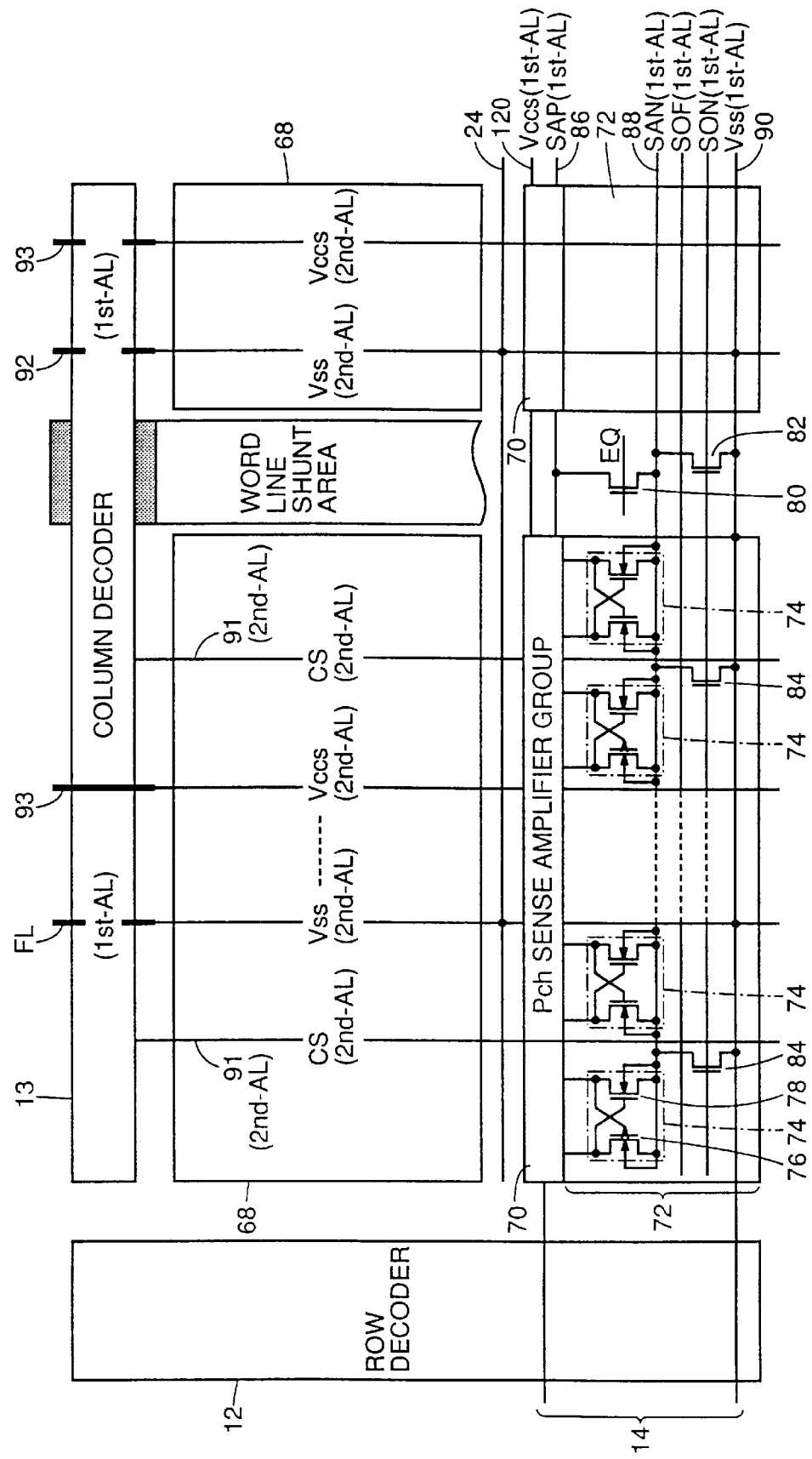
FIG. 14 is a block diagram fragmentarily showing a structure of a DRAM according to an embodiment 5 of the invention.

FIG. 14 is a block diagram fragmentarily showing a structure of a DRAM according to the embodiment 5 of the invention. The embodiment 5 shown in FIG. 14 differs from the structure in FIG. 9 in that the body regions of transistors 76 and 78 in N-channel sense amplifier 74 are connected to their own source electrodes, i.e., sense amplifier drive line 88. Although not shown, the body regions of transistors in the P-channel sense amplifier are connected to their own source electrodes, i.e., sense amplifier drive line 86.

According to this embodiment 5, since the body regions of transistors in the sense amplifiers are connected to their own source electrodes, a substrate effect does not occur. Therefore, the sense amplifiers can operate fast.

Figure 15:
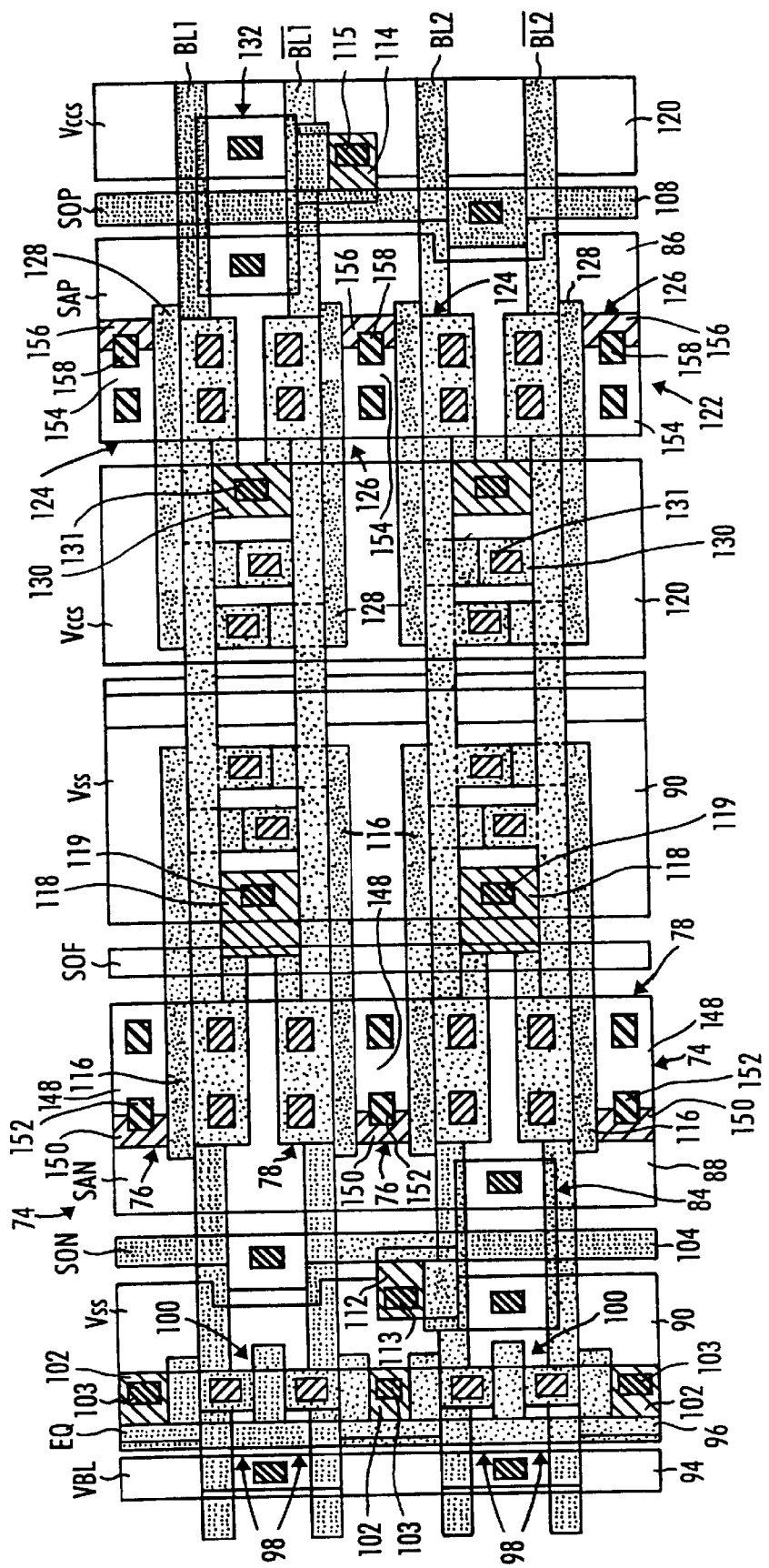
FIG. 15 is a plan showing specific structure of a sense amplifier shown in FIG. 14 and its peripheral portion.

FIG. 15 is a layout diagram showing specific structures of the P- and N-channel sense amplifiers shown in FIG. 14 and their peripheral portions. Referring to FIG. 15, the embodiment 5 differs from the structure in FIG. 10 in that $p^+$-type common regions 150 are formed adjacent to respective source/drain regions 148 of transistors 76 and 78 in N-channel sense amplifier 74. Contact holes 152 are formed on boundary lines between source/drain regions 148 and common regions 150. Therefore, each of the body regions of transistors 76 and 78 is connected to sense amplifier drive line 88 via common region 150 and contact hole 152.

An $n^+$-type common region 156 is formed adjacent to each of source/drain regions 154 of transistors 124 and 126 in P-channel sense amplifier 122. Contact holes 158 are formed on boundary lines between source/drain regions 154 and common regions 156. Therefore, each of the body regions of transistors 124 and 126 is connected to sense amplifier drive line 86 via common region 156 and contact hole 158.

[Embodiment 6]

Figure 16:
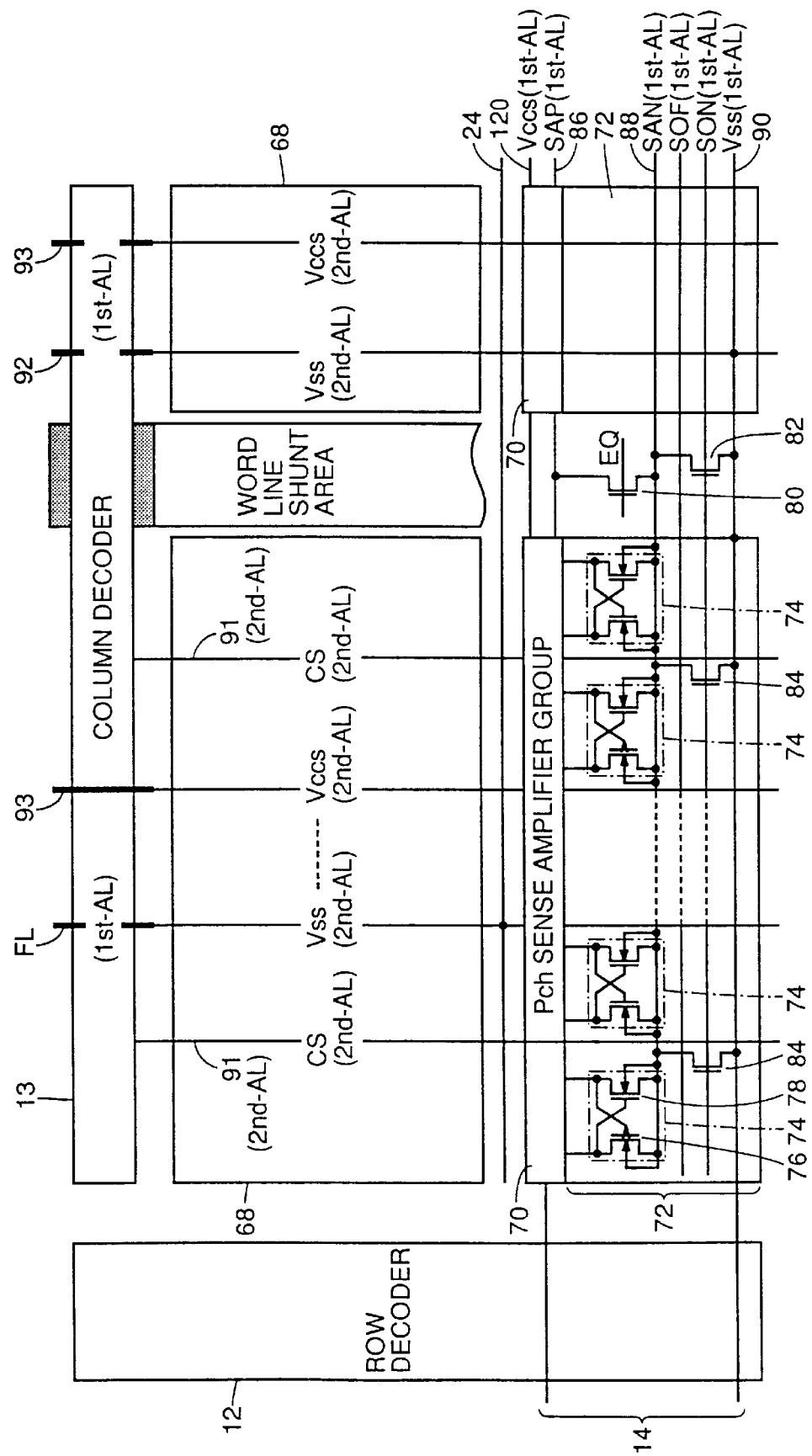
FIG. 16 is a block diagram fragmentarily showing a structure of a DRAM according to an embodiment 6 of the invention.

FIG. 16 is a block diagram fragmentarily showing a DRAM according to the embodiment 6 of the invention. Referring to FIG. 16, the embodiment 6 differs from the structure in FIG. 14 in that ground line 92 is not connected to common line 24. Body fixing lines FL are not connected to ground line 90. Similarly to the embodiment 4, therefore, even when ground potential Vss of ground lines 90 and 92 changes in accordance with operation of N-channel sense amplifier 74, ground potential Vss of body fixing lines FL and common line 24 do not change. Therefore, stable ground potential Vss is supplied to the body region of transfer gate in the memory cell.

[Embodiment 7]

Figure 17:
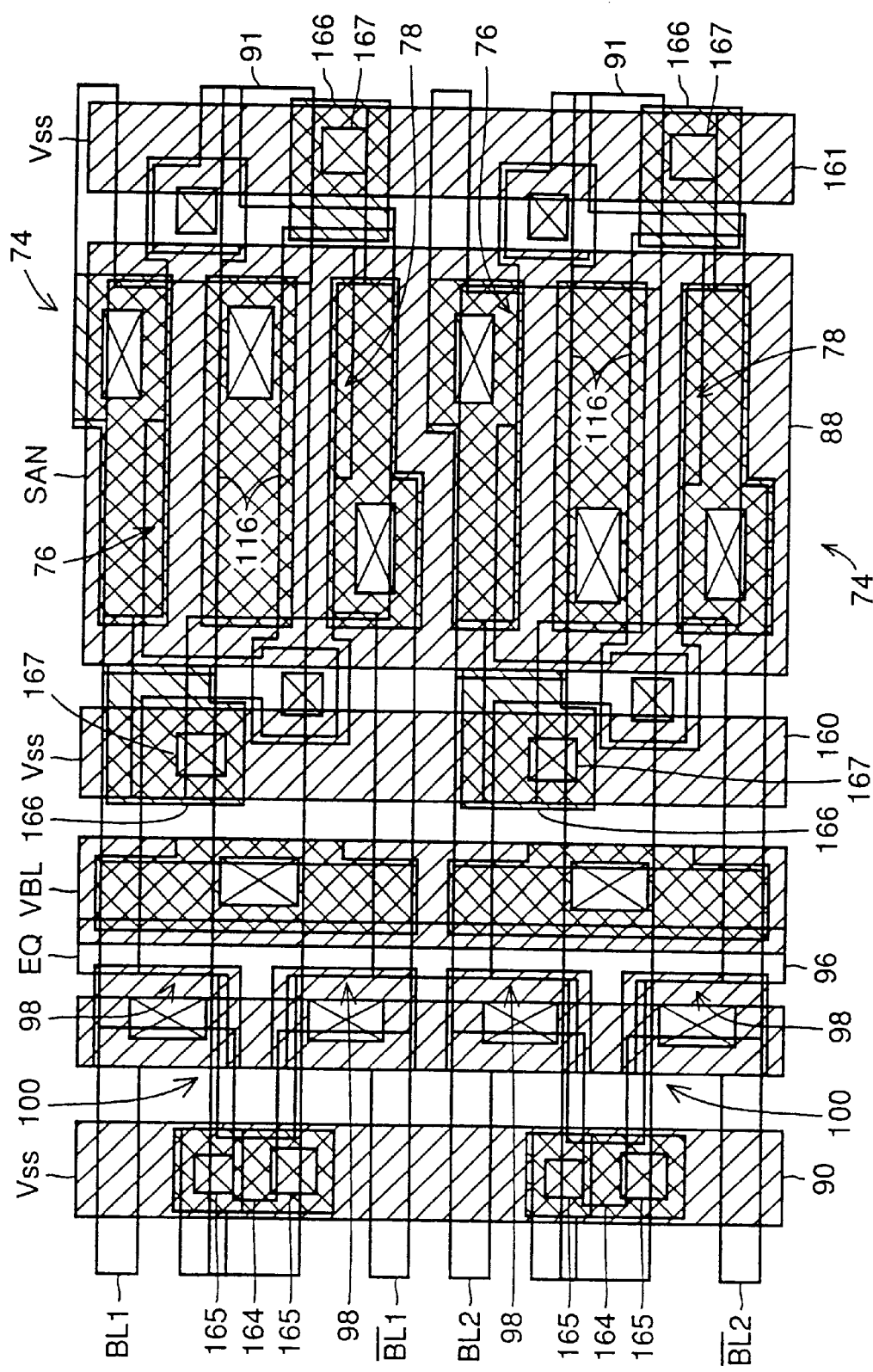
FIG. 17 is a plan fragmentarily showing a structure of a DRAM according to an embodiment 7 of the invention.
Figure 18:
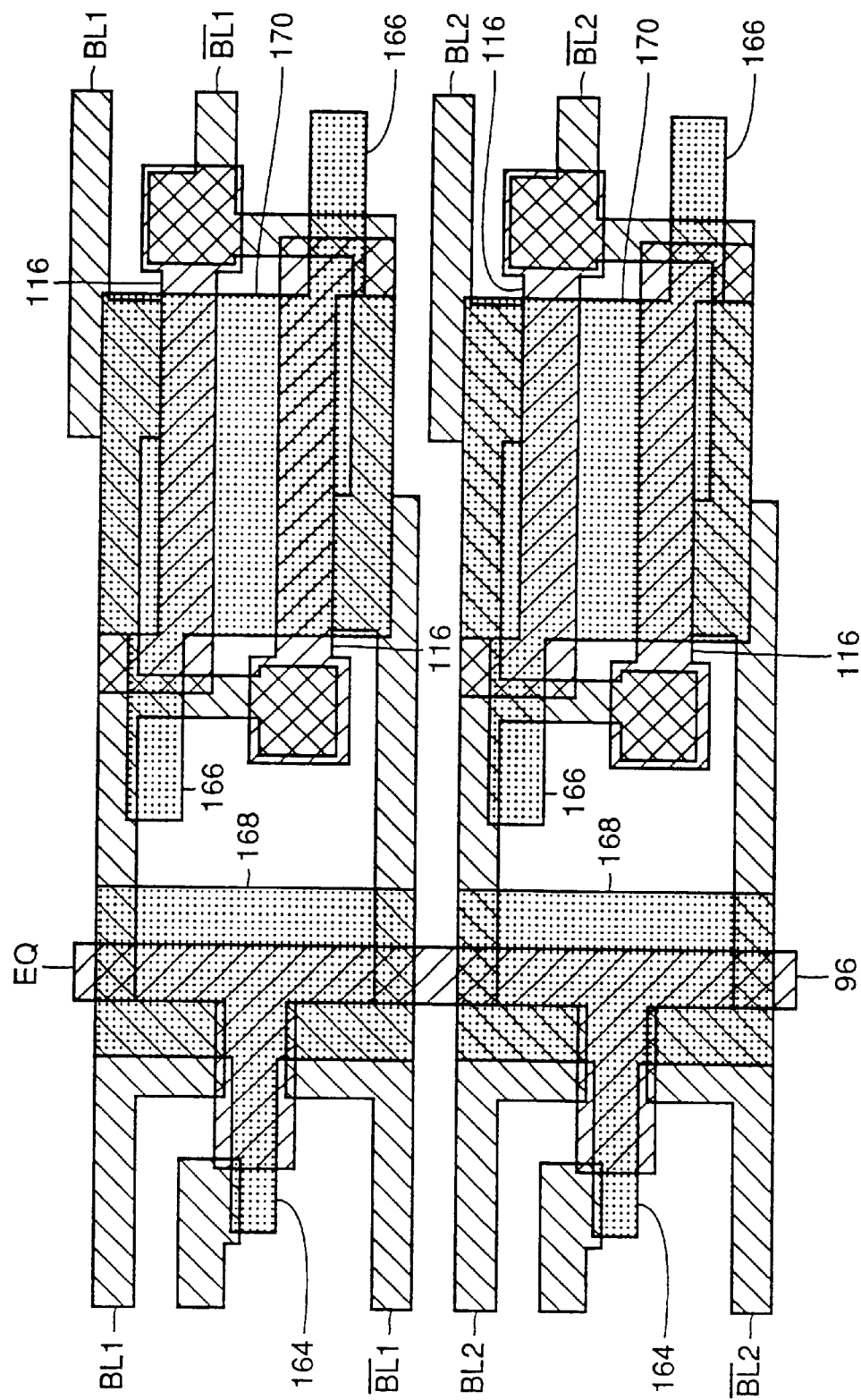
FIG. 18 is a plan showing active regions of transistors in sense amplifiers and their peripheral circuits shown in FIG. 17.

FIG. 17 is a plan showing structures of the N-channel sense amplifiers, precharge transistors and equalize transistors in the DRAM according to the embodiment 7 of the invention. FIG. 18 is a plan showing active regions of transistors shown in FIG. 17.

Referring to FIGS. 17 and 18, N-channel MOS transistors 76 and 78 in N-channel sense amplifier 74 are formed on an active region 170. Gate electrode 116 of transistor 76 is connected to bit line /BL1 or /BL2. Gate electrode 116 of transistor 78 is connected to bit line BL1 or BL2. The body region under gate electrode 116 of transistor 76 protrudes in the bit line direction, and a $p^+$-type contact region 166 is formed at the protruded portion. The body region of transistor 76 is connected to a ground line 160 supplied with ground potential Vss through a contact hole 167 formed on contact region 166. The body region under gate electrode 116 of transistor 78 protrudes in the bit line direction, and $p^+$-type contact region 166 is formed at the protruded portion. The body region of transistor 78 is connected to a ground line 161 supplied with ground potential Vss through a contact hole 167 formed on contact region 166.

Precharge transistor 98 and equalize transistor 100 are formed on active region 168. The body regions of transistors 98 and 100 protrude in the bit line direction, and $p^+$-type contact regions 164 are formed at the protruded portions. The body regions of transistors 98 and 100 are connected to ground line 90 through a contact hole 165 formed on contact region 164.

[Embodiment 8]

Figure 19:
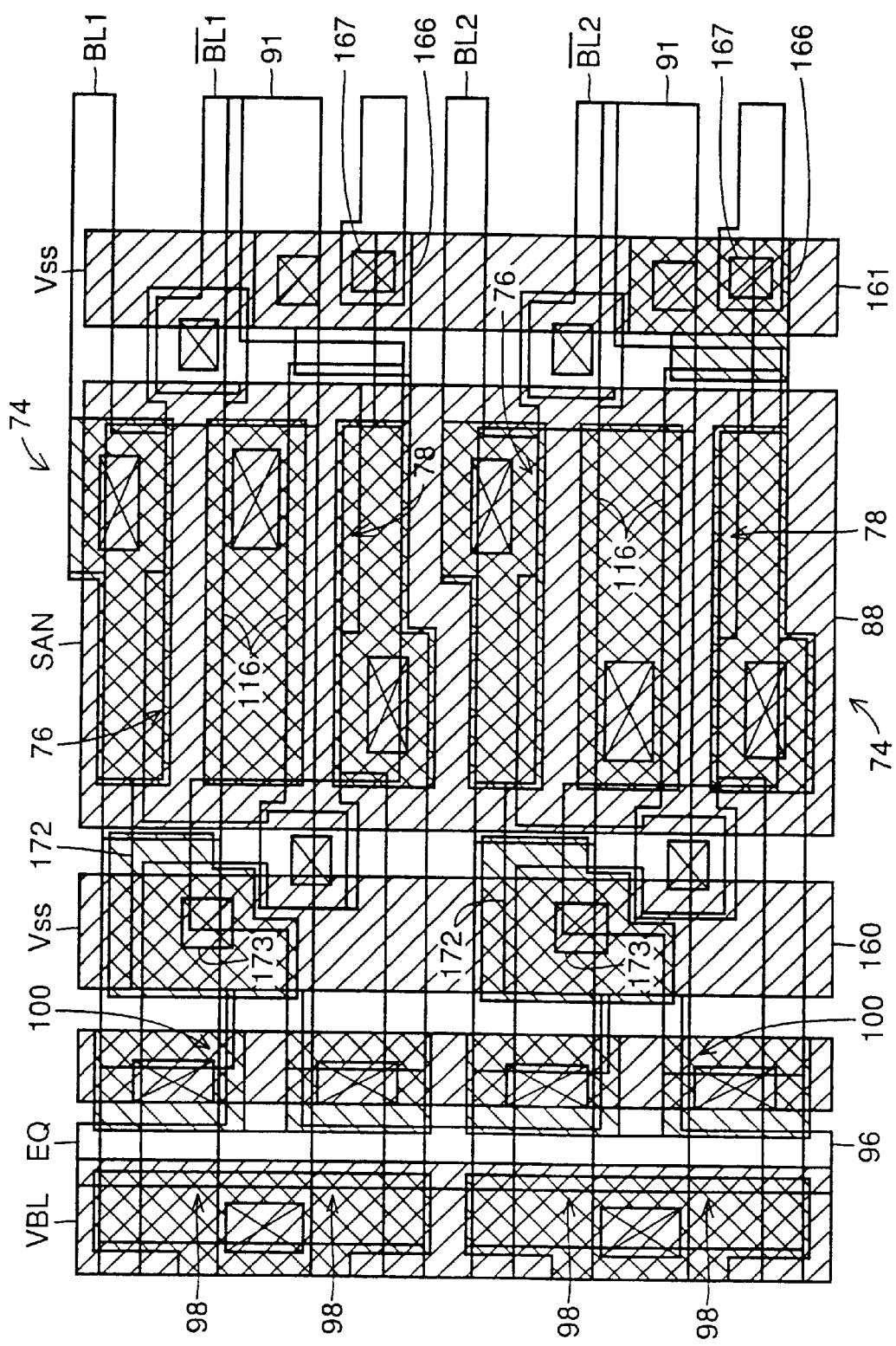
FIG. 19 is a plan fragmentarily showing a structure of a DRAM according to an embodiment 8 of the invention.
Figure 20:
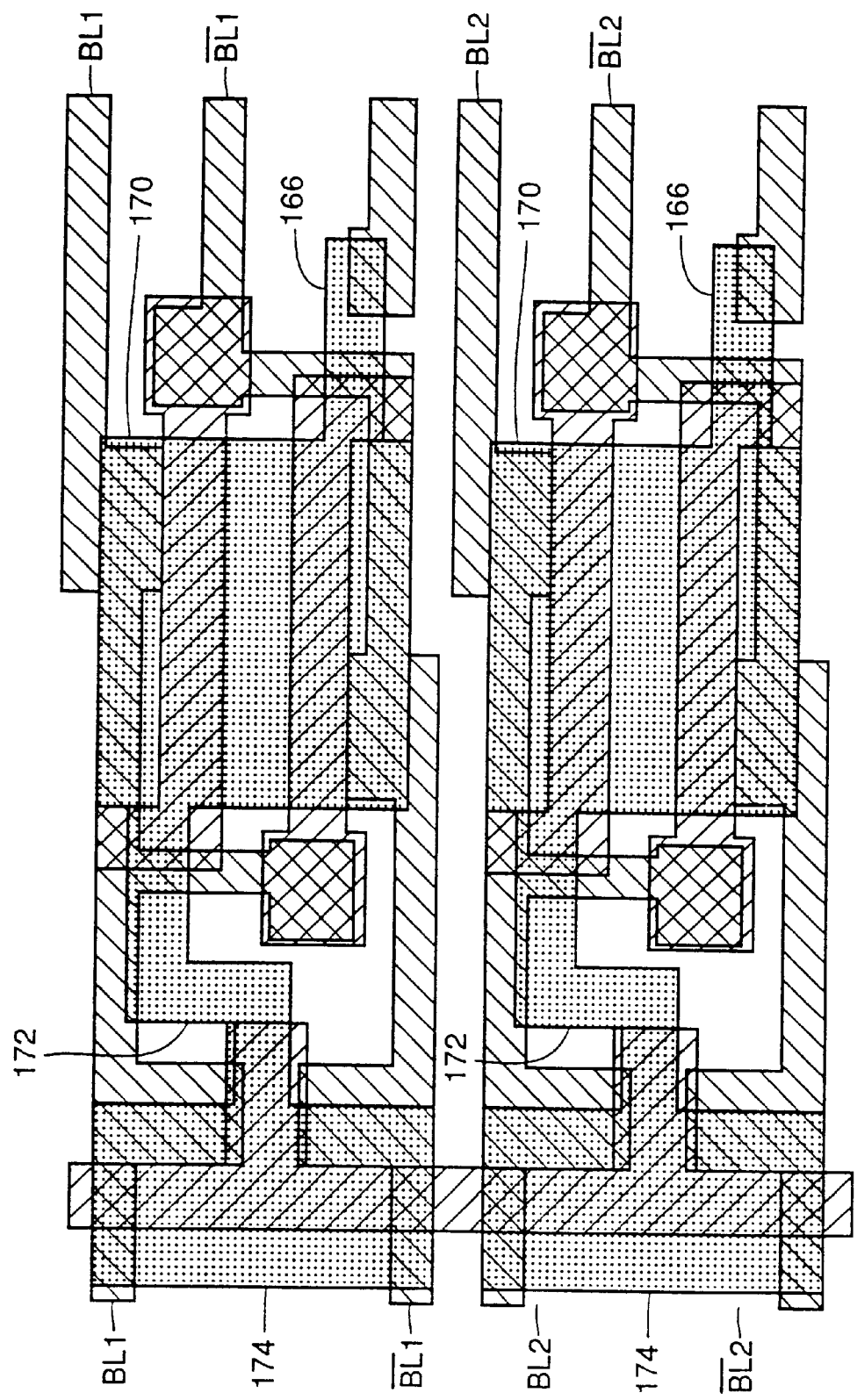
FIG. 20 is a plan showing active regions of transistors in sense amplifiers and their peripheral circuits shown in FIG. 19.

FIG. 19 is a layout diagram showing structures of N-channel sense amplifiers, precharge transistors and equalize transistors in a DRAM according to the embodiment 8 of the invention. FIG. 20 is a layout diagram showing active regions of transistors shown in FIG. 19.

In the embodiment 8 shown in FIGS. 19 and 20, body regions in active regions 174 of precharge transistors and equalize transistors extend toward N-channel sense amplifiers 74 and are coupled with active regions 170. A p$^+$-type contact region 172 is formed at each coupling portion. The body region of transistor 76 in N-channel sense amplifier 74 and the body region of equalize transistor 100 in precharge transistor 98 are connected to ground line 160 through contact hole 173 formed on contact region 172.

According to this embodiment 8, since the body regions of transistors 76 and 78 in N-channel sense amplifiers 74 and the body regions of precharge transistors 98 and equalize transistors 100 are connected to the one body fixing line 160, increase of the layout area can be suppressed.

[Embodiment 9]

Figure 21:
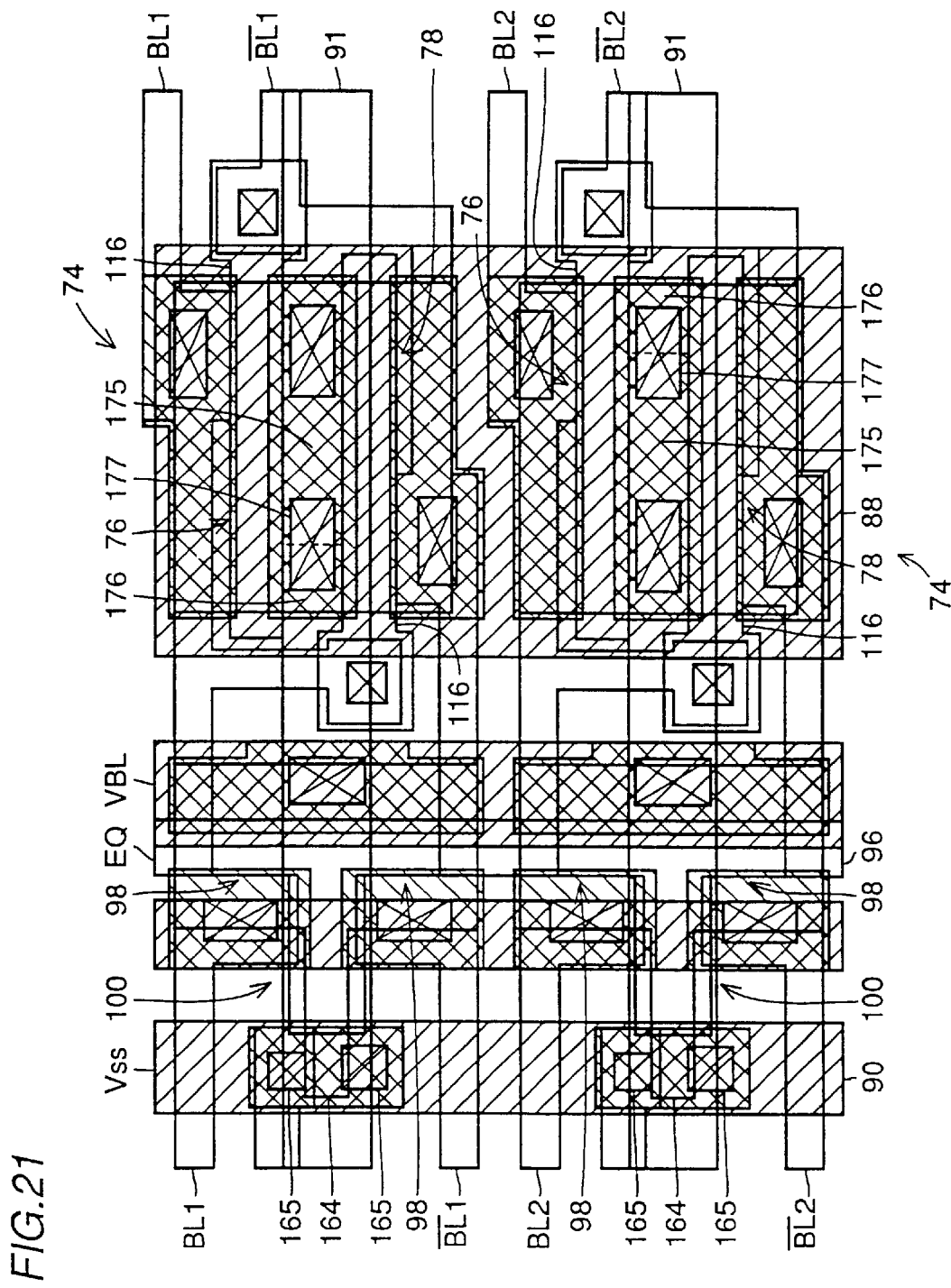
FIG. 21 is a plan fragmentarily showing a structure of a DRAM according to an embodiment 9 of the invention.
Figure 22:
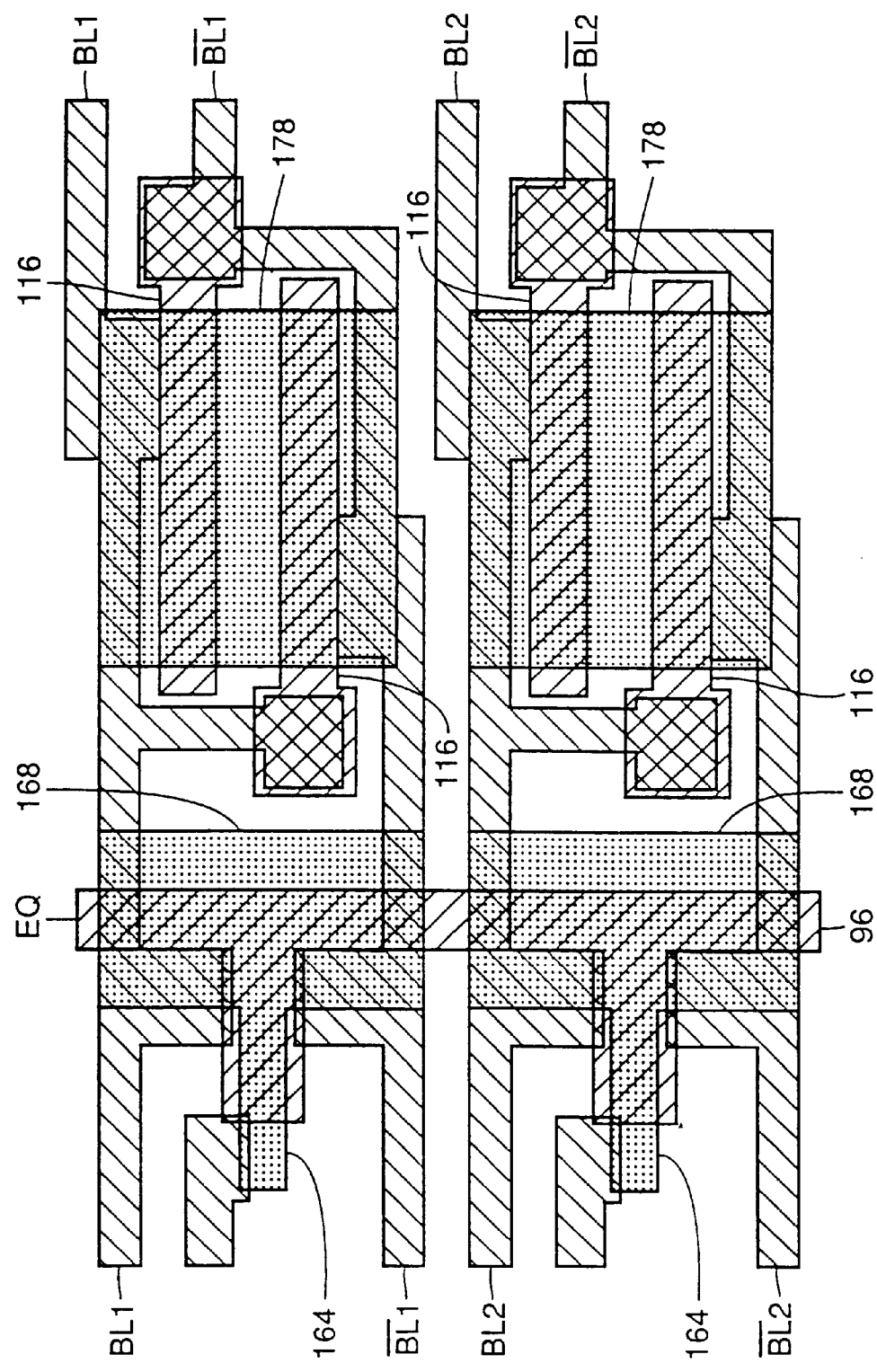
FIG. 22 is a plan showing active regions of transistors in sense amplifiers and their peripheral circuits shown in FIG. 21.

FIG. 21 is a plan showing structures of N-channel sense amplifiers, precharge transistors and equalize transistors in a DRAM according to the embodiment 9 of the invention. FIG. 22 is a plan showing active regions of the transistors shown in FIG. 21.

Referring to FIGS. 21 and 22, the embodiment 9 differs from the structure shown in FIG. 18 in that transistors 76 and 78 in N-channel sense amplifier 74 are formed on an active region 178. A p$^+$-type common region 176 is formed adjacent to source/drain region 175 which are common to transistors 76 and 78. The body regions of transistors 76 and 78 are connected to sense amplifier drive line 88 via a contact hole 177 formed on a boundary -line between a common region 176 and source/drain region 175. This structure does not cause a substrate effect in transistors 76 and 78, so that N-channel sense amplifier 74 can operate fast.

[Embodiment 10]

Figure 23:
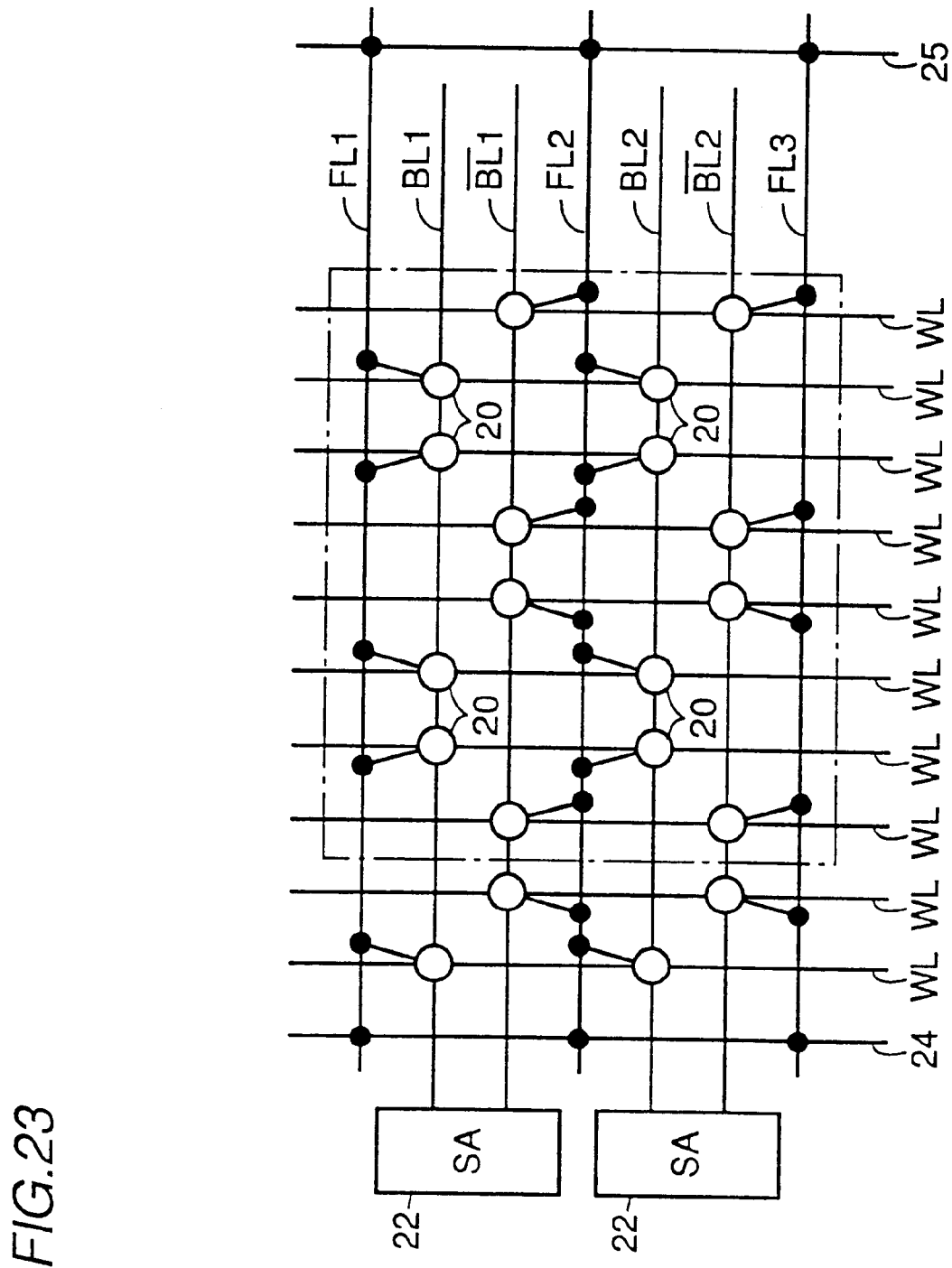
FIG. 23 is block diagram fragmentarily showing a structure of a DRAM according to an embodiment 10 of the invention.

FIG. 23 is a block diagram showing structures of sense amplifiers and memory cells in a DRAM according to the embodiment 10 of the invention. In this embodiment 10 shown in FIG. 23, body region 36 of transfer gate 28 in each memory cell 20 is connected to one of body fixing lines FL1, FL2 and FL3. Thus, body region 36 is connected to one position of the body fixing line.

Figure 24:
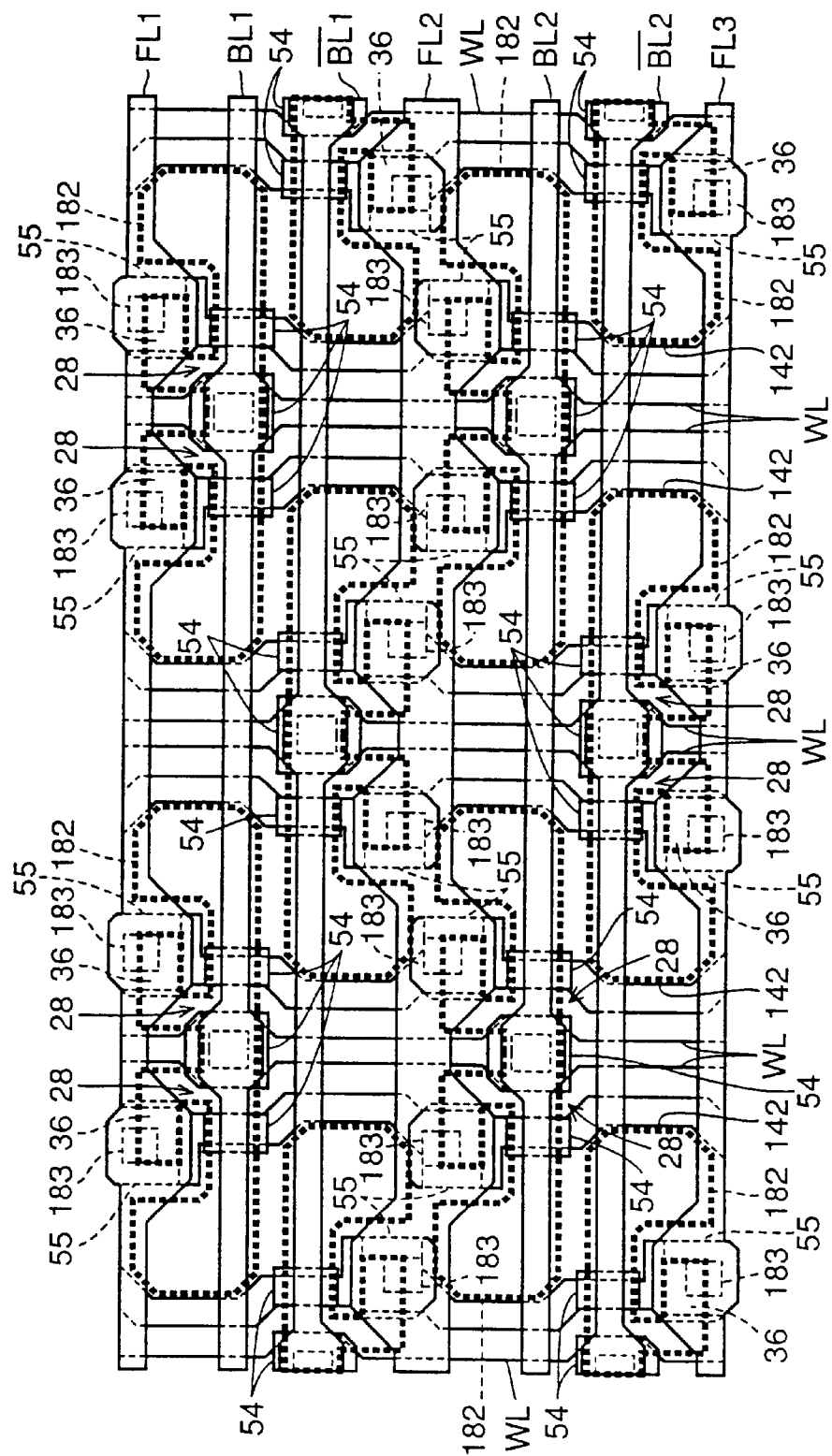
FIG. 24 is a plan showing a specific structure of a portion surrounded by alternate long and short dash line in FIG. 23.

FIG. 24 is a plan showing a specific structure of a portion surrounded by alternate long and short dash line in FIG. 23. Referring to FIG. 24, memory cells 20 are formed on active regions 182. Body regions 36 of transfer gates 28 have protruded portions located under the body fixing lines. The p$^+$-type contact region of each body region 36 is connected to intermediate layer 55 through a contact hole. Body region 36 of each transfer gate 28 is connected to body fixing line FL1, FL2 or FL3 through a contact hole 183 formed on the protruded portion. As described above, body region 36 of transfer gate 28 in one memory cell 20 may be connected to one position of the one body fixing line.

[Embodiment 11]

Figure 25:
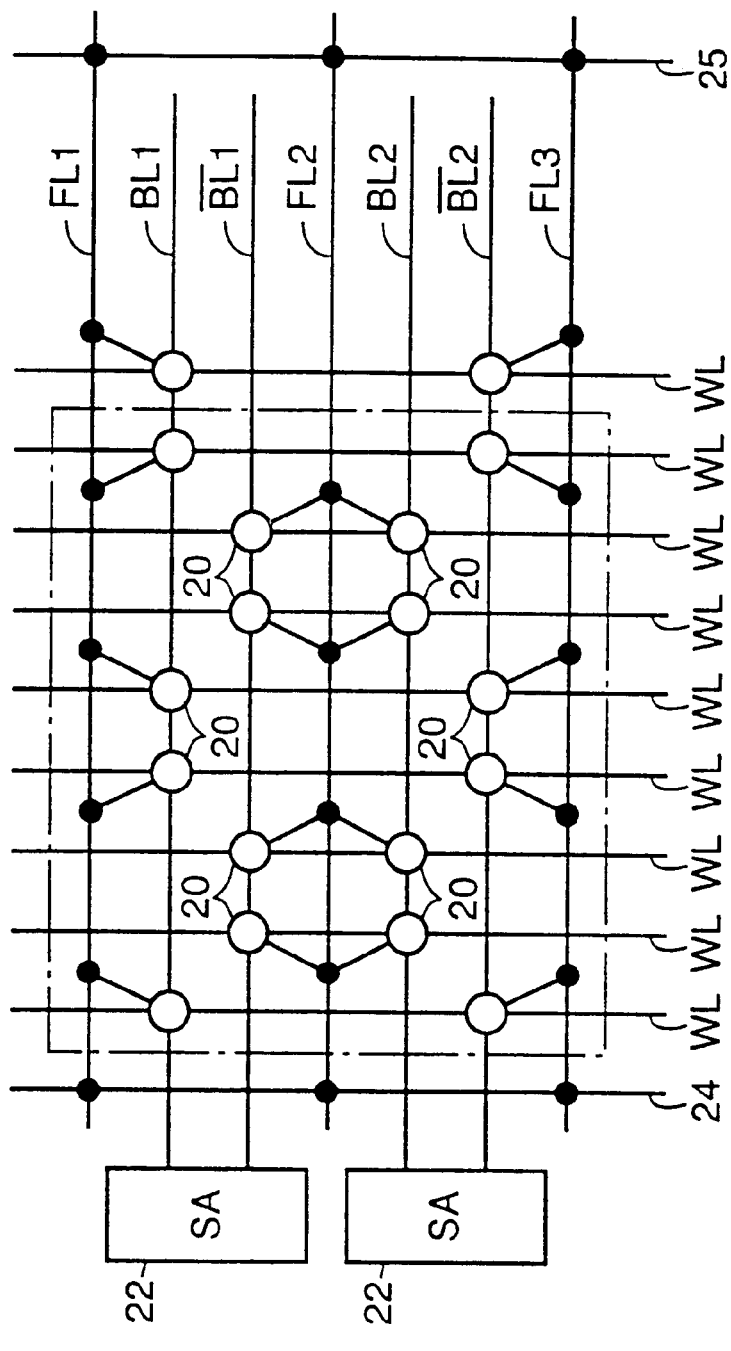
FIG. 25 is a block diagram fragmentarily showing a structure of a DRAM according to an embodiment 11 of the invention.

FIG. 25 is a block diagram showing structures of a memory cell array and sense amplifiers in a DRAM according to the embodiment 11 of the invention. In this embodiment 11 shown in FIG. 25, memory cells 20 connected to each bit line pair are symmetrical to those connected to the adjacent bit line pair. Therefore, memory cells 20 connected to bit line /BL1 neighbors to memory cells 20 connected to bit line BL2. Both body regions 36 of transfer gates 28 in neighboring two memory cells 20 are connected to one position of one of body fixing lines FL1, FL2 and FL3.

Figure 26:
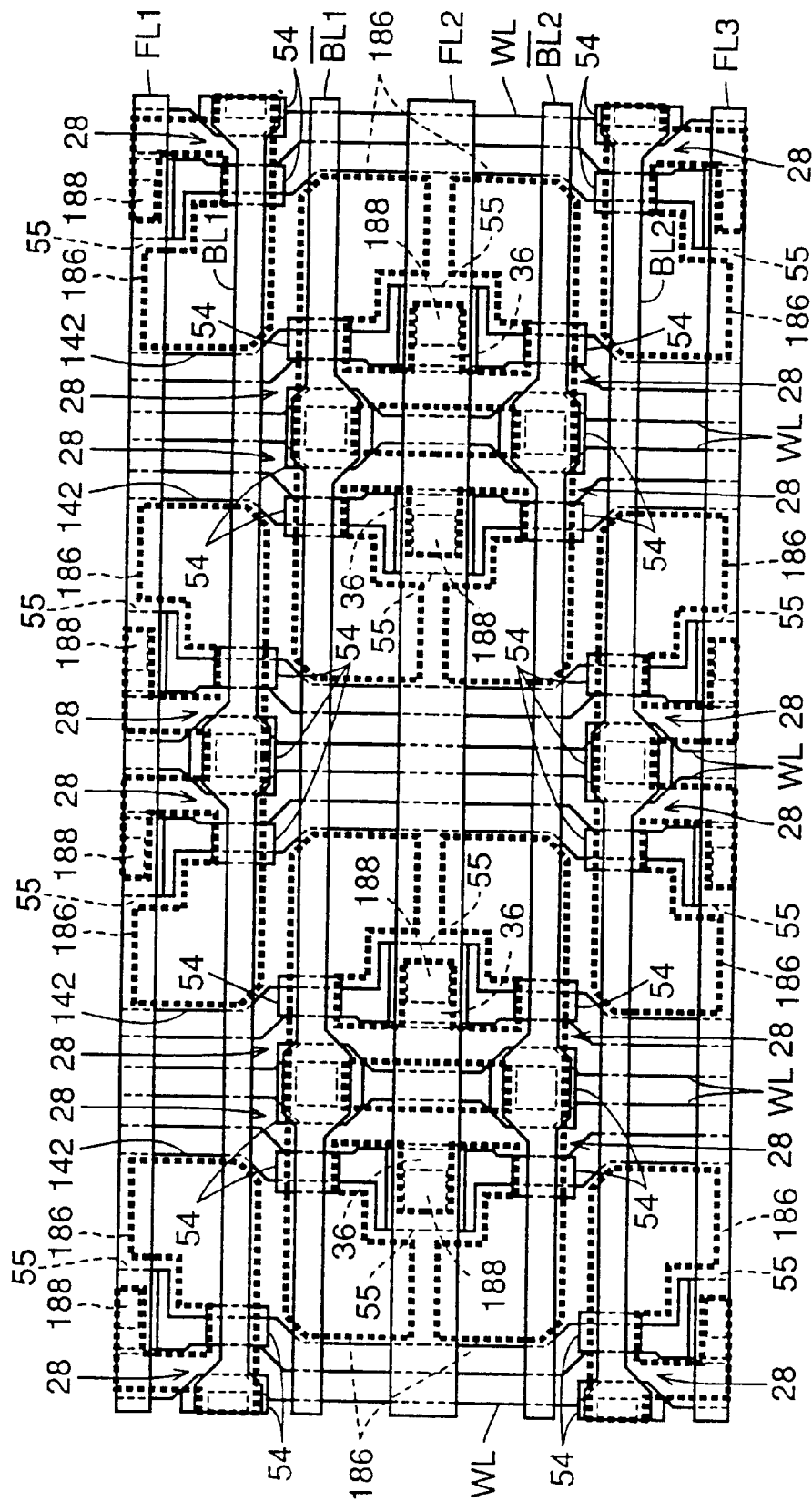
FIG. 26 is a plan showing a specific structure of a portion surrounded by alternate long and short dash line in FIG. 25.

FIG. 26 is a plan showing a specific structure of a portion surrounded by alternate long and short dash line in FIG. 25.

The memory cells employed in this embodiment 11 are of a planar type. In the embodiment 11 shown in FIG. 26, memory cells 20 are formed on active regions 186. Both body regions 36 of transfer gates 28 in adjacent two memory cells 20 have protruded portions located under body fixing line FL1, FL2 or FL3. Body region 36 is connected to body fixing line FL1, FL2 or FL3 through a contact hole formed on the protruded portion.

According to this embodiment 11, since both body regions 36 of transfer gates 28 in adjacent two memory cells 20 are connected to one position of one body fixing line, increase of the layout area is suppressed.

[Embodiment 12]

Figure 27:
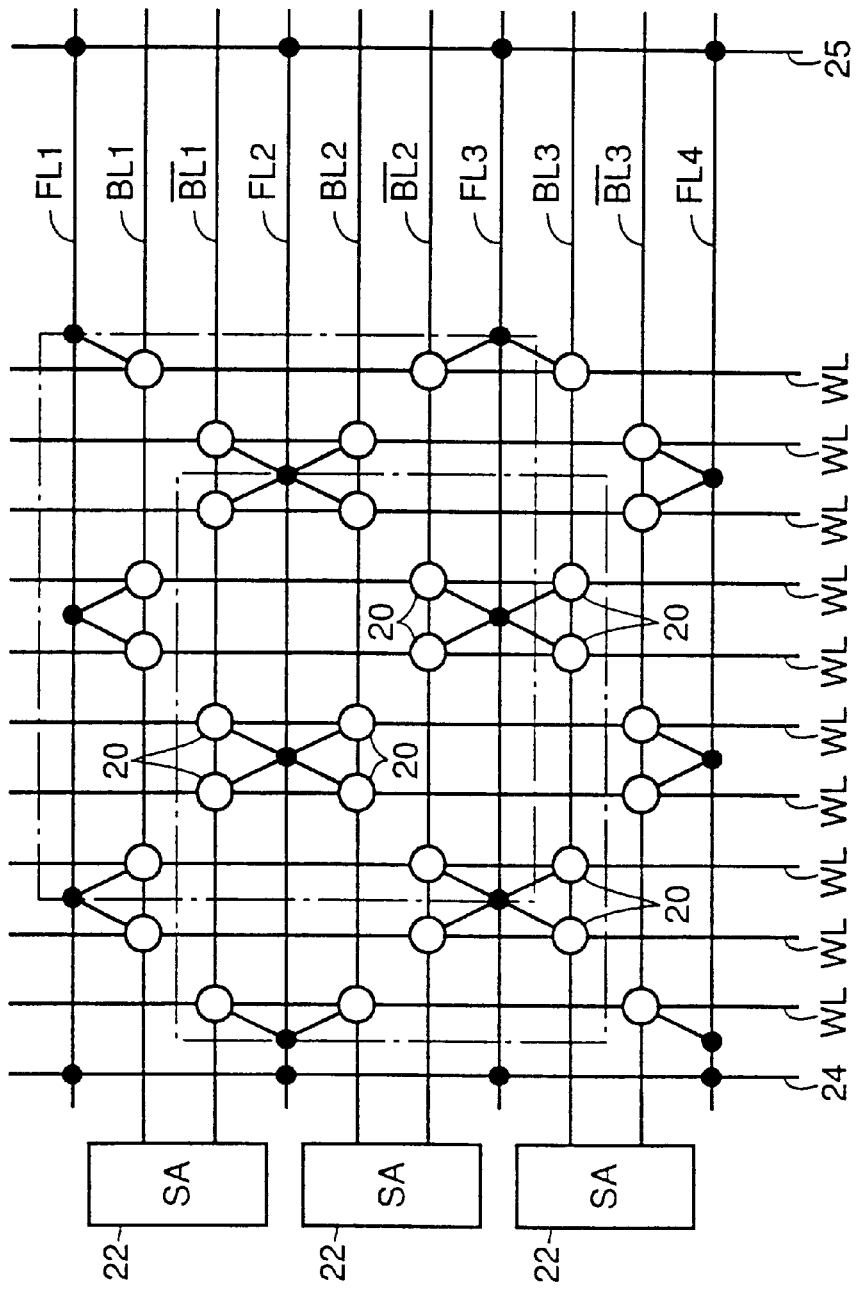
FIG. 27 is a block diagram fragmentarily showing a structure of a DRAM according to an embodiment 12 of the invention.

FIG. 27 is a block diagram showing structures of a memory cell array and sense amplifiers in a DRAM according to the embodiment 12 of the invention. Referring to FIG. 27, the embodiment 12 differs from the structure in FIG. 25 in that body regions of transfer gates 28 in adjacent four memory cells 20 are connected to one position of one of body fixing lines FL1, FL2, FL3 and FL4.

Figure 28:
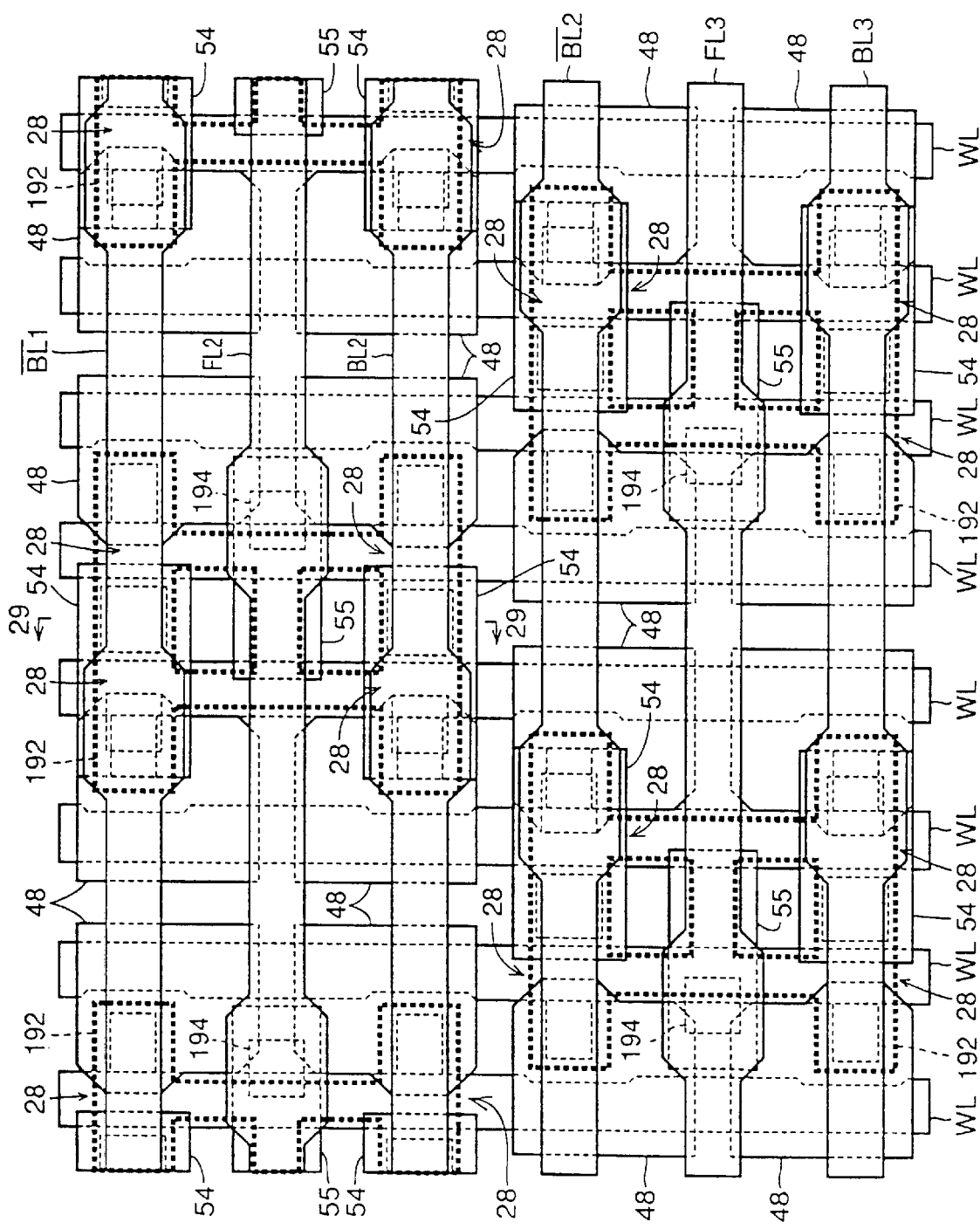
FIG. 28 is a plan showing a specific structure of a portion surrounded by alternate long and short dash line in FIG. 27.
Figure 29:
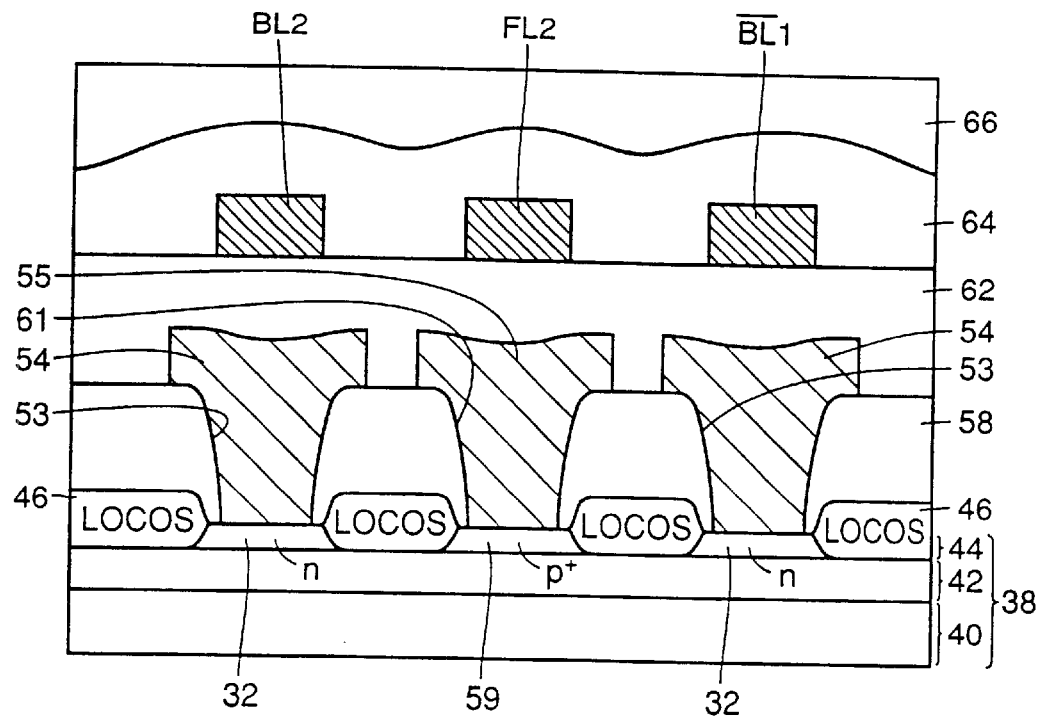
FIG. 29 is a cross section taken along line 29—29 in FIG. 28.

FIG. 28 is a plan showing a specific structure of a portion surrounded by alternate long and short dash line in FIG. 27. FIG. 29 is a cross section taken along line 29—29 in FIG. 28. Referring to FIGS. 28 and 29, memory cells 20 are formed on active regions 192. All body regions 36 of transfer gates 28 in the adjacent four memory cells 20 have protruded portions located under one of body fixing lines FL2 and FL3. The protruded portion of body region 36 is provided with P$^+$-type contact region 59. Contact hole 61 is formed on contact region 59, and intermediate layer 55 is formed thereon. A contact hole 194 is formed on intermediate layer 55. Body region 36 is connected to body fixing line FL2 or FL3 via contact hole 61, intermediate layer 55 and contact hole 194.

According to the embodiment 12, since body regions 36 of transfer gates 28 in four memory cells 20 are connected to one position of one body fixing line, increase of the layout area is suppressed.

[Embodiment 13]

Figure 30:
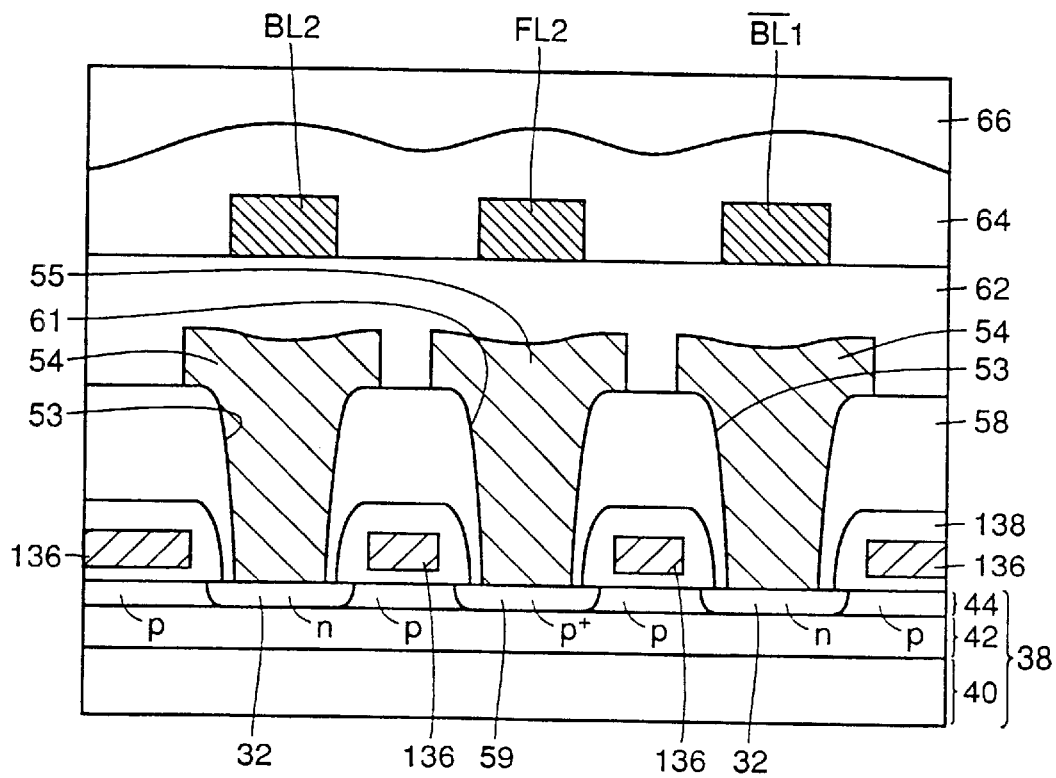
FIG. 30 is a cross section showing a DRAM according to an embodiment 13 of the invention, and particularly showing a structure employing field shield isolation instead of LOCOS isolation in FIG. 29.

FIG. 30 is a cross section of a structure employing field shield isolation instead of LOCOS isolation in FIG. 29. In this embodiment 13, filed shield electrode 136 is formed instead of LOCOS film 46.

[Embodiment 14]

Figure 31:
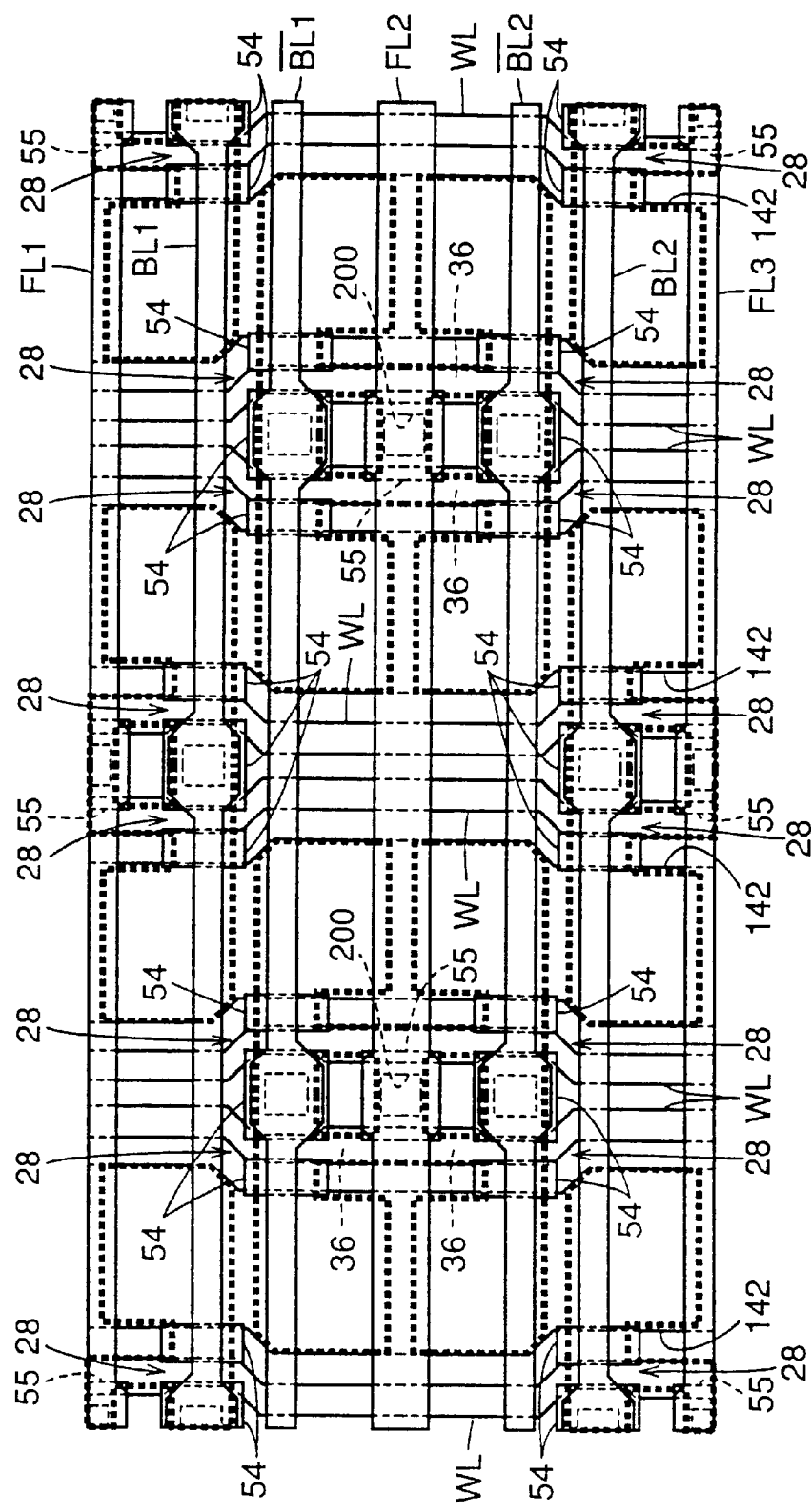
FIG. 31 is a plan showing a DRAM according to an embodiment 14 of the invention, and particularly showing a specific structure of a portion surrounded by alternate long and two short dashes line in FIG. 27.

FIG. 31 is a plan showing planar memory cells, and in particular a specific structure of a portion surrounded by alternate long and two short dashes line in FIG. 27. Referring to FIG. 31, memory cells are formed on active regions 198. All body regions 36 of transfer gates 28 in adjacent four memory cells are connected to one of body fixing lines FL1, FL2 and FL3 through one contact hole 200. The P$^+$-type contact region of body region 36 is connected to intermediate layer 55 through a contact hole.

According to this embodiment 14, since the body regions of transfer gates in the four memory cells are connected to one position of one body fixing line, increase of the layout area is suppressed.

[Embodiment 15]

Figure 32:
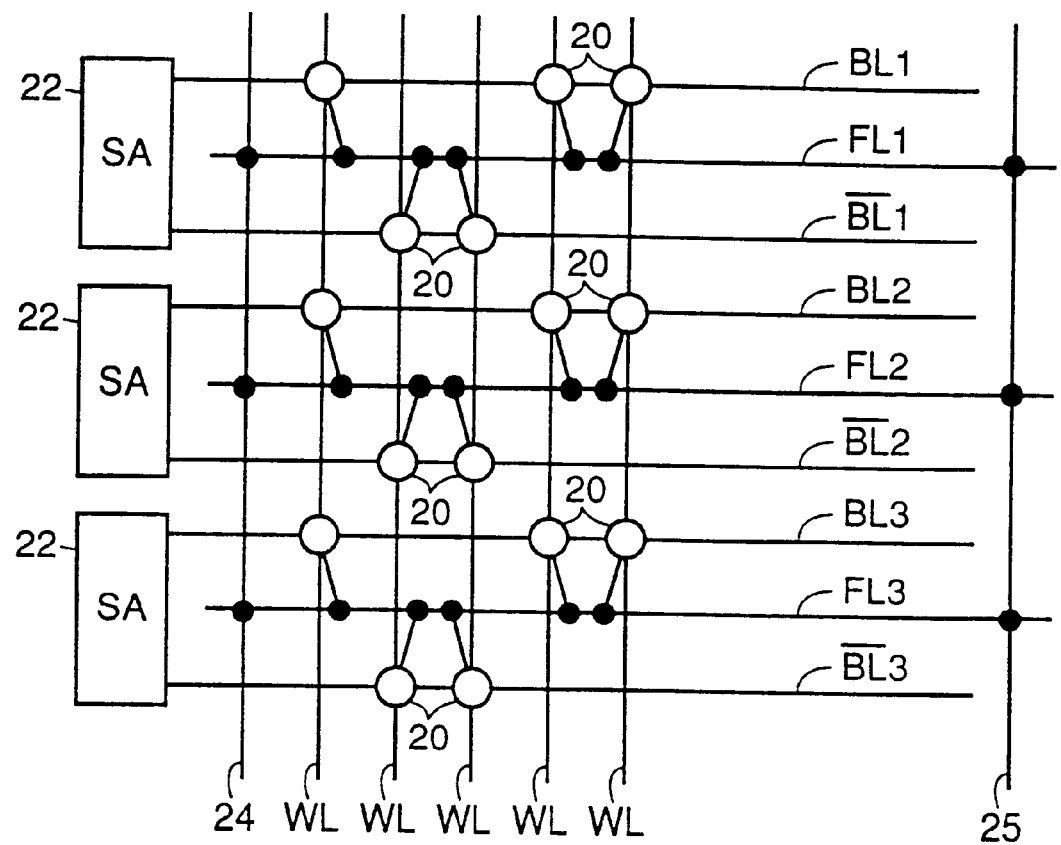
FIG. 32 is a block diagram fragmentarily showing a structure of a DRAM according to an embodiment 15 of the invention.

FIG. 32 is a block diagram showing structures of a memory cell array and sense amplifiers in a DRAM according to the embodiment 15 of the invention. In this embodiment 15 shown in FIG. 32, body fixing lines FL1–FL3 are disposed between paired bit lines BL1 and /BL1–BL3 and /BL3, respectively. These body fixing lines FL1–FL3 are formed at the same interconnection layer as bit line pairs BL1, /BL1–BL3, /BL3. Therefore, bit lines BL1 and /BL1 are shielded by body fixing line FL1. Bit lines BL2 and /BL2 are shielded by body fixing line FL2.

According to this embodiment, since the opposed (i.e., paired) bit lines are shielded by the body fixing line, noises which may be applied from one of the bit lines to the other are reduced. As described above, it is preferable to disposed the body fixing line between the opposed two bit lines, because change of the potential of one bit line is always performed in the direction opposite to that of the other bit line.

More specifically, when data are read for memory cells 20 onto bit lines BL1–BL3, bit lines /BL1 and /BL2 forming reference of sense amplifiers 22 receive noises due to capacity coupling only from bit lines BL2 and BL3 at one side, and do not receive noises from bit lines BL1 and BL2 at the other side, respectively. Therefore, in the structure not provided with a shield line shown in FIG. 7, such a worst situation can be avoided that the bit line for reference receives noises due to capacity coupling from the bit lines at opposite sides.

Figure 33:
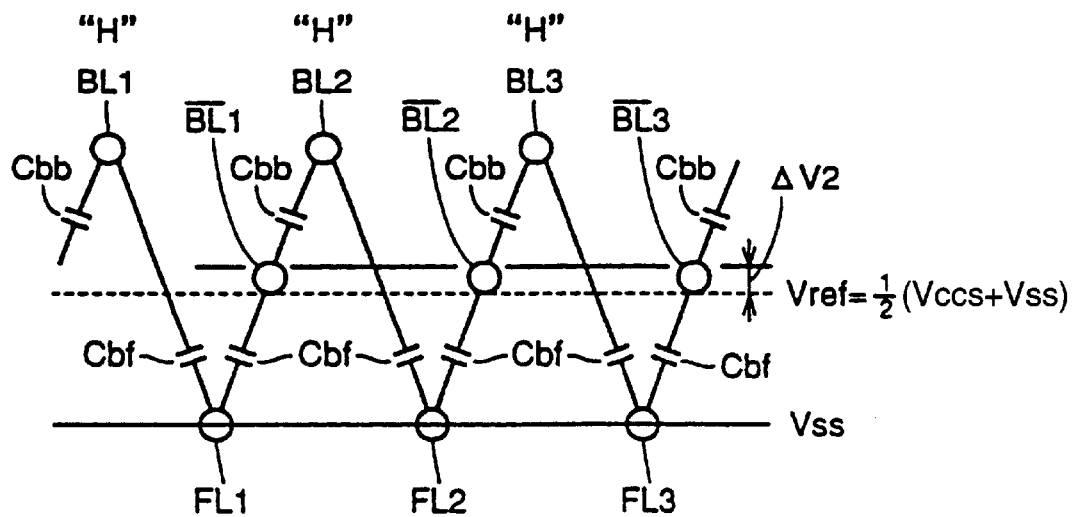
FIG. 33 shows capacity coupling between bit lines in the DRAM shown in FIG. 32.

FIG. 33 is a diagram showing a DRAM having a folded bit line structure of a half pitch shown in FIG. 32, and in particular showing capacity coupling between bit lines in a structure employing body fixing lines as shield lines. Referring to FIG. 33, when all potentials of bit lines BL1–BL3 attain H-level, the potentials of bit lines /BL1–/BL3 rise, because bit lines /BL1 and /BL2 are coupled to bit lines BL2 and BL3 via inter-bit-line capacities Cbb, respectively. However, the potentials of bit lines /BL1–/BL3 rise only ΔV2 smaller than ΔV1 due to capacity division, because bit lines /BL1–/BL3 are coupled to body fixing lines FL1–FL3 via capacities Cbf, respectively. Therefore, noise interface between bit lines in the read operation is suppressed.

[Embodiment 16]

Figure 34:
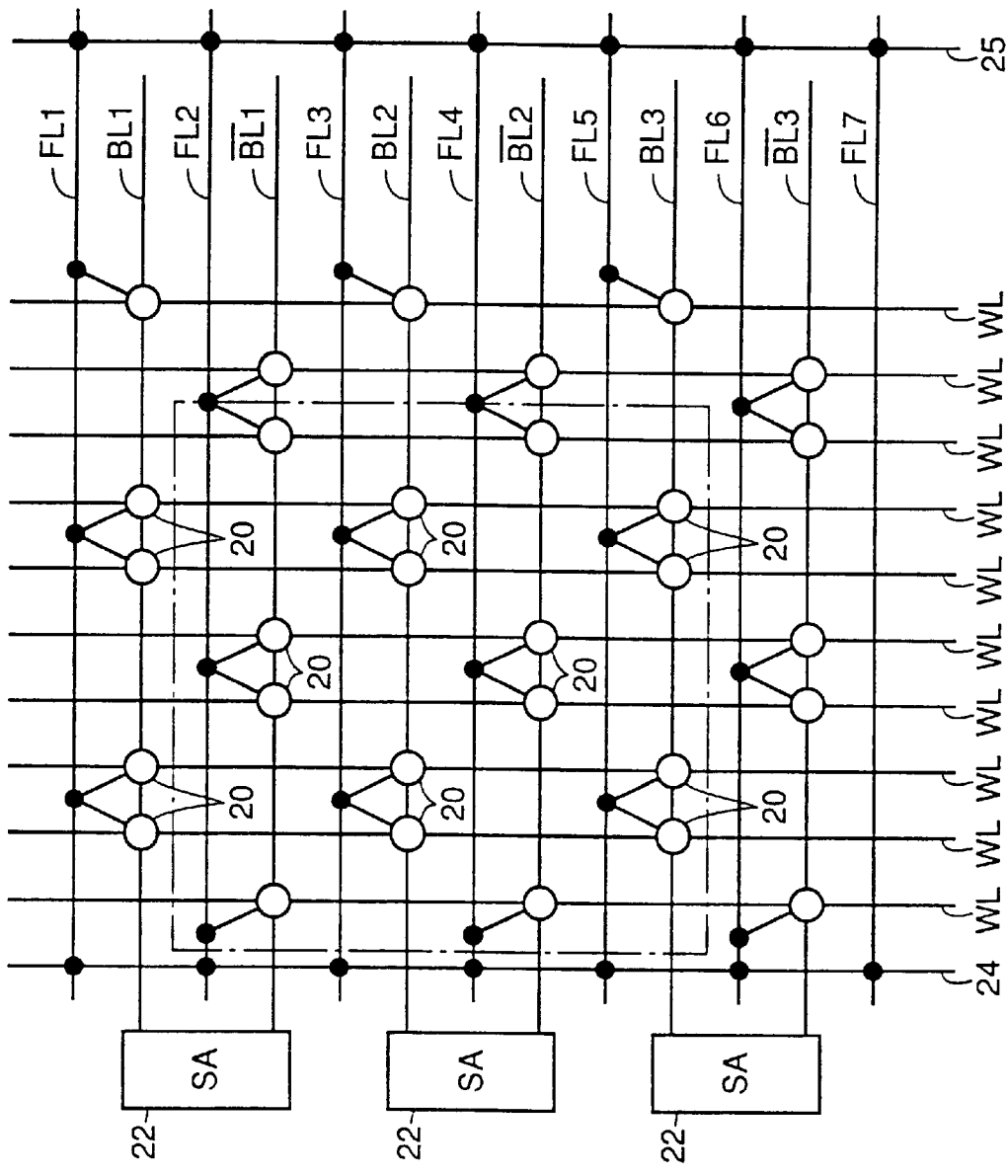
FIG. 34 is a block diagram fragmentarily showing a structure of a DRAM according to an embodiment 16 of the invention.

FIG. 34 is a block diagram showing structures of a memory cell array and sense amplifiers in a DRAM according to the embodiment 16 of the invention. Referring to FIG. 34, the embodiment 16 includes body fixing lines FL1–FL7 disposed between all bit lines. Thus, body fixing line FL2 is disposed between bit lines BL1 and /BL1. Body fixing line FL3 is disposed between bit lines /BL1 and BL2. Body fixing line FL4 is disposed between bit lines BL2 and IBL2. Body fixing line FL5 is disposed between bit lines /BL2 and BL3. Body fixing line FL6 is disposed between bit lines BL3 and /BL3.

Figure 35:
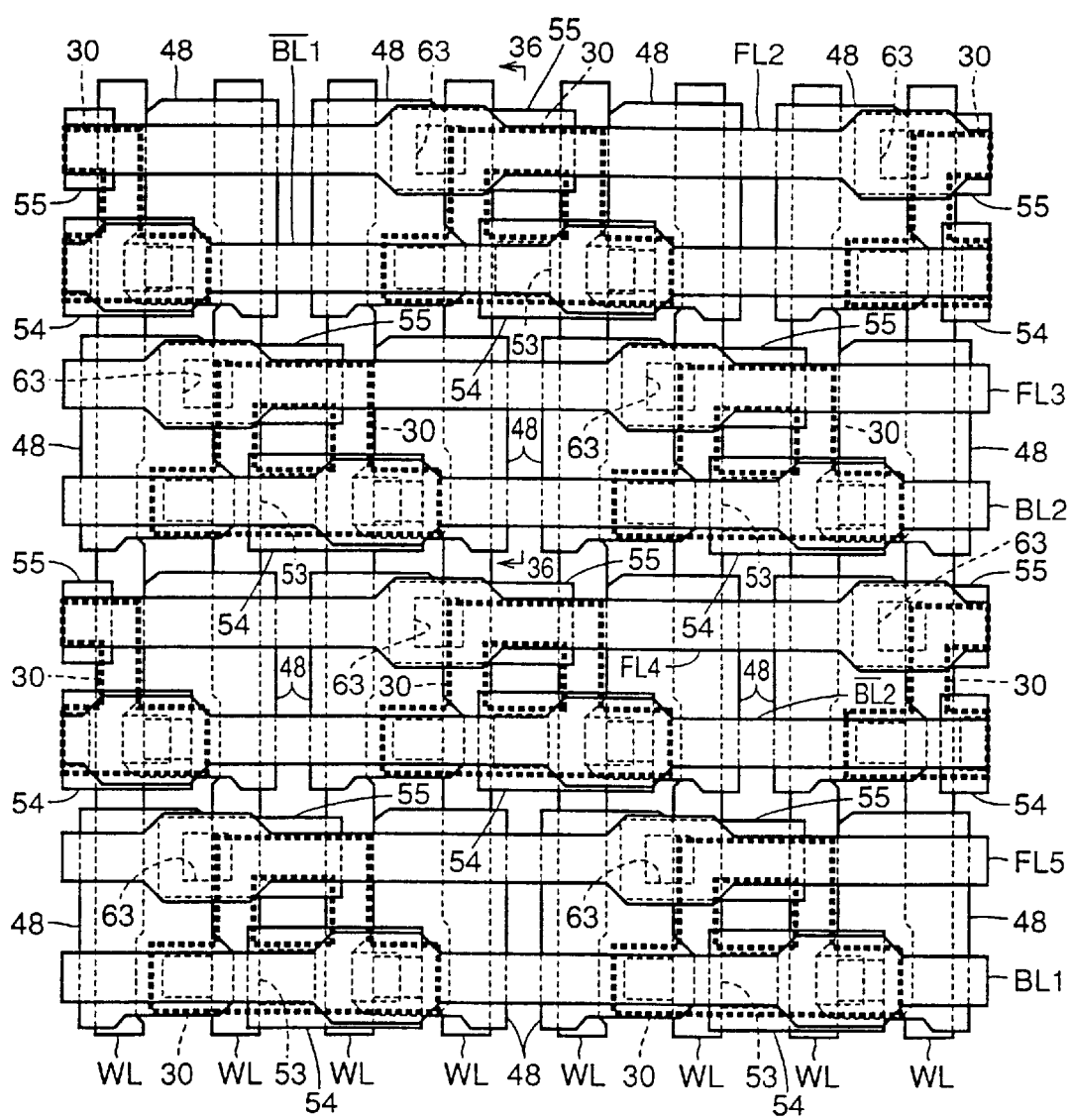
FIG. 35 is a plan showing a specific structure of a portion surrounded by alternate long and short dash line in FIG. 34.
Figure 36:
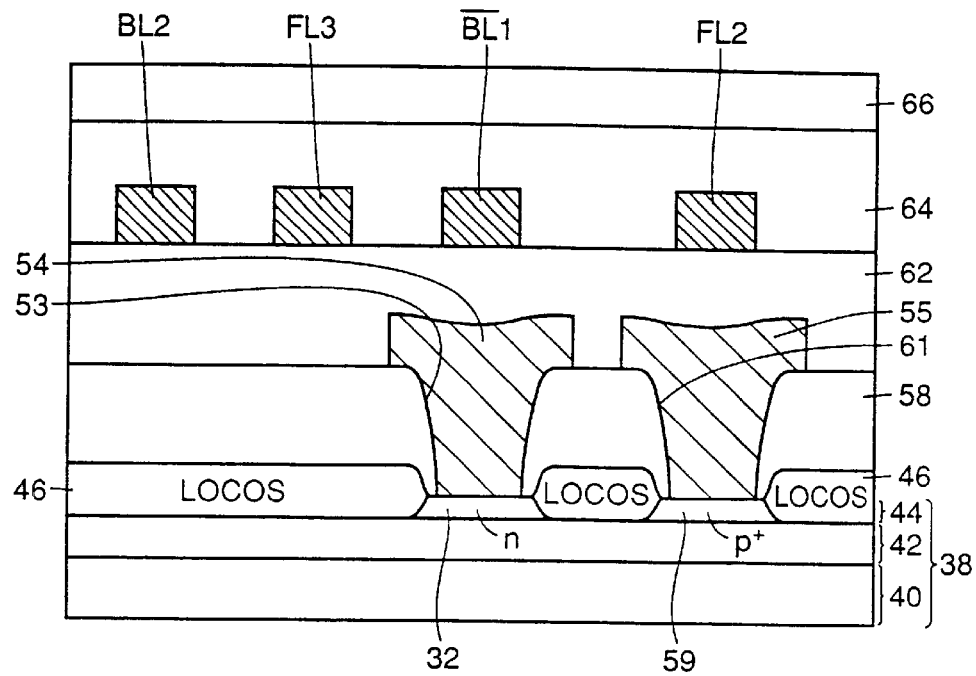
FIG. 36 is a cross section taken along line 36—36 in FIG. 35.

FIG. 35 is a plan showing a specific structure of a portion surrounded by alternate long and short dash line in FIG. 34. FIG. 36 is a cross section taken along line 36—36 in FIG. 35. Referring to FIGS. 35 and 36, body fixing lines FL2–FL5 are formed at the same interconnection layer as bit line pairs BL1, /BL1–BL3, /BL3. Thus, bit lines /BL1 and /BL2 as well as body fixing lines FL2 and FL3 are formed on interlayer insulating film 62.

Body regions 36 of transfer gates 28 of neighboring memory cells 20 are common to each other. These body regions 36 are connected to body fixing lines FL2–FL5 via contact regions 59, contact holes 61, intermediate layers 55 and contact holes 63.

According to this embodiment 16, the body fixing lines are disposed not only between bit line pairs but also between bit lines in respective pairs, so that it is possible not only to reduce noises applied from one bit line in a bit line pair to another bit line pair but also to reduce noises applied from a bit line to the opposite bit line in the same pair. Further, body fixing lines are formed at the same interconnection layer as the bit line pairs, so that such noises are further reduced.

[Embodiment 17]

Figure 37:
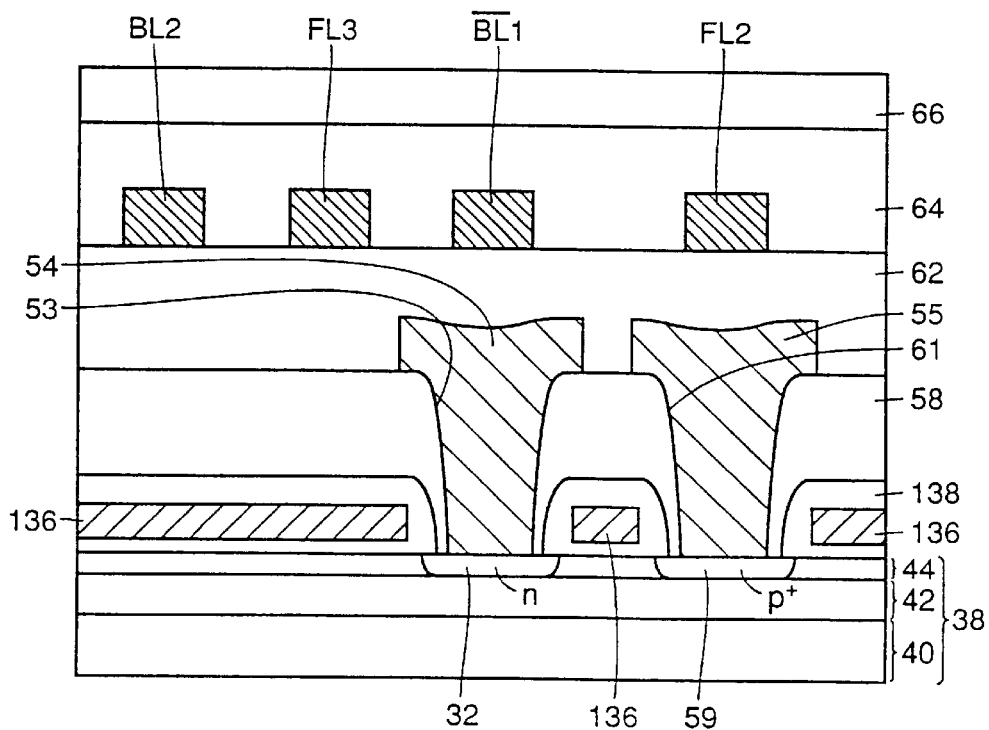
FIG. 37 is a cross section showing a DRAM according to an embodiment 17 of the invention, and particularly showing a structure employing field shield isolation instead of LOCOS isolation in FIG. 36.

FIG. 37 is a cross section showing a structure employing field shield isolation instead of LOCOS isolation in FIG. 36.

In this embodiment 17, field shield electrodes 136 are formed on SOI substrate 38. Field shield electrodes 136 are formed in interlayer insulating film 138.

[Embodiment 18]

Figure 38:
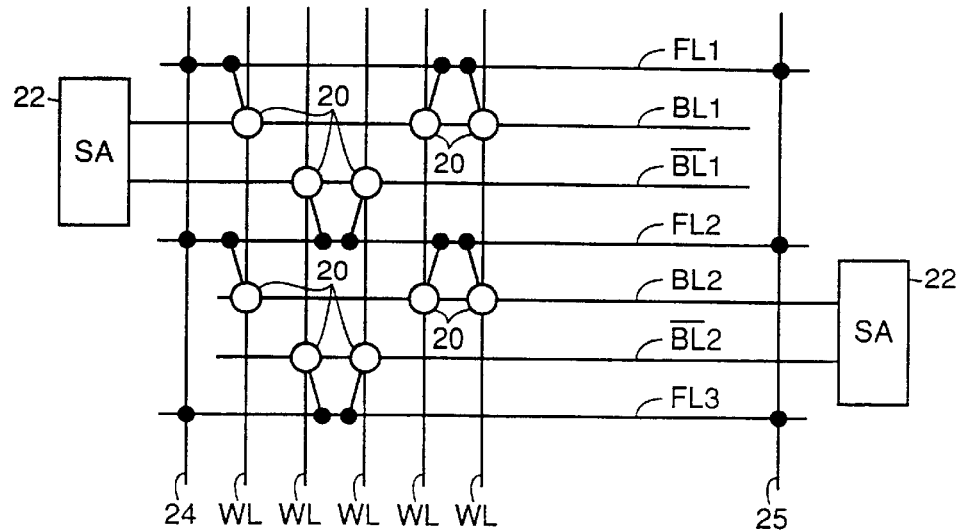
FIGS. 38 to 43 are block diagrams fragmentarily showing structures of DRAMs according to embodiments 18 to 23 of the invention, respectively.

FIG. 38 is a block diagram showing structures of a memory cell array and sense amplifiers in a DRAM according to the embodiment 18 of the invention. Referring to FIG. 38, the embodiment 18 differs from the structure in FIG. 23 in that sense amplifiers 22 are disposed alternately. More specifically, sense amplifier 22 connected to bit line pair BL1 and /BL1 is disposed on the left side in the figure with respect to bit line pair BL1 and /BL1, and sense amplifier 22 connected to bit line pair BL2 and /BL2 is disposed on the right side in the figure with respect to bit line pair BL2 and /BL2.

According to the embodiment 18, since sense amplifiers are disposed alternately, the pitch of arrangement of sense amplifiers is not equal to that of bit lines, but can be double. Therefore, a sufficient channel width can be ensured even under strict design rules, and the sense amplifiers can be disposed efficiently without increasing additional interconnections.

[Embodiment 19]

Figure 39:
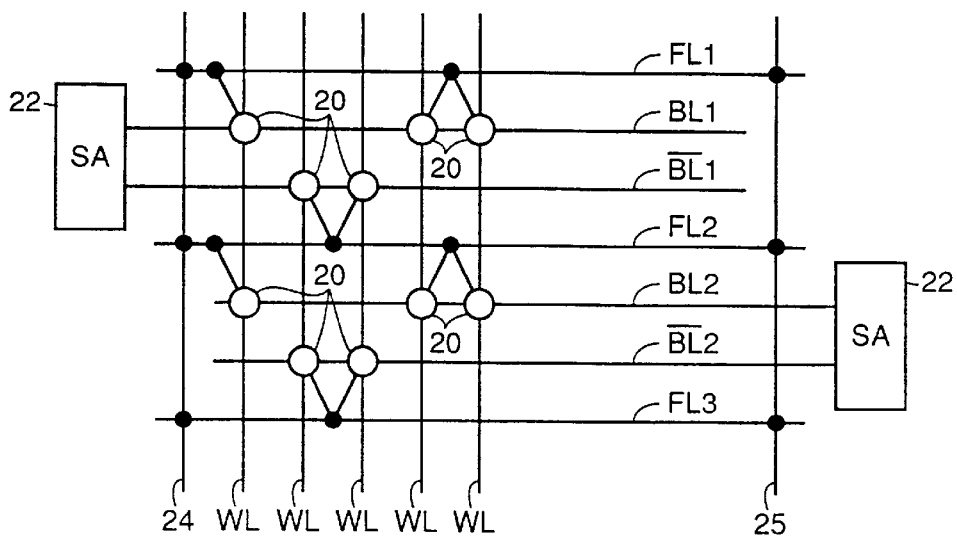

FIG. 39 is a block diagram showing structures of a memory cell array and sense amplifiers in a DRAM according to the embodiment 19 of the invention. Referring to FIG. 39, the embodiment 19 differs from the structure in FIG. 3 in that sense amplifiers 22 are disposed alternately. Further, it differs from the structure in FIG. 38 in that the body regions of transfer gates in adjacent two memory cells 20 are connected to one position of one of body fixing lines FL1, FL2 and FL3.

In this embodiment, since sense amplifiers are disposed alternately, the pitch of arrangement of sense amplifiers is not equal to that of bit lines, but can be double. Therefore, a sufficient channel width can be ensured even under strict design rules, and the sense amplifiers can be disposed efficiently without increasing additional interconnections. Since the body regions of transfer gates in the adjacent two memory cells are connected to one position of one body fixing line, the layout area can be smaller than that in the embodiment 18.

[Embodiment 20]

Figure 40:
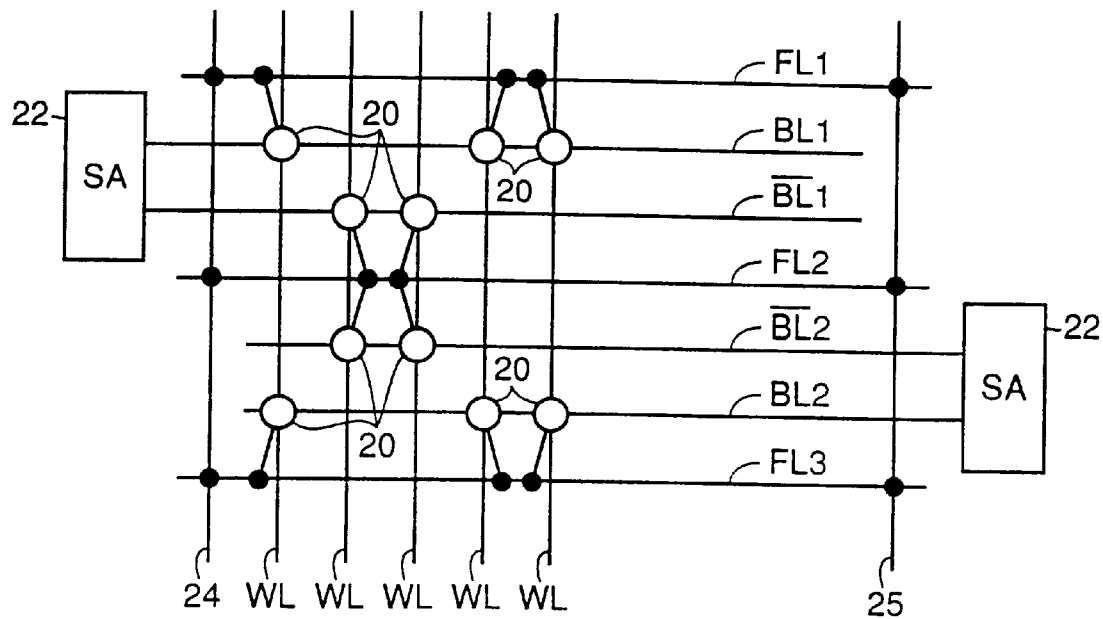

FIG. 40 is a block diagram showing structures of a memory cell array and sense amplifiers in a DRAM according to the embodiment 20 of the invention. Referring to FIG. 40, the embodiment 20 differs from the structure in FIG. 25 in that sense amplifiers 22 are disposed alternately. Further, it differs from the structure in FIG. 38 in that memory cells 20 connected to bit lines BL2 and /BL2 are disposed symmetrically to memory cells 20 connected to bit lines BL1 and /BL1, and the body regions of transfer gates in adjacent two memory cells 20 are connected to one position of one body fixing line.

In this embodiment 20, since sense amplifiers 22 are disposed alternately, the pitch of arrangement of the sense amplifiers is not equal to that of bit lines, but can be double. Therefore, a sufficient channel width can be ensured even under strict design rules, and the sense amplifiers can be disposed efficiently without increasing additional interconnections. Since the body regions of transfer gates in adjacent two memory cells 20 are connected to one position of one body fixing line, the layout area can be smaller than that in the embodiment 18 shown in FIG. 38.

[Embodiment 21]

Figure 41:
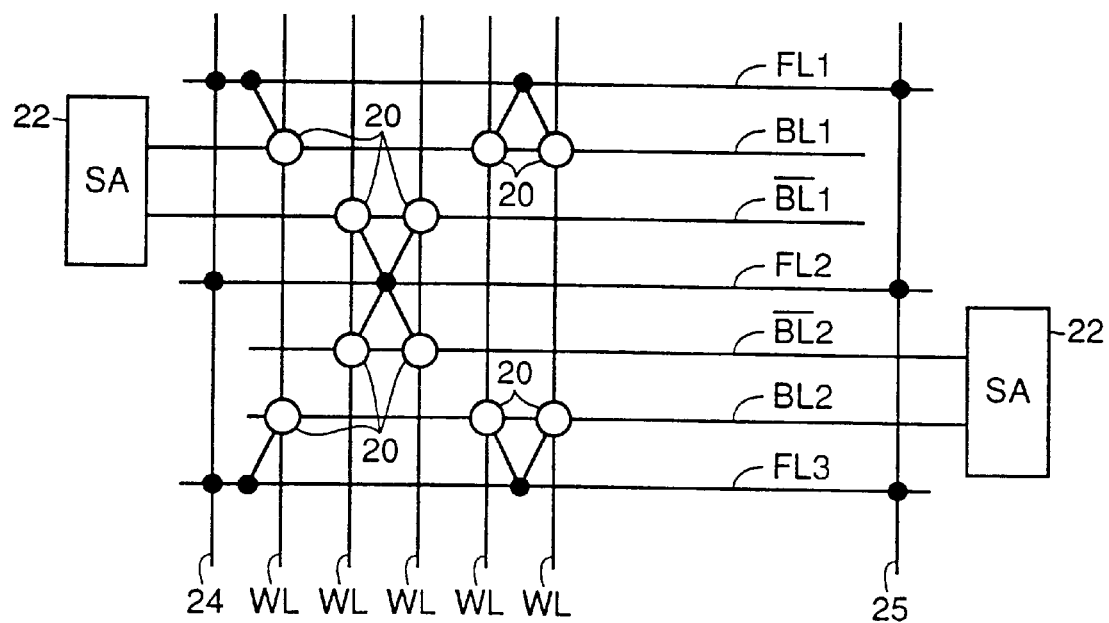

FIG. 41 is a block diagram showing structures of a memory cell array and sense amplifiers in a DRAM according to the embodiment 21 of the invention. Referring to FIG. 41, the embodiment 21 differs from the structure in FIG. 27 in that sense amplifiers 22 are disposed alternately. Further, it differs from the structure in FIG. 40 in that the body regions of transfer gates in adjacent four memory cells 20 are connected to one position of one body fixing line. In this embodiment 21, since sense amplifiers 22 are disposed alternately, the pitch of arrangement of the sense amplifiers is not equal to that of bit lines, but can be double. Therefore, a sufficient channel width can be ensured even under strict design rules, and the sense amplifiers can be disposed efficiently without increasing additional interconnections. Since the body regions of transfer gates in adjacent four memory cells 20 are connected to one position of one body fixing line, the layout area can be smaller than that in the embodiment 20 shown in FIG. 40.

[Embodiment 22]

Figure 42:
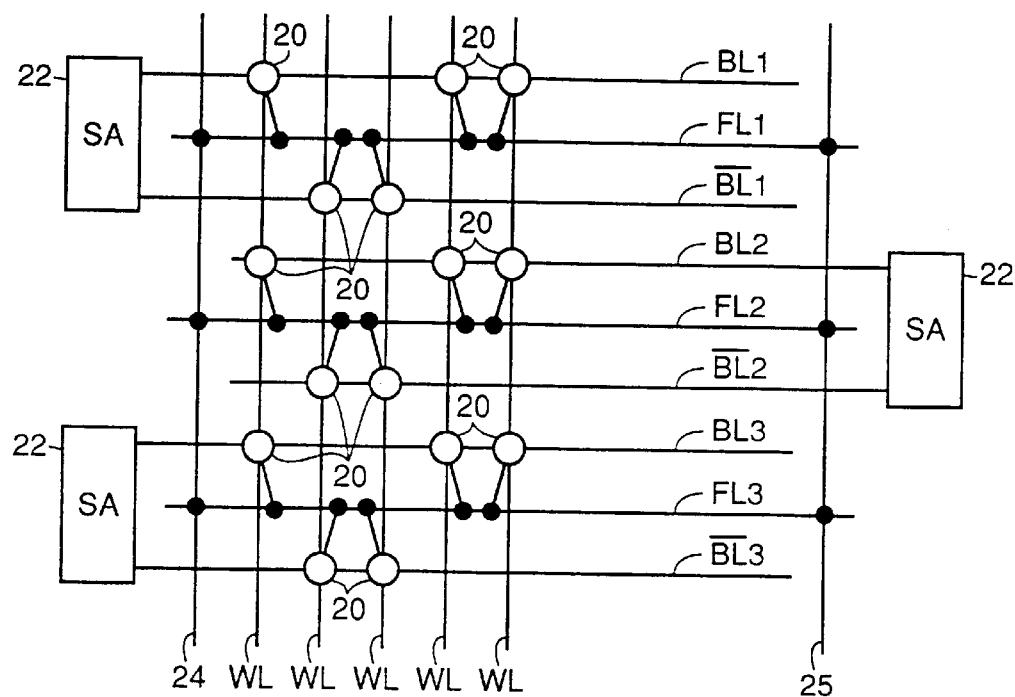

FIG. 42 is a block diagram showing structures of a memory cell array and sense amplifiers in a DRAM according to the embodiment 22 of the invention. Referring to FIG. 42, the embodiment 22 differs from the structure in FIG. 32 in that sense amplifiers 22 are disposed alternately. Further, it differs from the structure in FIG. 38 in that body fixing lines FL1–FL3 are disposed between paired bit lines BL1 and /BL1–BL3 and /BL3, respectively.

In this embodiment 22, since sense amplifiers 22 are disposed alternately, the pitch of arrangement of the sense amplifiers is not equal to that of bit lines, but can be double. Therefore, a sufficient channel width can be ensured even under strict design rules, and the sense amplifiers can be disposed efficiently without increasing additional interconnections. Since the body fixing lines are disposed between paired bit lines BL1 and /BL1–BL3 and /BL3, respectively, it is possible to suppress the influence by noises generated between bit lines in the read operation.

[Embodiment 23]

Figure 43:
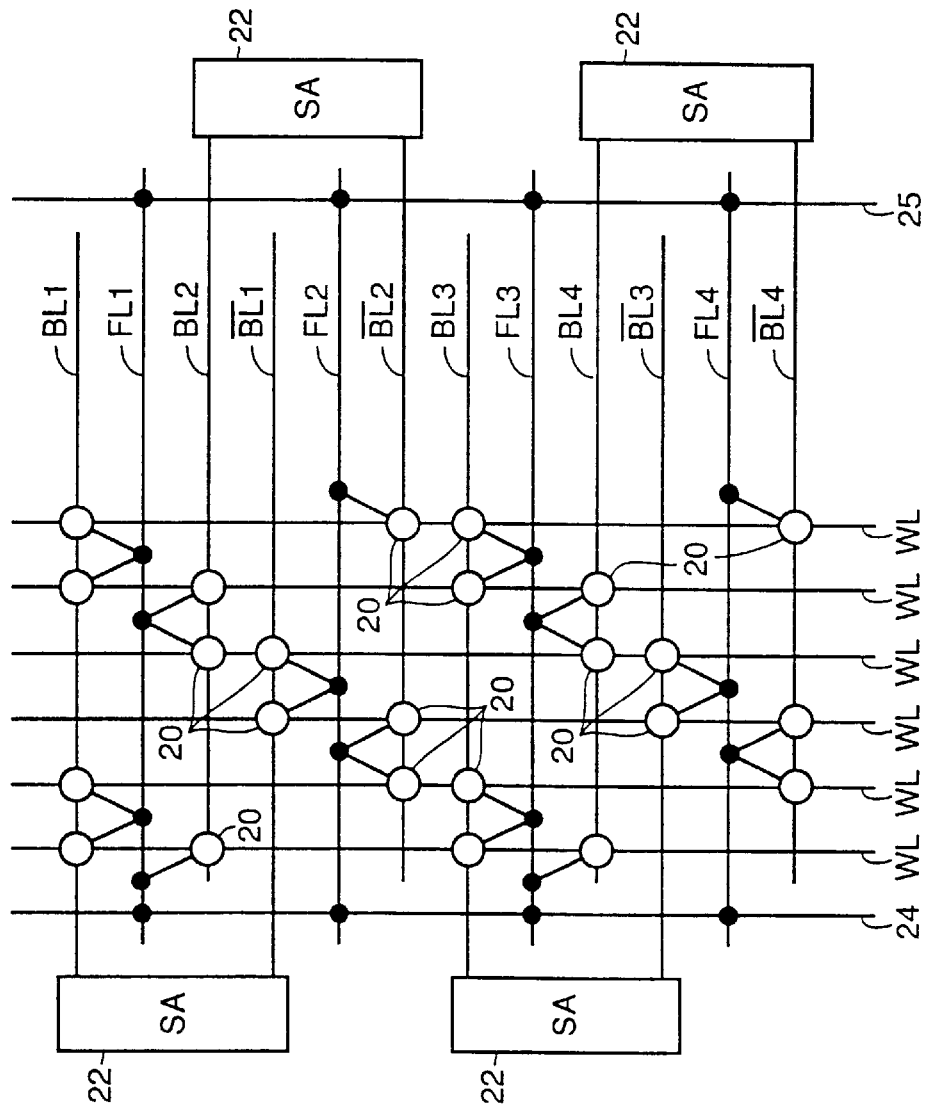

FIG. 43 is a block diagram showing structures of a memory cell array and sense amplifiers in a DRAM according to the embodiment 23 of the invention. Referring to FIG. 43, the embodiment 23 differs from the structure in FIG. 39 in that bit line BL2 is disposed between bit lines BL1 and /BL1. Also, bit line /BL1 is disposed between bit lines BL2 and /BL2. Bit line BL4 is disposed between bit lines BL3 and /BL3. Further, bit line /BL3 is disposed between bit line BL4 and /BL4. Therefore, in the embodiment 23, memory cells 20 are disposed at ¼ (quarter) pitch in contrast to the embodiment 19 shown in FIG. 19 including memory cells 20 arranged at ½ (half) pitch.

Body fixing line FL1 is disposed between bit lines BL1 and BL2. Body fixing line FL2 is disposed between bit lines /BL1 and /BL2. Body fixing line FL3 is disposed between bit lines BL3 and BL4. Body fixing line FL4 is disposed between bit lines /BL3 and /BL4.

Since the embodiment 23 employs cell arrangement of a quarter pitch, one sense amplifier can be disposed correspondingly to four bit lines. Therefore, conditions relating to the layout pitch of sense amplifiers can be eased as compared with the case of the cell arrangement of a half pitch. Therefore, a sufficient channel width can be ensured even under strict design rules, and the sense amplifiers can be disposed efficiently without increasing additional interconnections.

Figure 44:
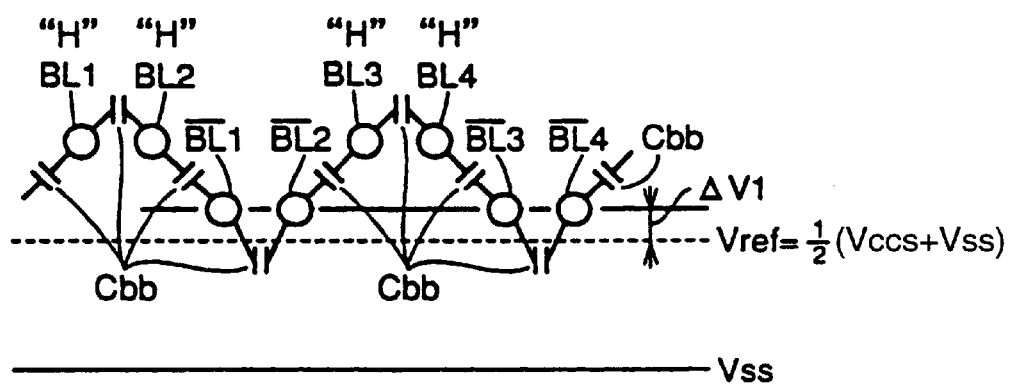
FIG. 44 shows capacity coupling between bit lines in a DRAM having a folded bit line structure of a quarter pitch.

FIG. 44 is a diagram showing a DRAM having a folded bit line structure of a quarter pitch, and in particular showing capacity coupling between bit lines in a structure not provided with a shield line. Referring to FIG. 44, when the potentials of bit lines BL1–BL4 attain H-level, the potentials of bit lines /BL1–/BL4 at the reference side rise only ΔV1, because bit lines /BL1–/BL4 are coupled to bit lines BL1–BL4 via inter-bit-line capacities Cbb, respectively. Thereby, the read potential difference occurring at the bit line pair decreases ΔV1, and correspondingly the operation margin decreases.

Figure 45:
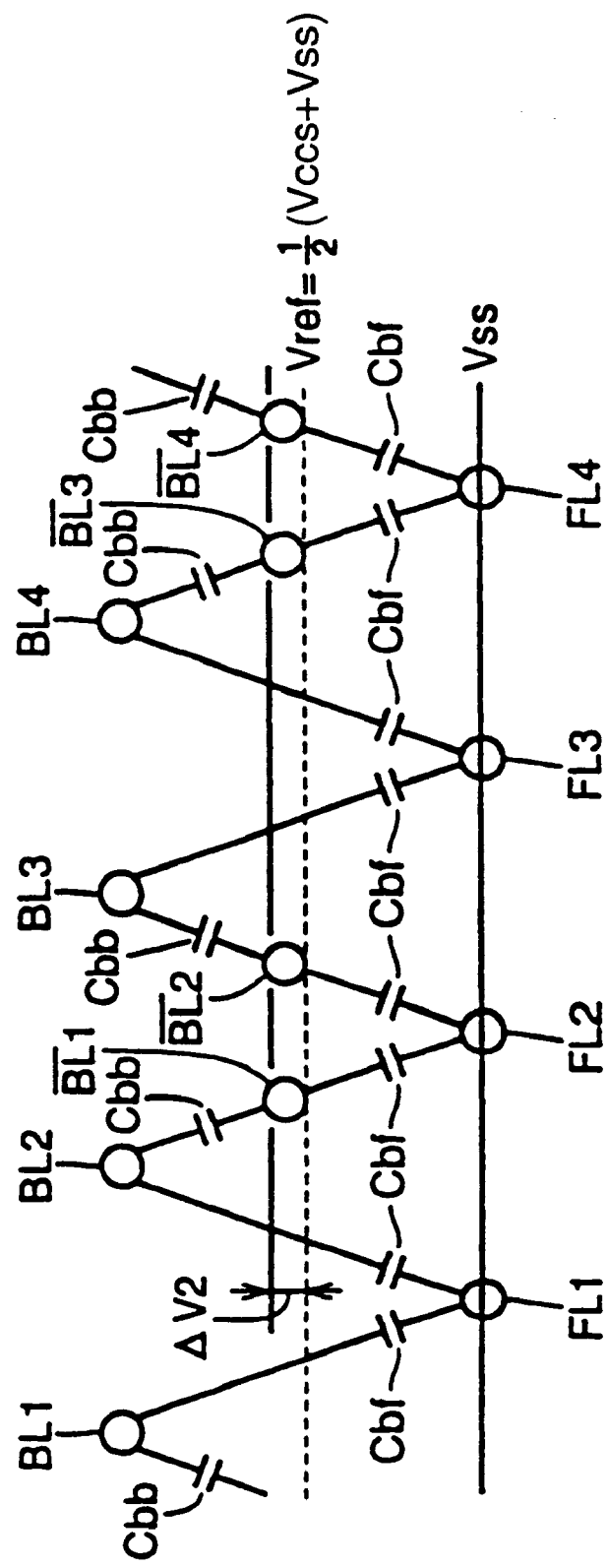
FIG. 45 shows capacity coupling between bit lines in the DRAM shown in FIG. 43.

FIG. 45 is a diagram showing a DRAM having a folded bit line structure of a quarter pitch shown in FIG. 43, and in particular showing capacity coupling between bit lines in a structure employing body fixing lines as shield lines. It is assumed the word line WL adjacent to common line 24 in FIG. 43 is selected. In this case, data are read from all memory cells 20 connected to selected word line WL onto bit line pairs BL1, /BL1–BL4, /BL4. When all data read from memory cells 20 are at H-level, the potentials of all bit lines BL1–BL4 attain H-level. Since bit lines /BL1–/BL3 at the reference side are coupled to bit lines BL2-BL4 via inter-bit line capacities Cbb, the potentials of bit lines /BL1–/BL4 also rise. Since bit lines /BL1–/BL4 are coupled to body fixing lines FL2–FL4 via capacities Cbf, the potentials of bit lines /BL1–/BL4 rise ΔV2 smaller than ΔV1 owing to capacity division. Therefore, influence by noises generated in the read operation can be suppressed. Since body fixing lines FL1 and FL2 are disposed at opposite sides of the bit lines BL2 and /BL1, it is possible to reduce noises applied from bit lines BL1 and /BL2 to bit lines BL2 and /BL1. Since body fixing lines FL3 and FL4 are disposed at opposite sides of the bit lines BL4 and /BL3, it is possible to reduce noises applied from bit lines BL3 and /BL4 to bit lines BL4 and /BL3.

[Embodiment 24]

Figure 46:
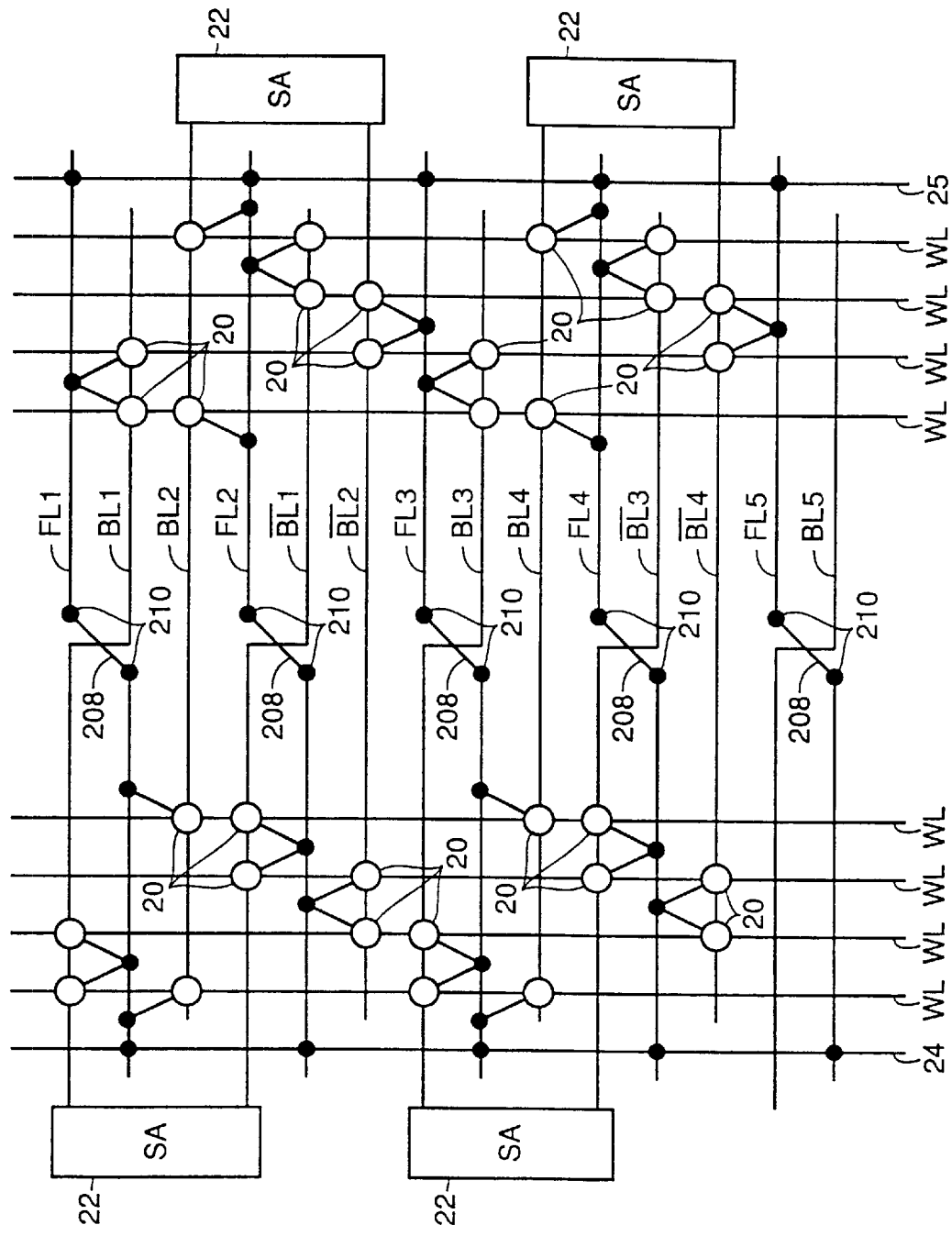
FIGS. 46 to 64 are block diagrams fragmentarily showing structures of DRAMs according to embodiments 24 to 42 of the invention, respectively.

FIG. 46 is a block diagram showing structures of a memory cell array and sense amplifiers in a DRAM according to the embodiment 24 of the invention. Referring to FIG. 46, the embodiment 24 differs from the structure in FIG. 43 in that body fixing lines FL1–FL5 are twisted with bit lines BL1, /BL1, BL3, /BL3 and BL5, respectively. Inter-bit-line capacity Cbb in this embodiment 24 can be expressed by the following formula:

$$Cbb=Cbf+Cr/2+Cd/2$$

where Cbf represents a parasitic capacity between a given bit line and a body fixing line, Cr represents a parasitic capacity between a given bit line and a bit line at the reference side from which sense amplifier 22 does not read data, and Cd represents a parasitic capacity between a given bit line and a bit line from which data was read.

In this embodiment 24, left and right halves in the figure of each body fixing line are coupled together by a coupling line 208. The right or left halves of body fixing lines are formed at the same interconnection layer as bit line pairs BL1, /BL1–BL4, /BL4. Coupling lines 208 are formed at another interconnection layer. Therefore, the right or left halves of body fixing lines are connected to coupling lines 208 through contact holes 210.

According to this embodiment 24, since the body fixing lines are twisted with the bit lines, noises applied to the bit lines are further reduced.

[Embodiment 25]

Figure 47:
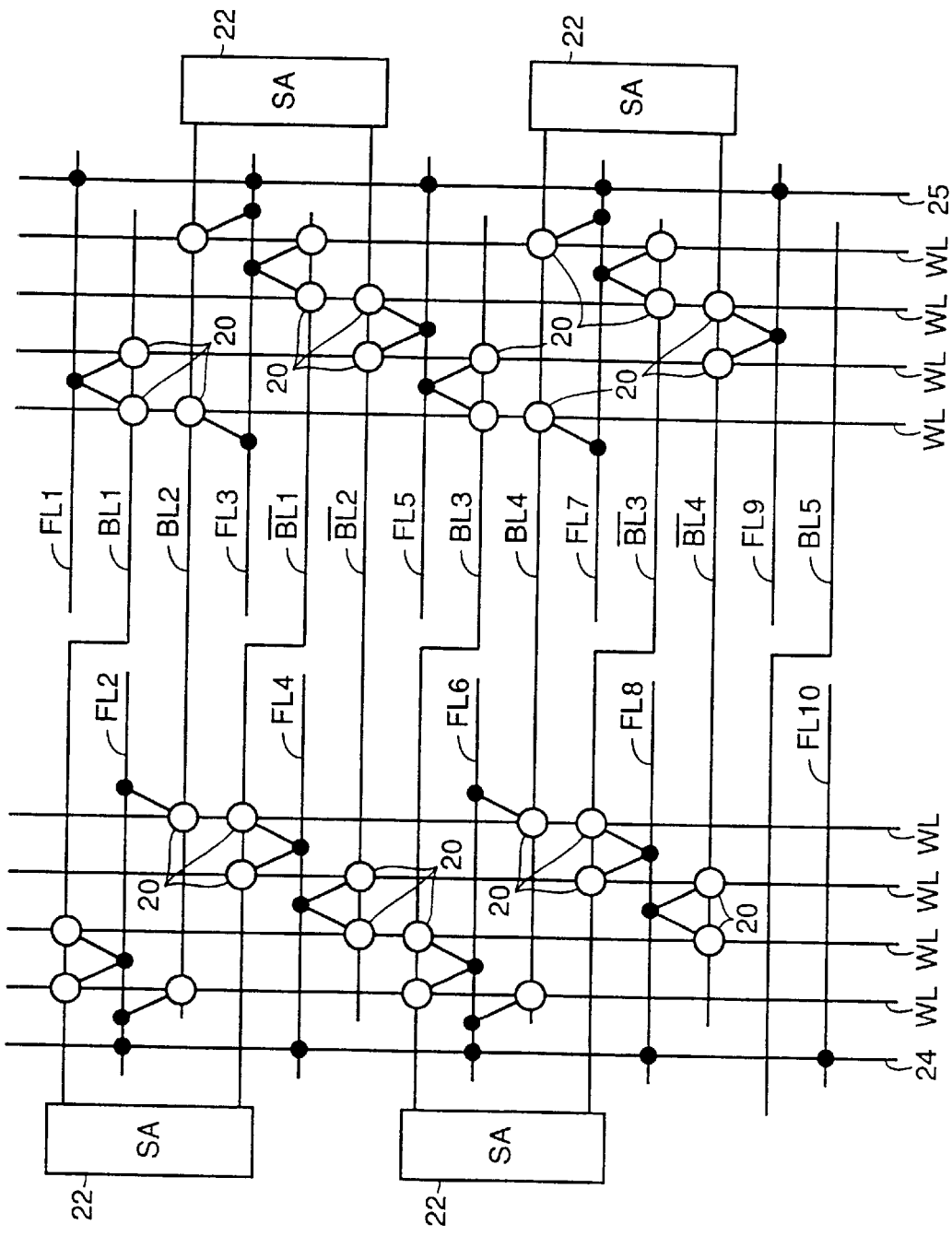

FIG. 47 is a block diagram showing structures of a memory cell array and sense amplifiers in a DRAM according the embodiment 25 of the invention. Referring to FIG. 47, the embodiment 25 differs from the structure in FIG. 46 in that coupling line 208 is not provided. Therefore, ground potential Vss is supplied to body fixing lines FL1, FL3, FL5, FL7 and FL9 from common line 25. Ground potential Vss is also supplied to body fixing lines FL2, FL4, FL6, FL8 and FL10 from common line 24.

According to this embodiment 25, since coupling lines 208 in FIG. 46 are not provided, the body fixing lines can be formed at one interconnection layer. Therefore, the embodiment 25 can be manufactured more easily that the embodiment 24 in FIG. 46. Since the arrangement of body fixing lines in the embodiment 25 is substantially equivalent to the twisted arrangement with respect to noises, noises applied to the bit lines can be reduced similarly to the embodiment 24 in FIG. 46.

[Embodiment 26]

Figure 48:
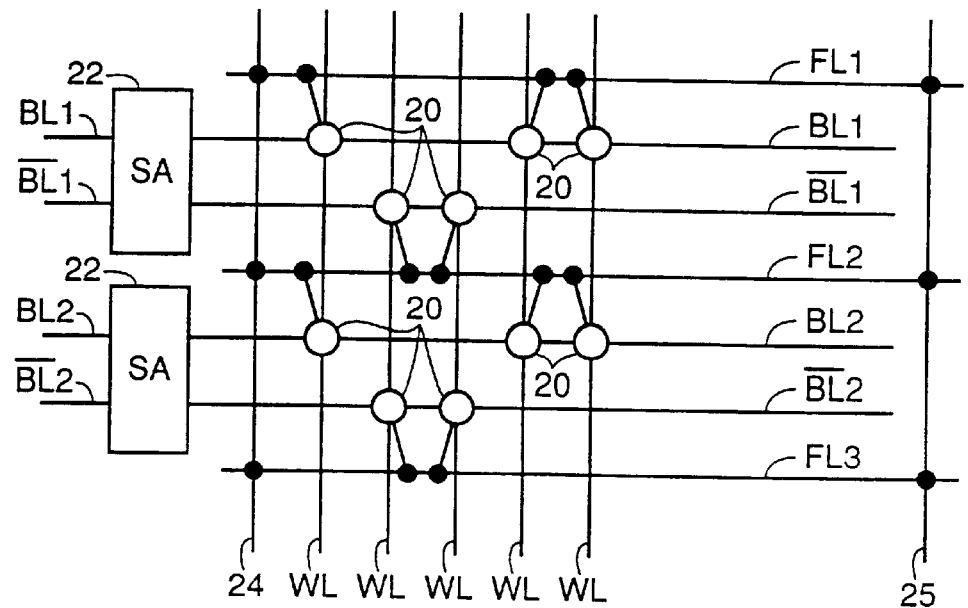

FIG. 48 is a block diagram showing structures of a memory cell array and sense amplifiers in a DRAM according to the embodiment 26 of the invention. Referring to FIG. 48, the embodiment 26 differs from the structure shown in FIG. 23 in that it employs a so-called shared sense amplifier method. More specifically, each sense amplifier 22 is connected to bit line pair BL1, /BL1 or BL2, /BL2 of one of the adjacent two memory cell arrays. Although not shown, sense amplifier 22 includes a column select gate for selecting the bit line pair.

According to this embodiment 26, since a so-called shared sense amplifier method is employed, the number of sense amplifiers can be smaller than that in the embodiment 10 in FIG. 23.

[Embodiment 27]

Figure 49:
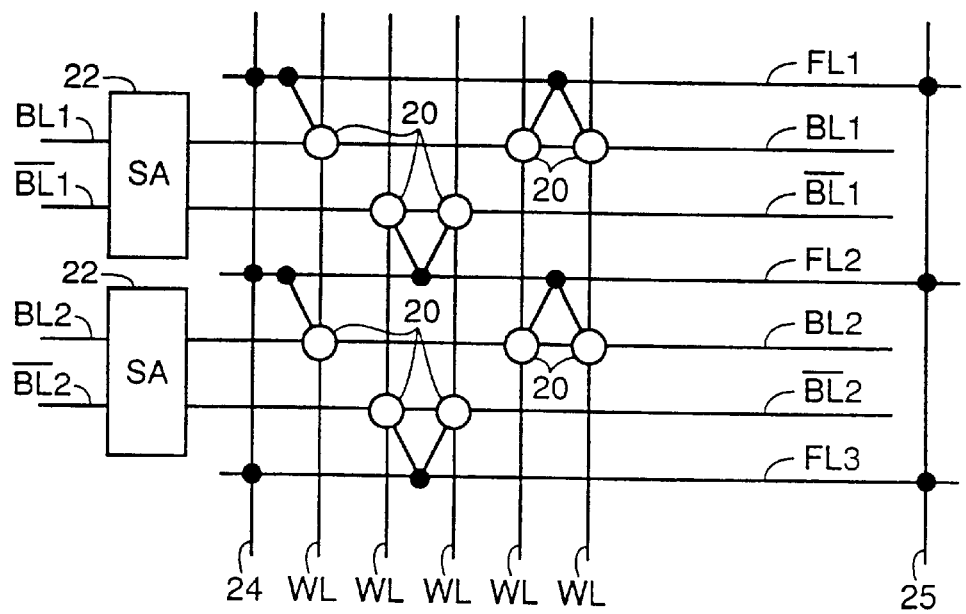

FIG. 49 is a block diagram showing structures of a memory cell array and sense amplifiers in a DRAM according to the embodiment 27 of the invention. Referring to FIG. 49, the embodiment 27 differs from the structure shown in FIG. 3 in that it employs a so-called shared sense amplifier method. It also differs from the structure in FIG. 48 in that the body regions of transfer gates in adjacent two memory cells 20 are connected to one position of one body fixing line.

According to the embodiment 27, since a so-called shared sense amplifier method is employed, the number of sense amplifiers can be smaller than that in the embodiment 1 in FIG. 3. Since the body regions of transfer gates in two memory cells 20 are connected to one position of one body fixing line, the layout area can be smaller than that in the embodiment 26 in FIG. 48.

[Embodiment 28]

Figure 50:
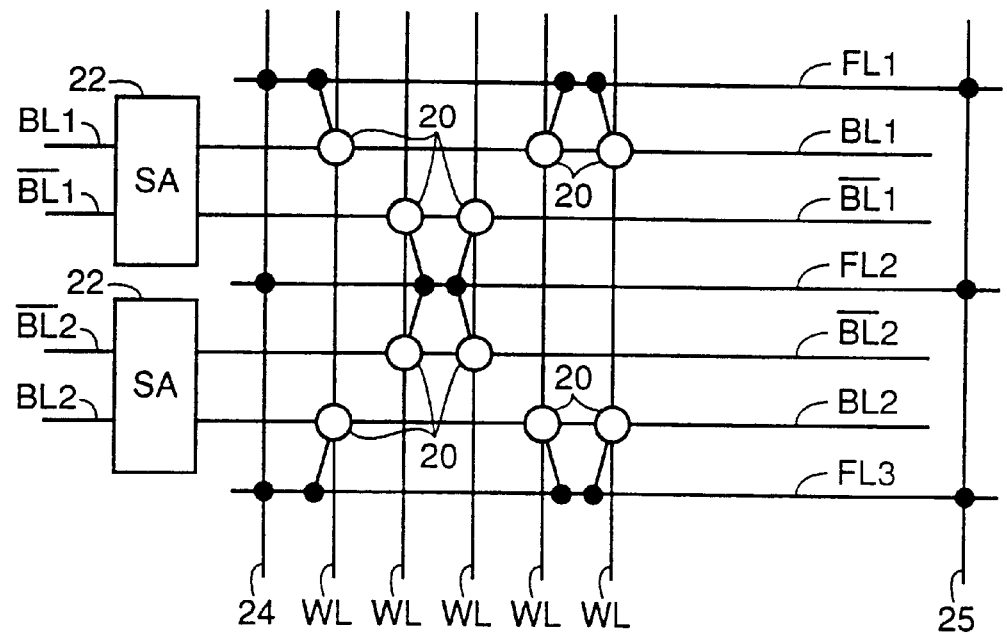

FIG. 50 is a block diagram showing structures of a memory cell array and sense amplifiers in a DRAM according to the embodiment 28 of the invention. Referring to FIG. 50, the embodiment 28 differs from the structure shown in FIG. 25 in that it employs a so-called shared sense amplifier method. It also differs from the structure in FIG. 48 in that memory cells 20 connected to bit lines BL1 and /BL1 are disposed symmetrically to the memory cells connected to bit lines BL2 and /BL2. The body regions of transfer gates in adjacent two memory cells 20 are connected to one position of one body fixing line.

According to the embodiment 28, since the shared sense amplifier method is employed, the number of sense amplifiers can be smaller than that in the embodiment 11 in FIG. 25. Since the body regions of transfer gates in two memory cells 20 are connected to one position of one body fixing line, the layout area can be smaller than that in the embodiment 26 in FIG. 48.

[Embodiment 29]

Figure 51:
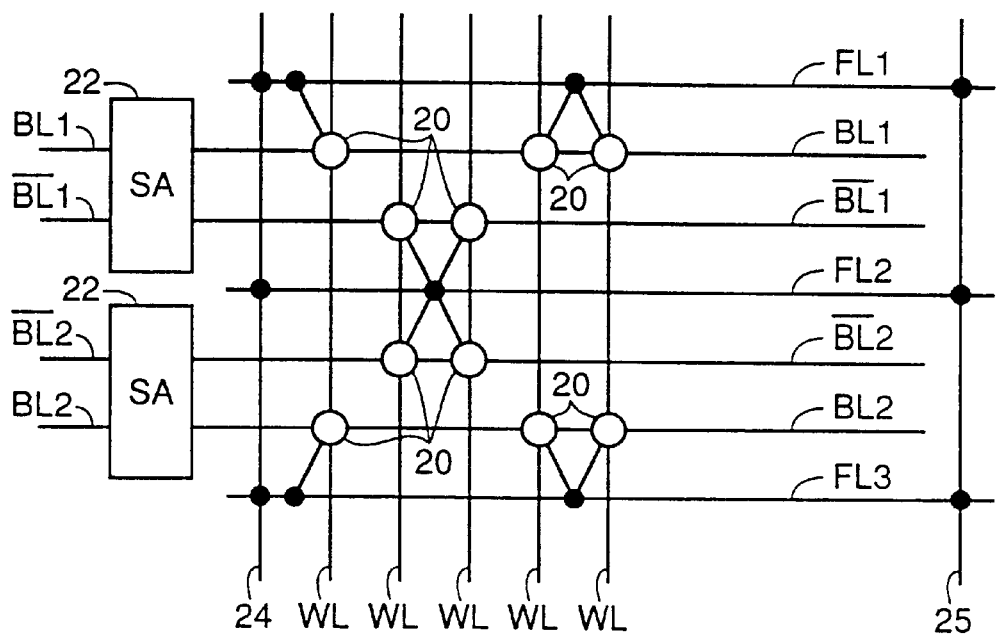

FIG. 51 is a block diagram showing structures of a memory cell array and sense amplifiers in a DRAM according to the embodiment 29 of the invention. Referring to FIG. 51, the embodiment 29 differs from the structure shown in FIG. 27 in that it employs a so-called shared sense amplifier method. It also differs from the structure in FIG. 50 in that the body regions of transfer gates in adjacent four memory cells 20 are connected to one position of one body fixing line.

According to the embodiment 29, since a so-called shared sense amplifier method is employed, the number of sense amplifiers can be smaller than that in the embodiment 12 in FIG. 27. Since the body regions of transfer gates in four memory cells 20 are connected to one position of one body fixing line, the layout area can be smaller than that in the embodiment 28 in FIG. 50.

[Embodiment 30]

Figure 52:
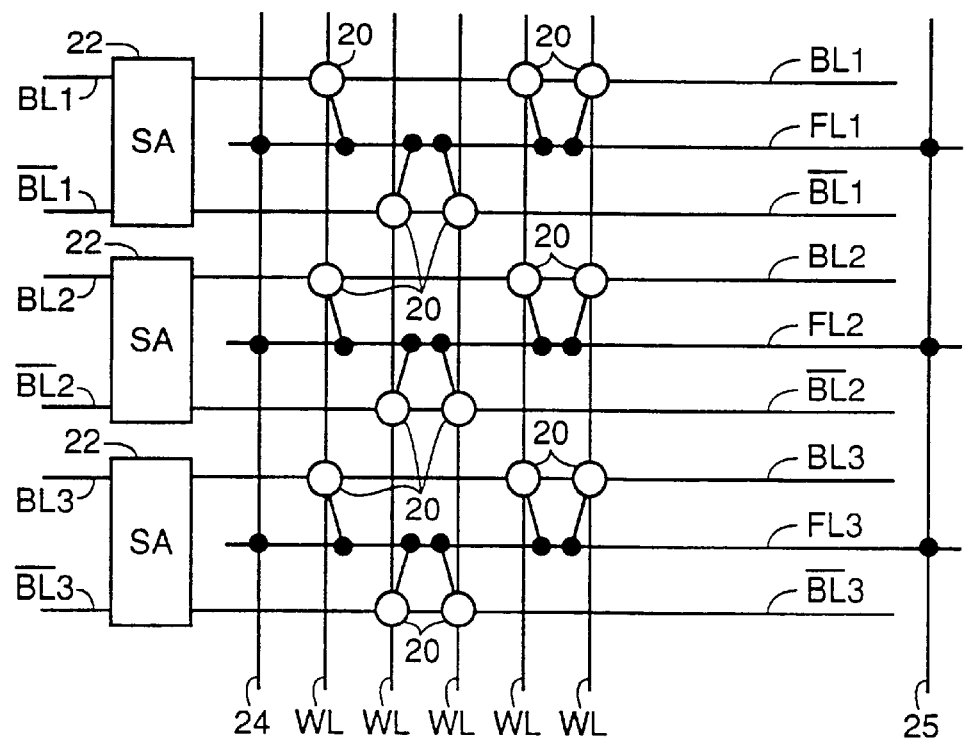

FIG. 52 is a block diagram showing structures of a memory cell array and sense amplifiers in a DRAM according to the embodiment 30 of the invention. Referring to FIG. 52, the embodiment 30 differs from the structure shown in FIG. 32 in that it employs a so-called shared sense amplifier method. It also differs from the structure in FIG. 48 in that the body fixing lines FL1–FL3 are disposed not between bit line pairs BL1, /BL2–BL3, /BL3 but between opposed, i.e., paired bit lines BL1 and /BL1, BL2 and /BL2, and BL3 and /BL3, respectively.

According to the embodiment 30, since a so-called shared sense amplifier method is employed, the number of sense amplifiers can be smaller than that in the embodiment 15 in FIG. 32. Since each body fixing line is disposed between paired bit lines, noises applied from one of the paired bit lines to the other can be reduced.

[Embodiment 31]

Figure 53:
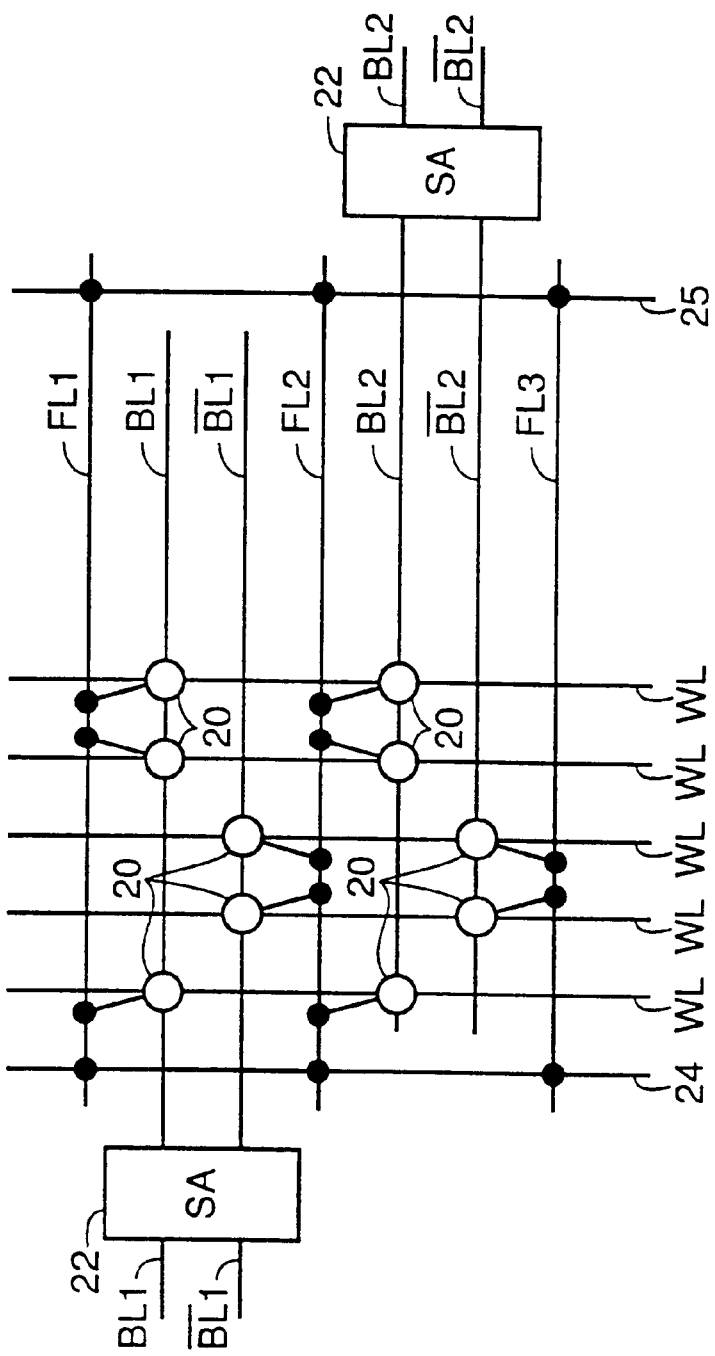

FIG. 53 is a block diagram showing structures of a memory cell array and sense amplifiers in a DRAM according to the embodiment 31 of the invention. Referring to FIG. 53, the embodiment 31 differs from the structure shown in FIG. 48 in that the sense amplifiers are disposed alternately.

According to the embodiment 31, since the sense amplifiers 22 are disposed alternately, conditions relating to the layout pitch of sense amplifiers 22 can be eased, or the width in the word line direction can be smaller than that in the embodiment 26 in FIG. 48.

[Embodiment 32]

Figure 54:
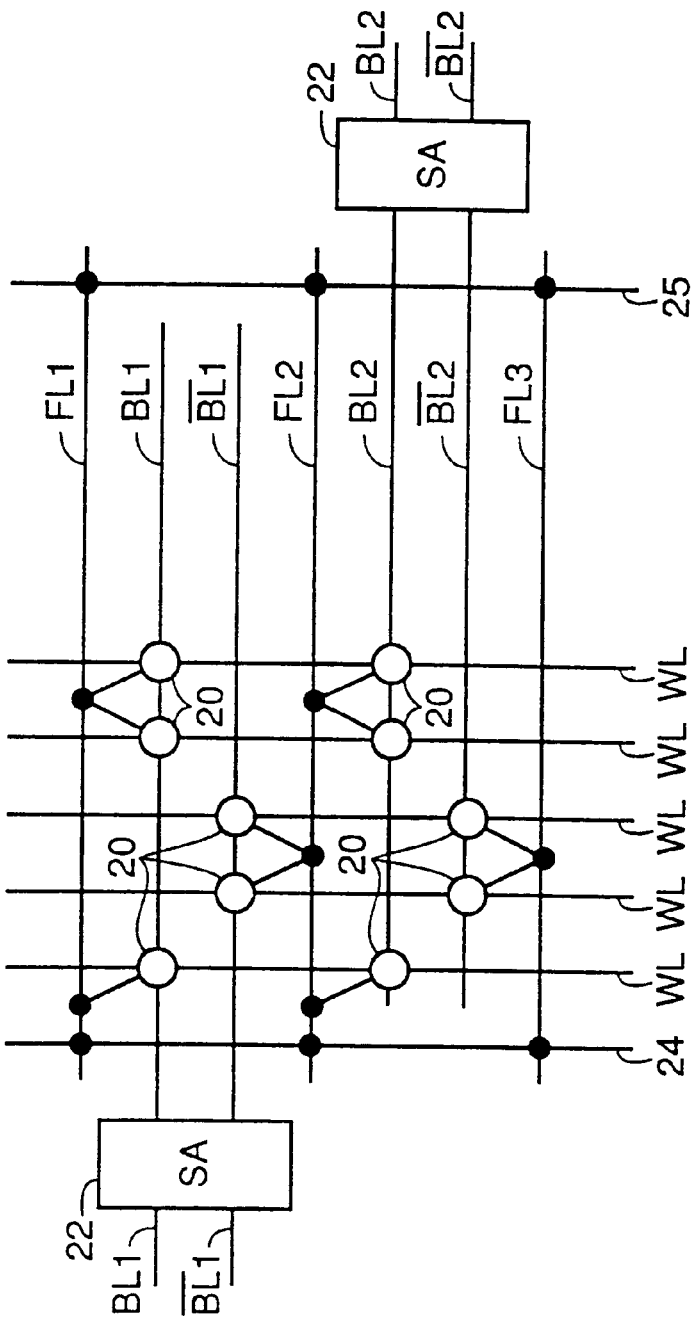

FIG. 54 is a block diagram showing structures of a memory cell array and sense amplifiers in a DRAM according to the embodiment 32 of the invention. Referring to FIG. 54, the embodiment 32 differs from the structure shown in FIG. 49 in that the sense amplifiers 22 are disposed alternately. It also differs from the structure in FIG. 53 in that the body regions of transfer gates in adjacent two memory cells 20 are connected to one position of one body fixing line.

According to the embodiment 32, since the sense amplifiers 22 are disposed alternately, conditions relating to the layout pitch of sense amplifiers 22 can be eased, or the width in the word line direction can be smaller than that in the embodiment 27 in FIG. 49. Since the body regions of transfer gates in adjacent two memory cells 20 are connected to one position of one body fixing line, the layout area can be smaller than that in the embodiment 31 in FIG. 53.

[Embodiment 33]

Figure 55:
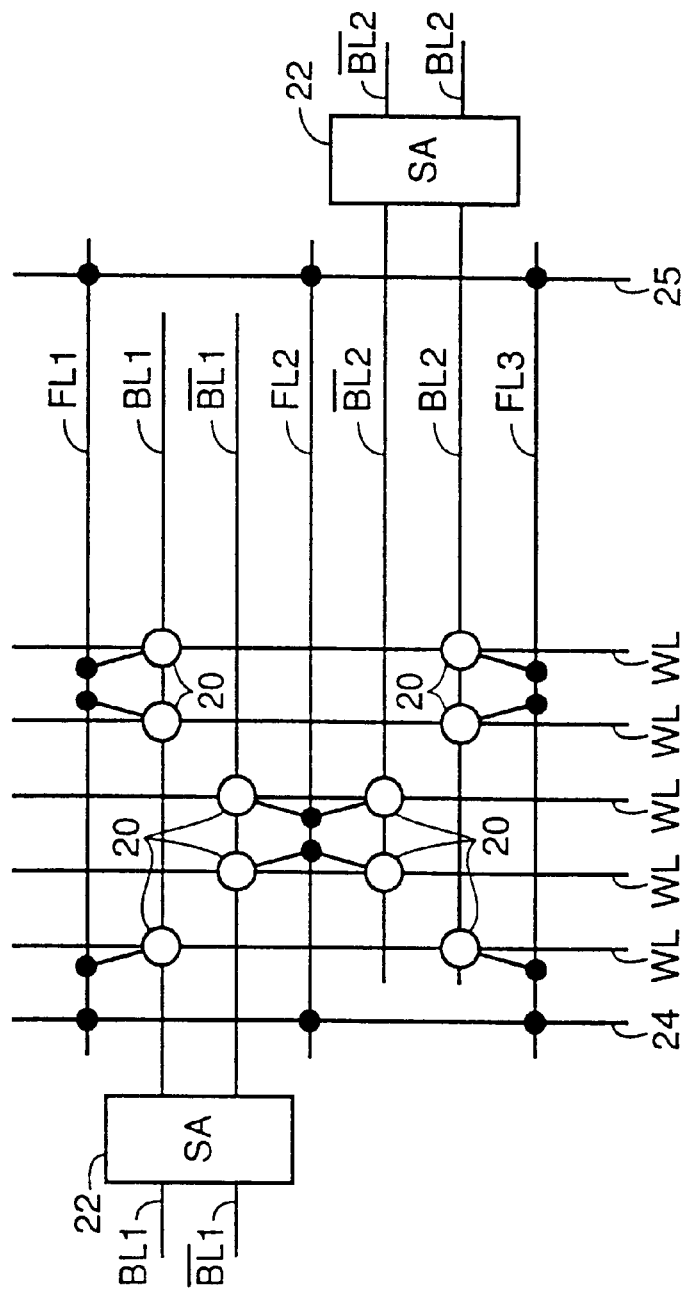

FIG. 55 is a block diagram showing structures of a memory cell array and sense amplifiers in a DRAM according to the embodiment 33 of the invention. Referring to FIG. 55, the embodiment 33 differs from the structure shown in FIG. 50 in that the sense amplifiers 22 are disposed alternately. It also differs from the structure in FIG. 53 in that memory cells 20 connected to bit lines BL1 and /BL1 are disposed symmetrically to the memory cells connected to bit lines BL2 and /BL2. The body regions of transfer gates in adjacent two memory cells 20 are connected to one position of one body fixing line.

According to the embodiment 33, since the sense amplifiers 22 are disposed alternately, conditions relating to the layout pitch of sense amplifiers 22 can be eased, or the width in the word line direction can be smaller than that in the embodiment 28 in FIG. 50. Since the body regions of transfer gates in adjacent two memory cells 20 are connected to one position of one body fixing line, the layout area can be smaller than that in the embodiment 31 in FIG. 53.

[Embodiment 34]

Figure 56:
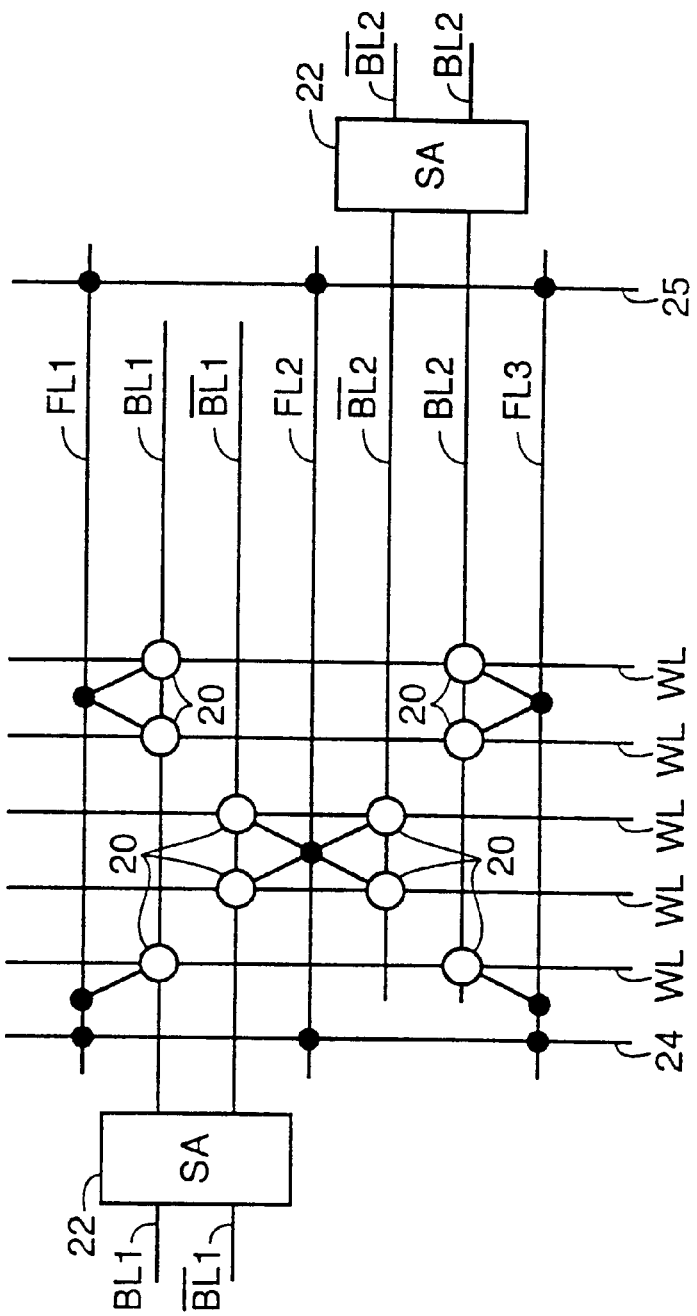

FIG. 56 is a block diagram showing structures of a memory cell array and sense amplifiers in a DRAM according to the embodiment 34 of the invention. Referring to FIG. 56, the embodiment 34 differs from the structure shown in FIG. 51 in that the sense amplifiers 22 are disposed alternately. It also differs from the structure in FIG. 55 in that the body regions of transfer gates in adjacent four memory cells 20 are connected to one position of one body fixing line.

According to the embodiment 34, since the sense amplifiers 22 are disposed alternately, conditions relating to the layout pitch of sense amplifiers 22 can be eased, or the width in the word line direction can be smaller than that in the embodiment 29 in FIG. 51. Since the body regions of transfer gates in adjacent four memory cells 20 are connected to one position of one body fixing line, the layout area can be smaller than that in the embodiment 33 in FIG. 55.

[Embodiment 35]

Figure 57:
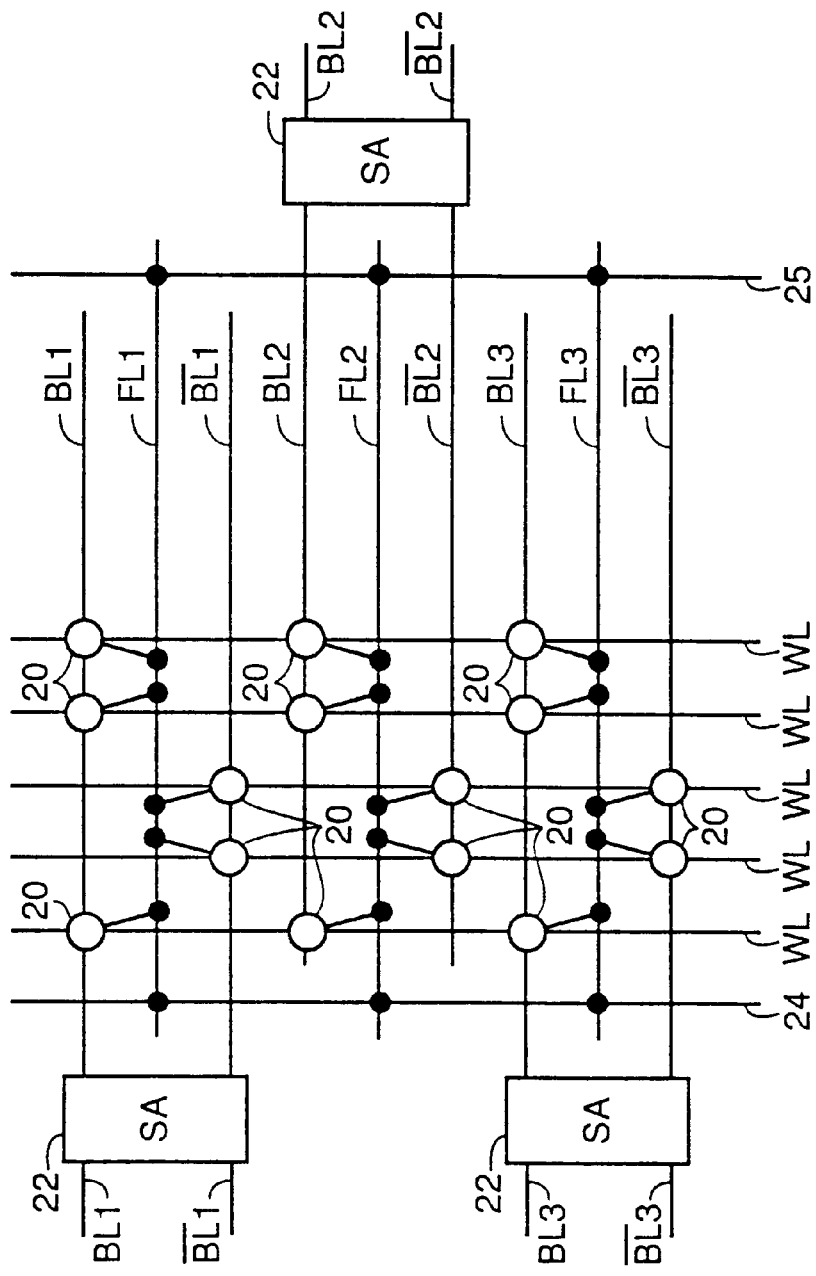

FIG. 57 is a block diagram showing structures of a memory cell array and sense amplifiers in a DRAM according to the embodiment 35 of the invention. Referring to FIG. 57, the embodiment 35 differs from the structure shown in FIG. 52 in that the sense amplifiers 22 are disposed alternately. It also differs from the structure in FIG. 53 in that the body fixing lines FL1–FL3 are disposed not between bit line pairs but between paired bit lines BL1 and /BL1, BL2 and /BL2, and BL3 and /BL3, respectively.

According to the embodiment 35, since the sense amplifiers 22 are disposed alternately, conditions relating to the layout pitch of sense amplifiers 22 can be eased, or the width in the word line direction can be smaller than that in the embodiment 30 in FIG. 52. Since each body fixing line is disposed between paired bit lines, noises applied from one of the paired bit lines to the other can be reduced.

[Embodiment 36]

Figure 58:
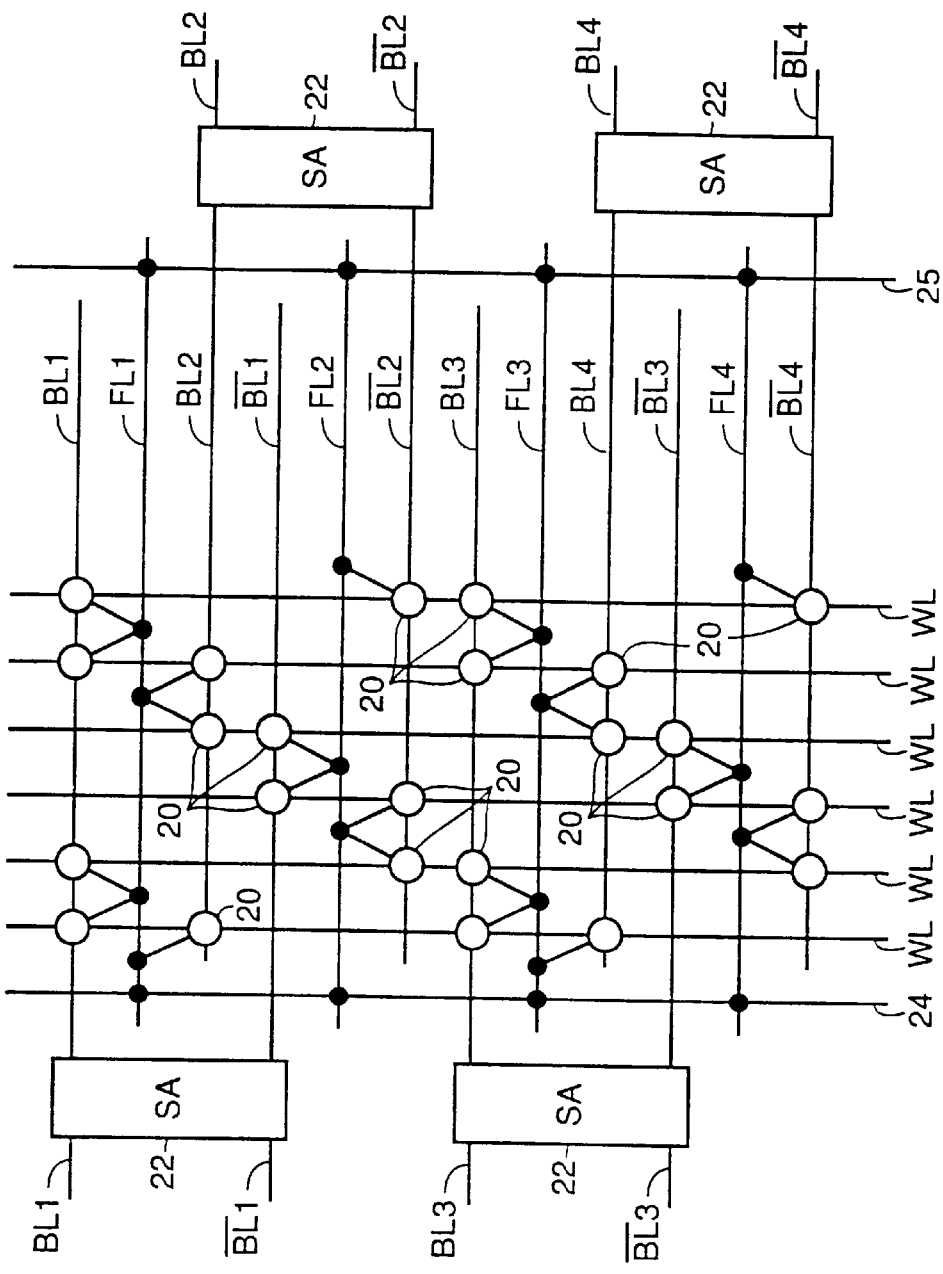

FIG. 58 is a block diagram showing structures of a memory cell array and sense amplifiers in a DRAM according to the embodiment 36 of the invention. Referring to FIG. 58, the embodiment 36 differs from the structure shown in FIG. 43 in that it employs a so-called shared sense amplifier method. According to the embodiment 36, the number of sense amplifiers can be smaller than that in the embodiment 23 in FIG. 43.

[Embodiment 37]

Figure 59:
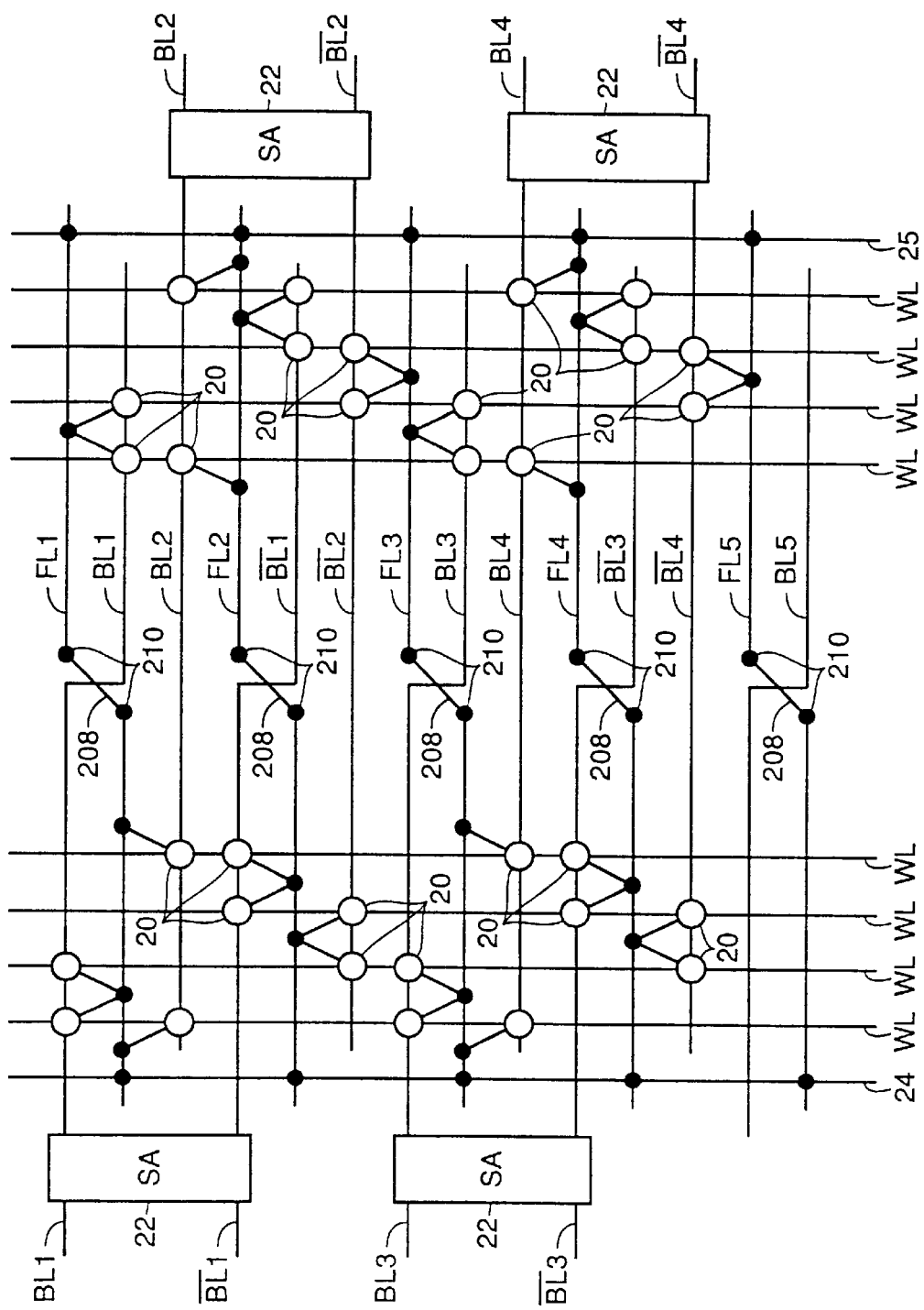

FIG. 59 is a block diagram showing structures of a memory cell array and sense amplifiers in a DRAM according to the embodiment 37 of the invention. Referring to FIG. 59, the embodiment 37 differs from the structure shown in FIG. 46 in that it employs a so-called shared sense amplifier method. Accordingly, the number of sense amplifiers can be smaller than that in the embodiment 24 in FIG. 46.

[Embodiment 38]

Figure 60:
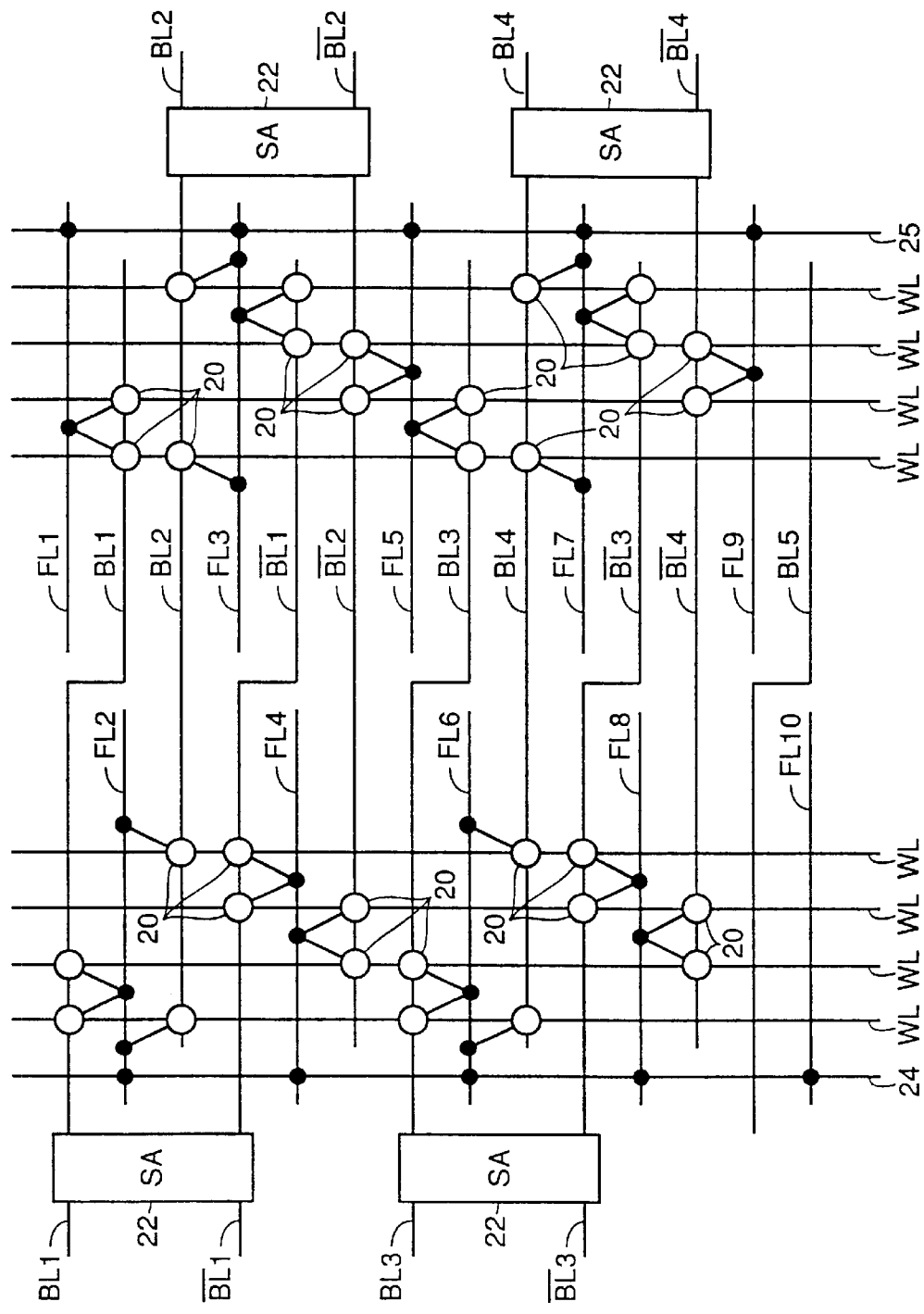

FIG. 60 is a block diagram showing structures of a memory cell array and sense amplifiers in a DRAM according to the embodiment 38 of the invention. Referring to FIG. 60, the embodiment 38 differs from the structure shown in FIG. 47 in that it employs a so-called shared sense amplifier method. Accordingly, the number of sense amplifiers can be smaller than that in the embodiment 25 in FIG. 47.

[Embodiment 39]

Figure 61:
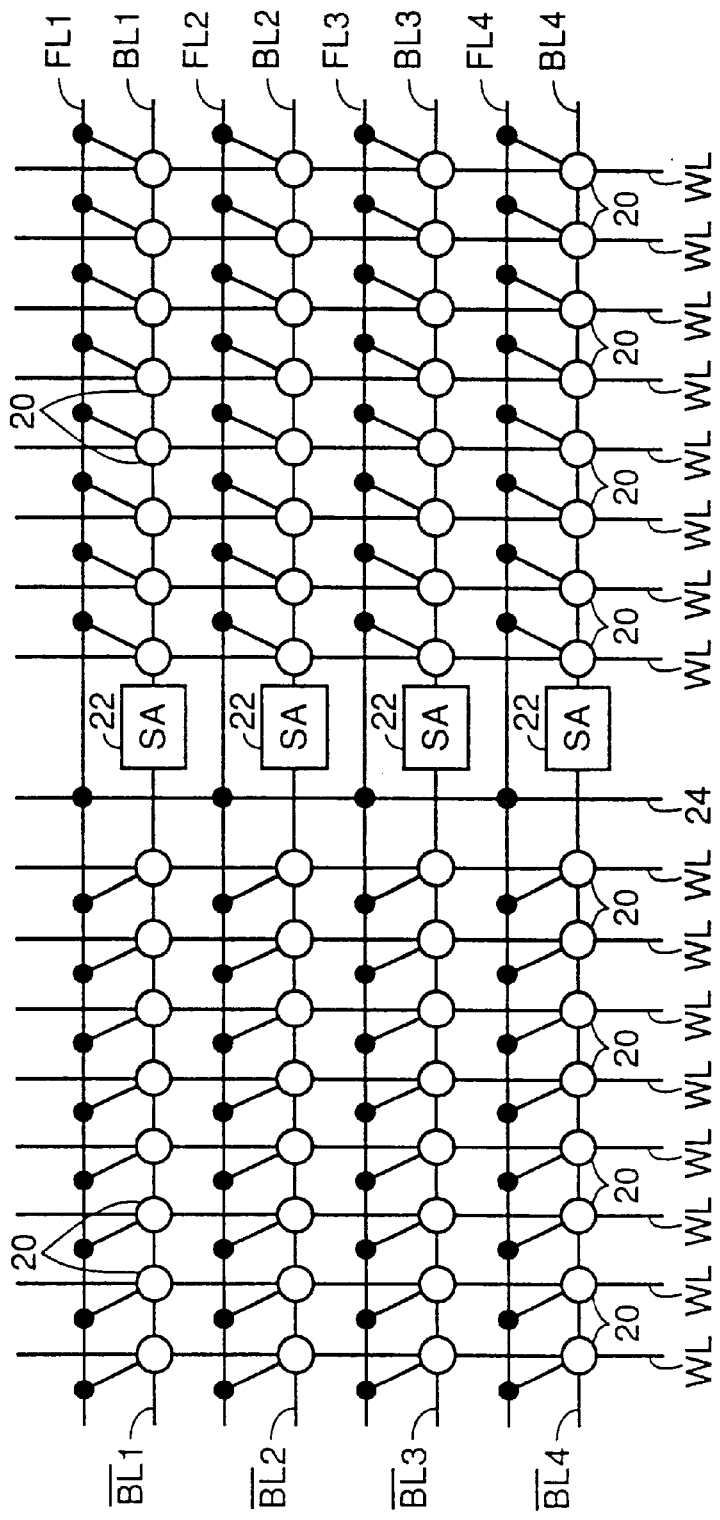

FIG. 61 is a block diagram showing structures of a memory cell array and sense amplifiers in a DRAM according to the embodiment 39 of the invention. Referring to FIG. 61, the embodiment 39 employs a so-called open bit line structure. More specifically, bit lines BL1 and /BL1 are disposed on a straight line, and sense amplifier 22 is disposed between bit lines BL1 and /BL1. Bit lines BL1 and /BL1 form one bit line pair. Other bit line pairs BL2, /BL2–BL4, /BL4 are constructed and arranged in the same manner as the bit line pair BL1 and /BL1.

Word lines WL are disposed across bit lines BL1–BL4 and /BL1–/BL4. Memory cells 20 are disposed at all crossings between the bit lines and word lines. Body fixing lines FL1–FL4 are disposed along bit line pairs BL1, /BL1–BL4, /BL4, respectively. Common line 24 extends across body fixing lines FL1–FL4 and along sense amplifiers 22. Body fixing lines FL1–FL4 are connected to common line 24. Common line 24 is supplied with ground potential Vss. Therefore, all body fixing lines FL1–FL4 are supplied with ground potential Vss.

The body region of transfer gate in each memory cell 20 is connected to one independent position of one body fixing line. Therefore, the body regions of transfer gates in memory cells 20 are supplied with ground potential Vss. Thereby, the body regions are electrically fixed.

Since this embodiment 39 employs the open bit line structure, memory cells 20 can be disposed at all crossings between the word lines and bit lines.

[Embodiment 40]

Figure 62:
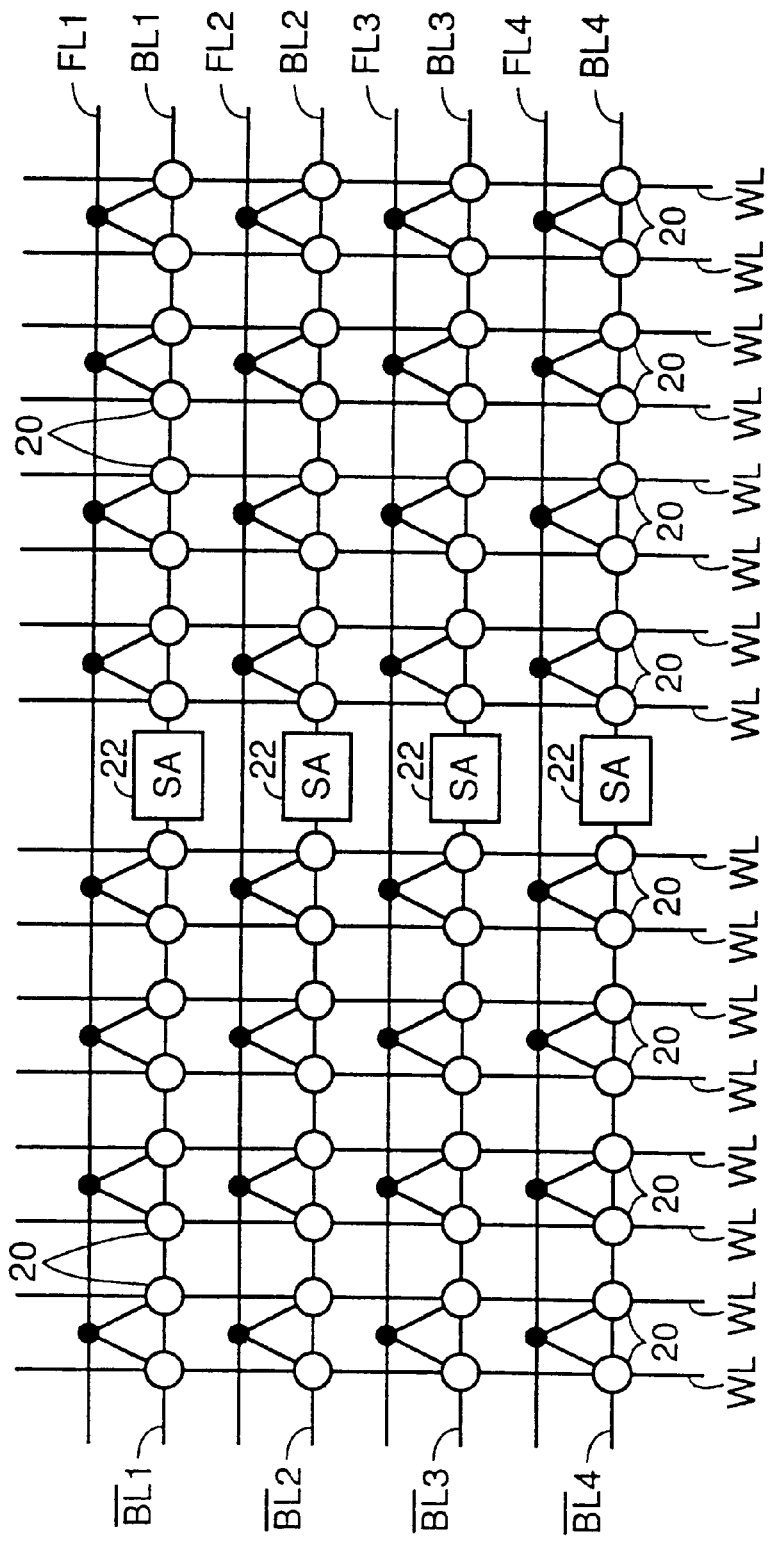

FIG. 62 is a block diagram showing structures of a memory cell array and sense amplifiers in a DRAM according to the embodiment 40 of the invention. Referring to FIG. 62, the embodiment 40 differs from the structure shown in FIG. 61 in that the body regions of transfer gates in adjacent two memory cells 20 are connected to one position of one body fixing line. Therefore, the layout area can be smaller than that in the embodiment 39 in FIG. 61.

[Embodiment 41]

Figure 63:
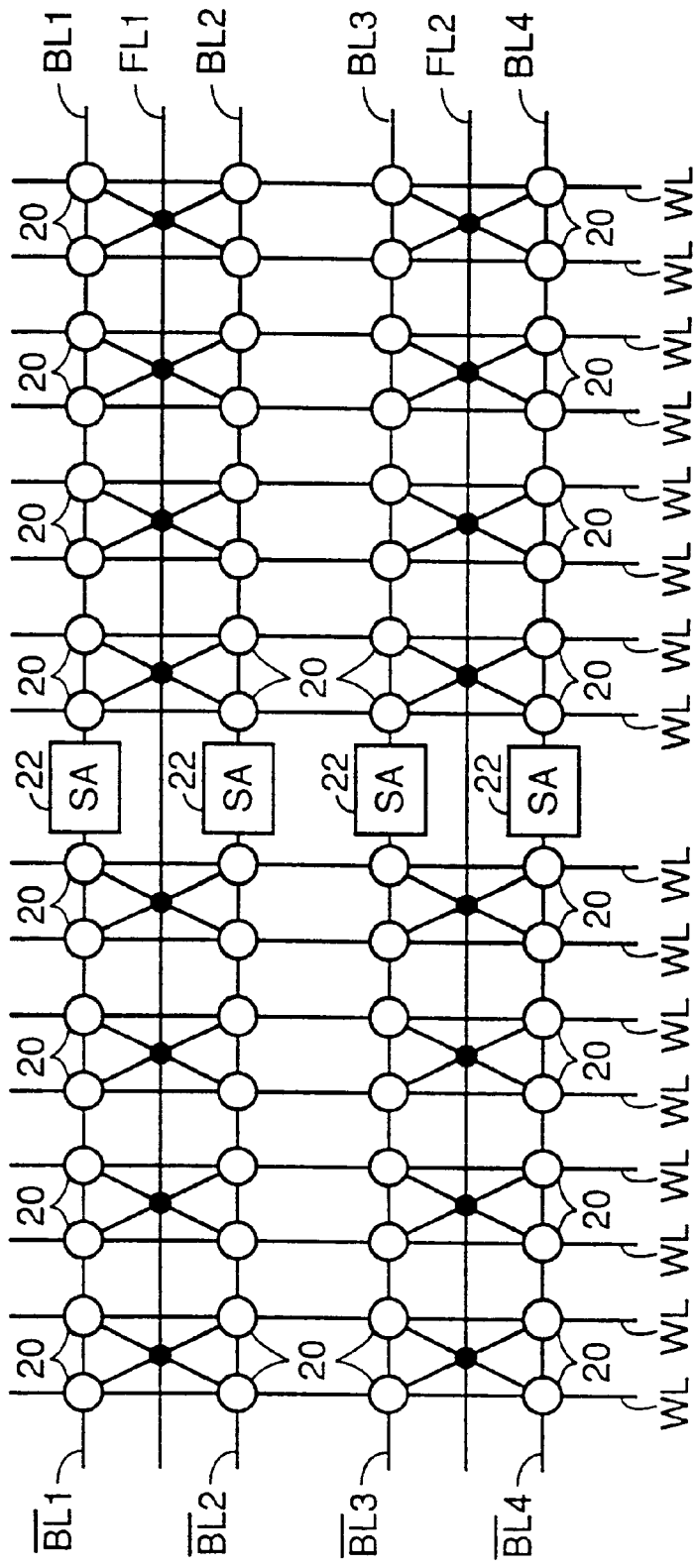

FIG. 63 is a block diagram showing structures of a memory cell array and sense amplifiers in a DRAM according to the embodiment 41of the invention. Referring to FIG. 63, the embodiment 41 differs from the structure shown in FIG. 62 in that the body regions of transfer gates in adjacent four memory cells 20 are connected to one position of one body fixing line. Therefore, the layout area can be smaller than that in the embodiment 40 in FIG. 62.

[Embodiment 42]

Figure 64:
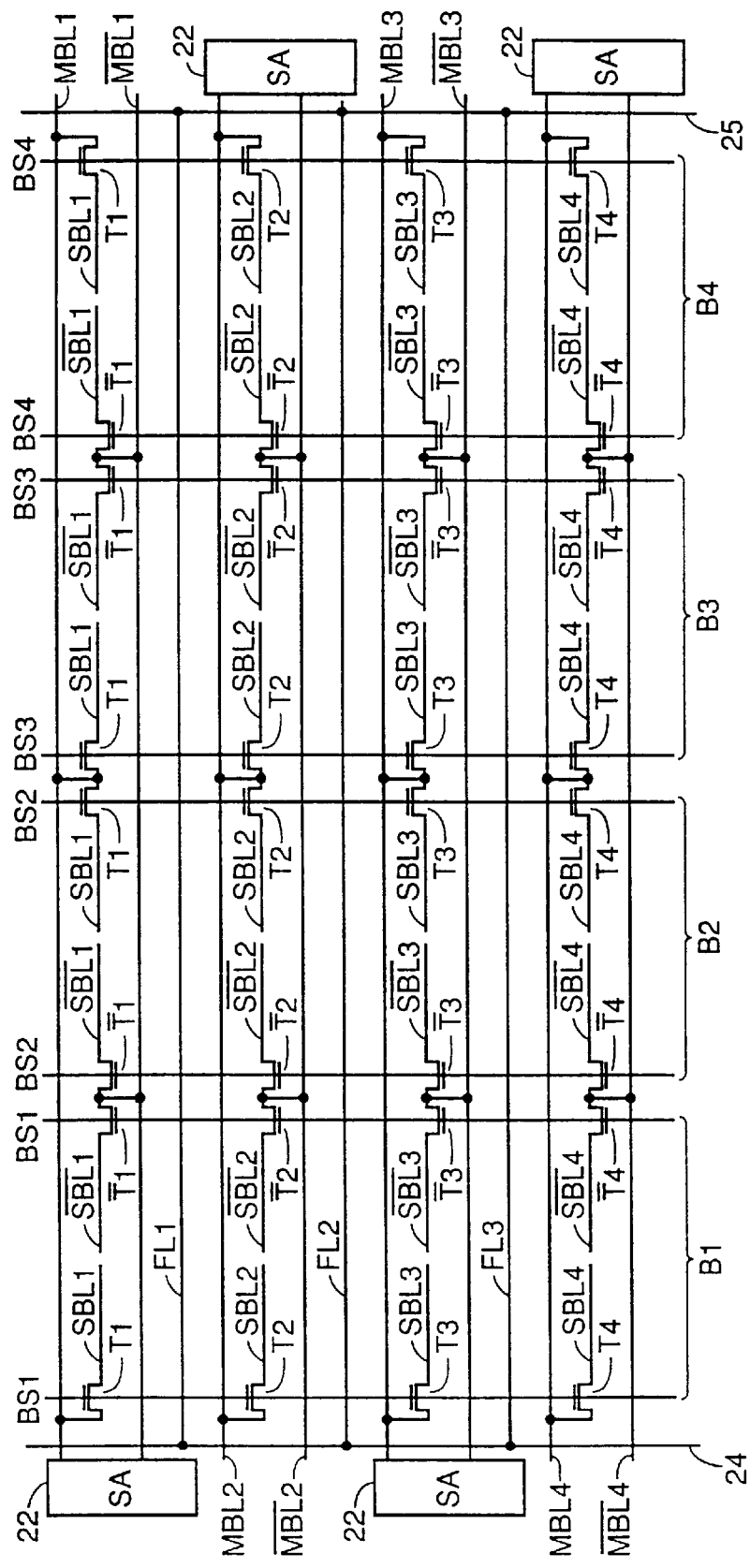

FIG. 64 is a block diagram showing a structure of a DRAM according to the embodiment 42 of the invention. Referring to FIG. 64, the DRAM includes four blocks B1–B4 and a plurality of main bit line pairs MB1, /MB1–MB4, /MB4 disposed over these blocks B1–B4. Main bit line pairs MBL1, /MBL1–MBL4, /MBL4 have a folded bit line structure. Each of main bit line pairs MB1, /MB1–MB4, /MB4 is connected to sense amplifier 22. Sense amplifiers 22 are disposed alternately.

Block B1 includes sub-bit line pairs SBL1, /SBL1–SBL4, /SBL4. Paired sub-bit lines SBL1 and /SBL1 are disposed straightly along main bit line pair MBL1 and /MBL1. Other sub-bit lines SBL2, /SBL2–SBL4, /SBL4 are disposed similarly to sub-bit lines SBL1 and /SBL1. Accordingly, all sub-bit line pairs SBL1, /SBL1–SBL4, /SBL4 have the open bit line structure.

Other blocks B2–B4 have a structure similar to block B1. Thus, four sub-bit line pairs SBL1 and /SBL1 are disposed along main bit line pair MBL1 and /MBL1. Also, four sub-bit line pairs SBL2 and /SBL2 are disposed along main bit line pair MBL2 and /MBL2. Four sub-bit line pairs SBL3 and /SBL3 are disposed along main bit line pair MBL3 and /MBL3. Four sub-bit line pairs SBL4 and /SBL4 are disposed along main bit line pair MBL4 and /MBL4. These sub-bit line pairs SBL1, /SBL1–SBL4, /SBL4 are formed at an interconnection layer lower than main bit line pairs MBL1, /MBL1–MBL4, /MBL4. Therefore, the pitch of sub-bit lines is twice as large as that of the main bit lines.

Block B1 further includes block select gates T1–T4 and /T1–/T4. Each block select gate is formed of an N-channel MOS transistor, of which gate electrode receives a block select signal BS1. Therefore, when block select signal BS1 attains H-level, all block select gates T1–T4 and /T1–/T4 in block B1 are turned on.

Each sub-bit line SBL1 is connected to main bit line MBL1 via block select gate T1. Sub-bit line /SBL1 is connected to main bit line /MBL1 via block select gate /T1. Sub-bit line SBL2 is connected to main bit line MBL2 via block select gate T2. Sub-bit line /SBL2 is connected to main bit line /MBL2 via block select gate /T2. Sub-bit line SBL3 is connected to main bit line MBL3 via block select gate T3. Sub-bit line /SBL3 is connected to main bit line /MBL3 via block select gate /T3. Sub-bit line SBL4 is connected to main bit line MBL4 via block select gate T4. Sub-bit line /SBL4 is connected to main bit line /MBL4 via block select gate /T4.

Figure 65:
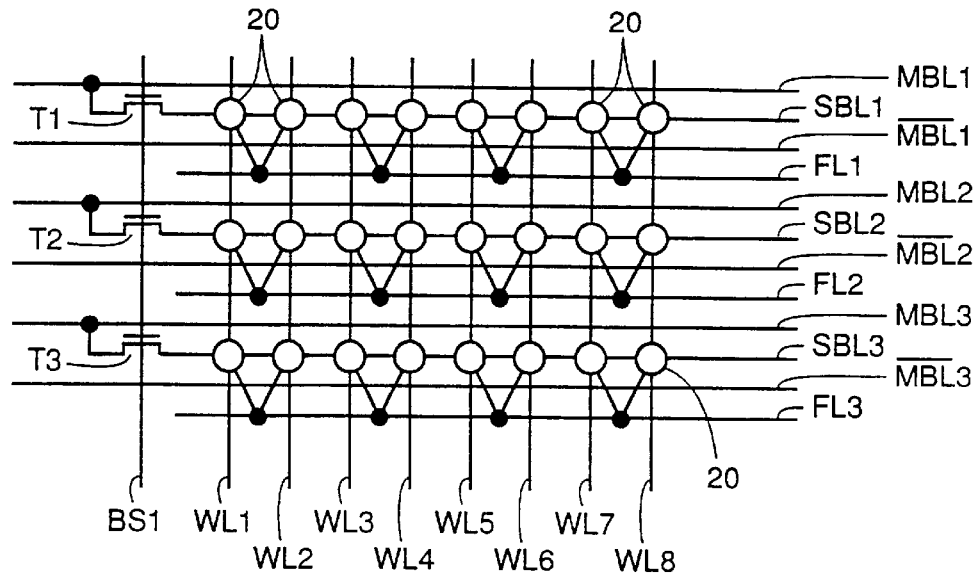
FIG. 65 is a block diagram fragmentarily showing a structure of a block in the DRAM shown in FIG. 64.

FIG. 65 is a block diagram fragmentarily showing a structure of block B1 shown in FIG. 64. In block B1 shown in FIG. 65, word lines WL1–WL8 extend across sub-bit lines SBL1–SBL3. A plurality of memory cells 20 are arranged correspondingly to crossings between word lines WL1–WL8 and sub-bit lines SBL1–SBL3.

Referring against to FIG. 64, body fixing lines FL1–FL3 are disposed between the adjacent main bit line pairs. Body fixing lines FL1–FL3 are formed at the same interconnection layer as sub-bit line pairs SBL1, /SBL1–SBL4, /SBL4. Therefore, the pitches of sub-bit lines and body fixing lines are the same as that of the main bit lines.

Referring again to FIG. 65, the body regions of transfer gates of adjacent two memory cells 20 are connected to one position of body fixing line FL1, FL2 or FL3. Thus, these two body regions are common to each other, and are connected to one body fixing line through a contact hole formed on the common body regions. Thereby, the body regions of transfer gates in all memory cells 20 are electrically fixed.

In the above DRAM, any one of block select signals BS1–BS4 attains H-level. For example, when block select signal BS1 attains H-level, block B1 is selected. More specifically, each sub-bit line pair in block B1 is connected to the corresponding main bit line pair.

Subsequently, one of word lines WL1–WL8 in block B1 is selected. For example, when word line WL1 is selected, data of all memory cells 20 connected to selected word line WL1 are read onto sub-bit lines SBL1–SBL4. Since sub-bit lines SBL1–SBL4 are connected to main bit lines MBL1–MBL4, respectively, the potentials of main bit lines MBL1–MBL4 change. Meanwhile, data of the memory cells are not read onto sub-bit lines /SBL1–/SBL4, so that the potentials of main bit lines /MBL1–/MBL4 do not change. Therefore, sense amplifiers 22 amplify potential differences occurring at main bit line pairs MBL1, /MBL1–MBL4, /MBL4 using the potentials of main bit lines /MBL1–/MBL4 as reference. Thereby, data can be read from memory cells 20 in selected block B1.

According to this embodiment 42, the sub-bit line pairs have the open bit line structure and the body fixing lines are disposed between the sub-bit line pairs, so that the pitches of sub-bit lines and body fixing lines are equal to the pitch of main bit lines. Therefore, provision of the body fixing lines does not increase the layout area. Since the body regions of transfer gates in the adjacent two memory cells are connected to the body fixing line via one contact hole, the increase of the layout area caused by the contact holes can be suppressed.

[Embodiment 43]

Figure 66:
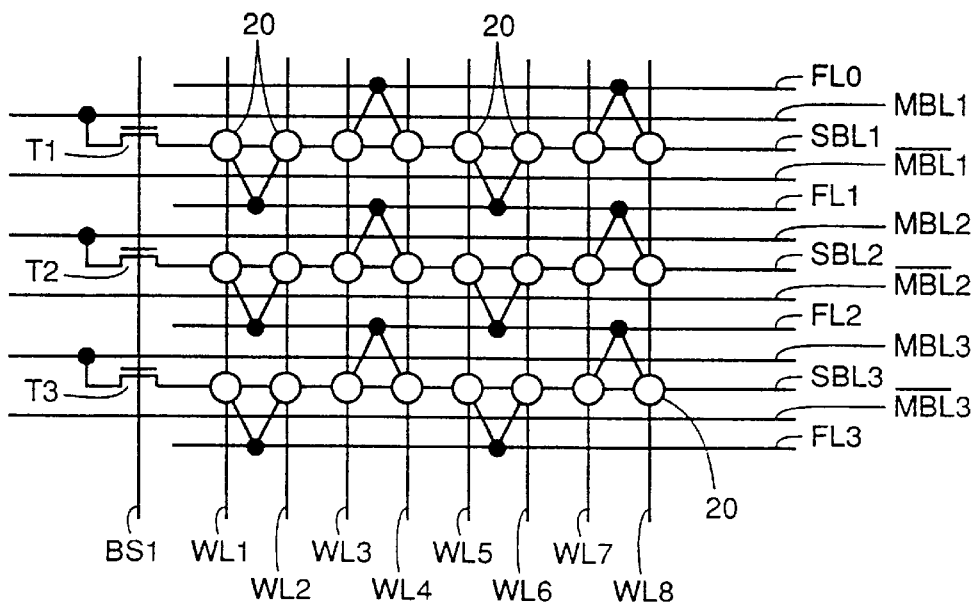
FIG. 66 is a block diagram fragmentarily showing a structure of a DRAM according to an embodiment 43 of the invention.

FIG. 66 is a block diagram fragmentarily showing a DRAM according to the embodiment 43 of the invention. FIG. 66 corresponds to FIG. 65. Referring to FIG. 66, the embodiment 43 differs from the structure in FIG. 65 in that contact holes, each of which is provided for connecting the body regions of transfer gates in the adjacent two memory cells to the body fixing line, are disposed alternately. For example, memory cell 20 provided correspondingly to the crossing between word line WL1 and sub-bit line SBL1 and the memory cell 20 provided correspondingly to the crossing between word line WL2 and sub-bit line SBL1 are connected to one position of body fixing line FL1. Memory cell 20 provided correspondingly to the crossing between word line WL3 and sub-bit line SBL1 and the memory cell 20 provided correspondingly to the crossing between word line WL4 and sub-bit line SBL1 are connected to one position of body fixing line FL0.

In the embodiment 43, as described above, the body regions of transfer gates in the two adjacent memory cells among four memory cells 20, which are provided correspondingly to the crossings between adjacent four word lines (e.g., WL1–WL4) and sub-bit line (e.g., SBL1), are connected to one position of the body fixing line (e.g., FL1) disposed at one side of the same sub-bit line, and the body regions of transfer gates in the other two adjacent memory cells 20 are connected to one position of the body fixing line (e.g., FL0) disposed at the other side of the same sub-bit line.

According to the embodiment 43, since the contact holes for connecting the memory cells and body fixing lines are disposed alternately, increase of the layout area caused by the contact holes can be suppressed.

Although the embodiments of the invention have been described in detail, the scope of the invention is not restricted to the above embodiments. For example, the invention may be applied to an SRAM. Negative potential Vbb may be used instead of ground potential Vss, and the potential applied to the body regions is not particularly restricted. It is clearly understood that the description of embodiments is by way of illustration and example only and is not to be taken by way of limitation, the spirit and scope of the present invention being limited only by the terms of the appended claims.

What is claimed is:

1. A semiconductor memory device comprising:
a plurality of bit line pairs disposed on said SOI substrate;
a bias line disposed on said SOI substrate and supplied with a static bias potential; and
a plurality of sense amplifiers provided corresponding to said plurality of bit line pairs, each of said plurality of sense amplifiers including (a) a first transistor disposed on said SOI substrate and having a gate coupled to one of bit lines of a corresponding bit line pair and a body region located between its source and drain regions, and (b) a second transistor disposed on said SOI substrate having a gate coupled to another of the bit lines of the corresponding bit line pair and a body region located between its source and drain regions, each of the body regions of the first and second transistors being connected to said bias line.

2. The semiconductor memory device according to claim 1, wherein the body regions of the first and second transistors in each of said plurality of sense amplifiers are in common connected to said bias line via a contact hole.

3. The semiconductor memory device according to claim 1, further comprising:
a plurality of drive transistors each provided corresponding to adjacent two of said plurality of sense amplifiers, each of said plurality of drive transistors coupled between sources of the first and second transistors in corresponding two sense amplifiers and a source potential line, and having a body region connected to the source potential line via a contact hole provided between corresponding two bit line pairs.

4. The semiconductor memory device according to claim 3, wherein a drain of each of said plurality of drive transistors is connected to the sources of the corresponding first and second transistors via a contact hole provided between the bit lines of one of the corresponding two bit line pairs.

5. The semiconductor memory device according to claim 3, wherein a source of each of said plurality of drive transistors is connected to the source potential line via a contact hole provided between the bit lines of one of the corresponding two bit line pairs.

6. The semiconductor memory device according to claim 1, wherein at least one of body regions of the first and second transistors being connected to said bias line via a contact hole provided between the bit lines of the corresponding bit line pair.

7. The semiconductor memory device according to claim 2, wherein the contact hole is provided between the bit lines of the corresponding bit line pair.

8. A semiconductor memory device comprising:
an SOI substrate;
a plurality of bit line pairs disposed on said SOI substrate;
a predetermined line disposed on said SOI substrate; and
a plurality of sense amplifiers provided corresponding to said plurality of bit line pairs, each of said plurality of sense amplifiers including (a) a first transistor disposed on said SOI substrate and having a gate coupled to one of bit lines of a corresponding bit line pair and a body region located between its source and drain regions, and (b) a second transistor disposed on said SOI substrate and having a gate coupled to another of the bit lines of the corresponding bit line pair and a body region located between its source and drain regions, the body region of the second transistor in one of adjacent two sense amplifiers and the body region of the first transistor in another of the adjacent two sense amplifiers being in common connected to said predetermined line via a contact hole.

9. The semiconductor memory device according to claim 8, wherein the source and body region of each of the first and second transistors are in common connected to said predetermined line via a contact hole.

10. The semiconductor memory device according to claim 9, wherein the source and body region of each of the first and second transistors are in common connected to said predetermined line via a contact hole.

11. A semiconductor memory device comprising:
an SOI substrate;
a plurality of bit line pairs disposed on said SOI substrate;
a source potential line disposed on said SOI substrate;
a plurality of sense amplifiers provided corresponding to said plurality of bit line pairs, each of said plurality of sense amplifiers including (a) a first transistor disposed on said SOI substrate and having a gate coupled to one of bit lines of a corresponding bit line pair and (b) a second transistor disposed on said SOI substrate and having a gate coupled to another of the bit lines of the corresponding bit line pair; and
a drive transistor coupled between said source potential line and a drive line connected to sources of the first and second transistors, and including a body region located between its source and drain regions and connected to said source potential line.

12. The semiconductor memory device according to claim 11, wherein said source potential line is a ground line.

13. The semiconductor memory device according to claim 11, wherein said drive transistor is in common provided corresponding to adjacent two sense amplifiers.

14. The semiconductor memory device according to claim 13, wherein the body region of said drive transistor is connected to said source potential line via a contact hole provided between corresponding adjacent two bit line pairs.

15. The semiconductor memory device according to claim 14, wherein a drain of said drive transistor is connected to the drive line via a contact hole provided between the bit lines of one of the corresponding adjacent two bit line pairs.

16. The semiconductor memory device according to claim 14, wherein a source of said drive transistor is connected to the source potential line via a contact hole provided between the bit lines of one of the corresponding two bit line pairs.

17. A semiconductor memory device comprising:
an SOI substrate;
a plurality of word lines disposed on said SOI substrate;
a plurality of bit line pairs disposed on said SOI substrate;
a plurality of body bias lines disposed along said plurality of bit line pairs on said SOI substrate;
a plurality of memory cells disposed on said SOI substrate and corresponding to crossings between said plurality of word lines and said plurality of bit line pairs, each of said plurality of memory cells including a capacitor and a memory transistor connected between the capacitor and one bit line in a corresponding bit line pair, the memory transistor having a gate connected to a corresponding word line and a body region located between its source and drain regions, the body regions of the memory transistors in said plurality of memory cells being connected to said plurality of body bias lines;
a plurality of sense amplifiers disposed on said SOI substrate and provided corresponding to said plurality of bit line pairs; and
a common line disposed along said word lines and between said plurality of sense amplifiers and said plurality of word lines on said SOI substrate and connected to said plurality of body bias lines.

18. The semiconductor memory device according to claim 17, further comprising:
a first power supply line disposed along said word lines for supplying a power supply potential to said plurality of sense amplifiers; and
a second power supply line disposed along said bit line pairs and connected to said first power supply line and said common line.

19. The semiconductor memory device according to claim 18, wherein the power supply potential is a ground potential.

20. A semiconductor memory device comprising:

an SOI substrate;

a body bias line disposed on said SOI substrate; and a memory cell disposed on said SOI substrate including a memory transistor having a body region located between its source and drain regions and connected to said body bias line via a first pad formed by an intermediate layer provided between the body region and a layer forming said body bias line.

21. The semiconductor memory device according to claim 20, further comprising:

a bit line connected to said memory cell and formed by the layer forming said body bias line.

22. The semiconductor memory device according to claim 21, wherein said bit line is connected to the memory transistor via a second pad formed by the intermediate layer.

* * * * *